United States Patent [19]
Leedy

[11] Patent Number: 5,946,559
[45] Date of Patent: Aug. 31, 1999

[54] MEMBRANE DIELECTRIC ISOLATION IC FABRICATION

[75] Inventor: Glenn Joseph Leedy, Montecito, Calif.

[73] Assignee: Elm Technology Corporation, Saline, Mich.

[21] Appl. No.: 08/472,426

[22] Filed: Jun. 7, 1995

Related U.S. Application Data

[60] Continuation of application No. 08/315,905, Sep. 30, 1994, Pat. No. 5,869,354, which is a division of application No. 07/865,412, Apr. 8, 1992, Pat. No. 5,354,695.

[51] Int. Cl.⁶ .................................................. H01L 21/84
[52] U.S. Cl. ............................ 438/157; 438/149; 438/283
[58] Field of Search ................................. 438/149, 151, 438/154, 157, 156, 270, 271, 283, 294; 257/508, 506, 510, 619, 622

[56] References Cited

U.S. PATENT DOCUMENTS

| | | | |
|---|---|---|---|
| 4,070,230 | 1/1978 | Stein | 437/66 |
| 4,131,985 | 1/1979 | Greenwood et al. | 437/62 |
| 4,539,068 | 9/1985 | Takagi et al. | 156/614 |
| 4,618,397 | 10/1986 | Shimizu et al. | 437/8 |
| 4,702,936 | 10/1987 | Maeda et al. | 437/241 |
| 4,721,938 | 1/1988 | Steveson | 156/662 |
| 4,784,721 | 11/1988 | Holmen et al. | 156/647 |
| 4,952,446 | 8/1990 | Lee et al. | 437/974 |
| 5,071,510 | 12/1991 | Findler et al. | 156/662 |
| 5,110,373 | 5/1992 | Mauger | 437/974 |

*Primary Examiner*—Trung Dang
*Attorney, Agent, or Firm*—Burns, Doane, Swecker & Mathis, LLP

[57] ABSTRACT

General purpose methods for the fabrication of integrated circuits from flexible membranes formed of very thin low stress dielectric materials, such as silicon dioxide or silicon nitride, and semiconductor layers. Semiconductor devices are formed in a semiconductor layer of the membrane. The semiconductor membrane layer is initially formed from a substrate of standard thickness, and all but a thin surface layer of the substrate is then etched or polished away. In another version, the flexible membrane is used as support and electrical interconnect for conventional integrated circuit die bonded thereto, with the interconnect formed in multiple layers in the membrane. Multiple die can be connected to one such membrane, which is then packaged as a multi-chip module. Other applications are based on (circuit) membrane processing for bipolar and MOSFET transistor fabrication, low impedance conductor interconnecting fabrication, flat panel displays, maskless (direct write) lithography, and 3D IC fabrication.

10 Claims, 64 Drawing Sheets

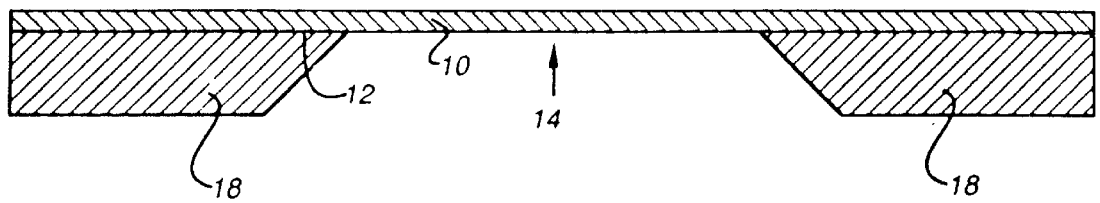
Fig_1a
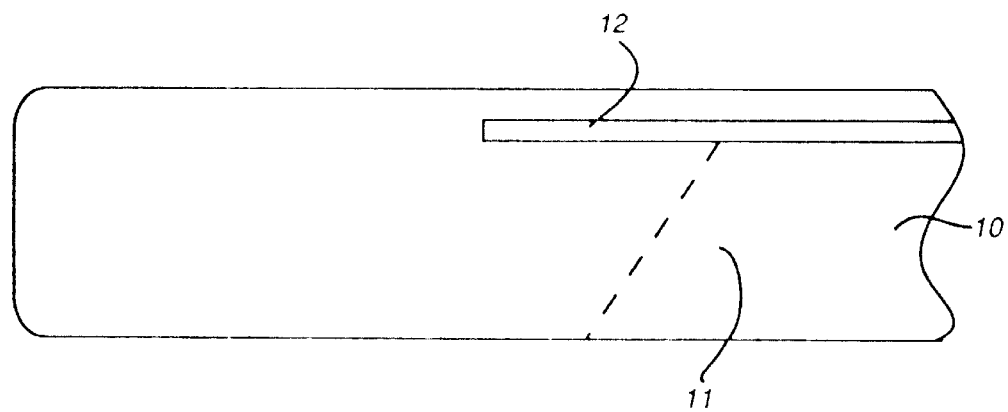
Fig_1b

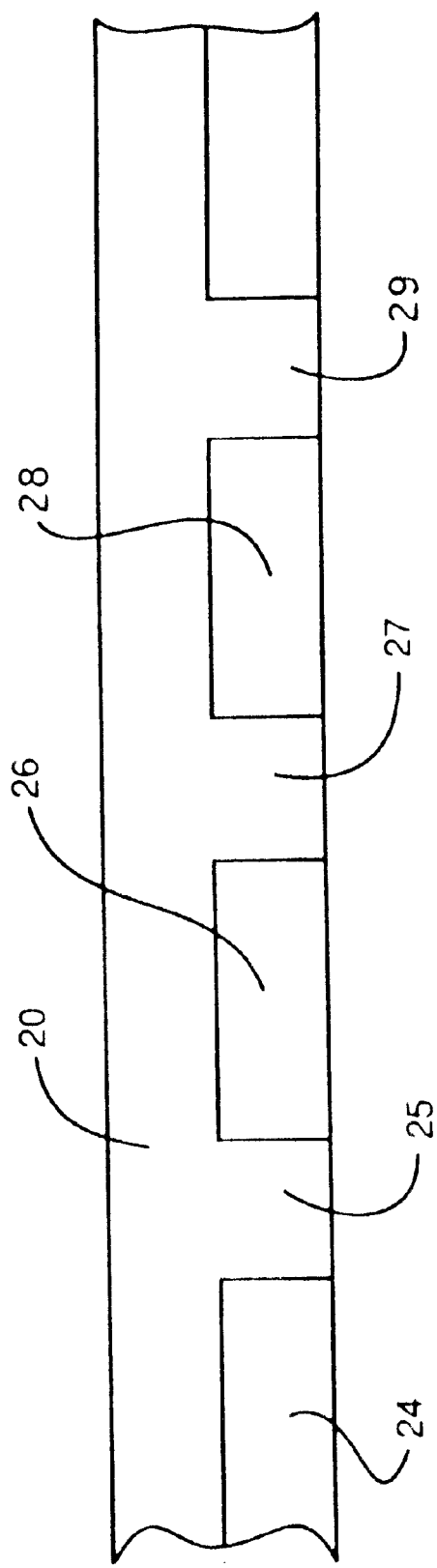
Fig_1c

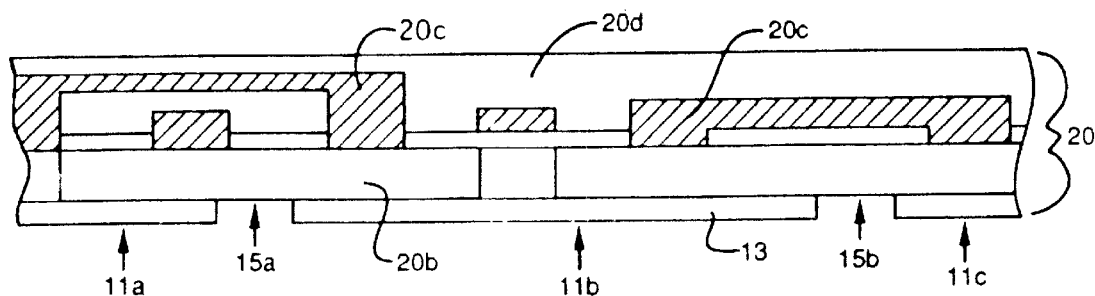
Fig_1d
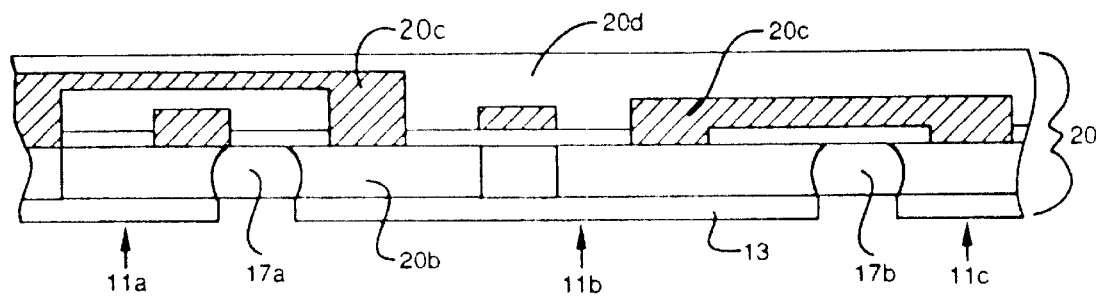
Fig_1e

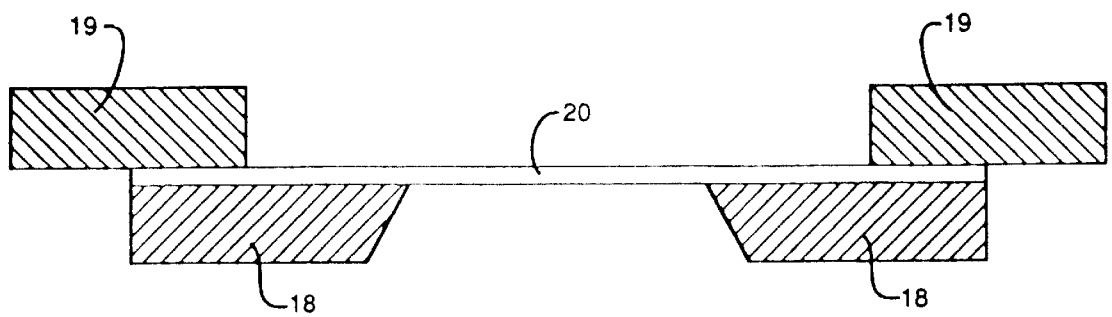
Fig_1f
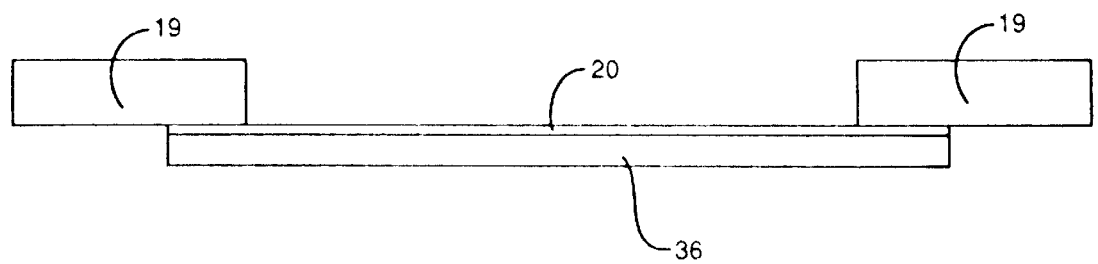
Fig_1g

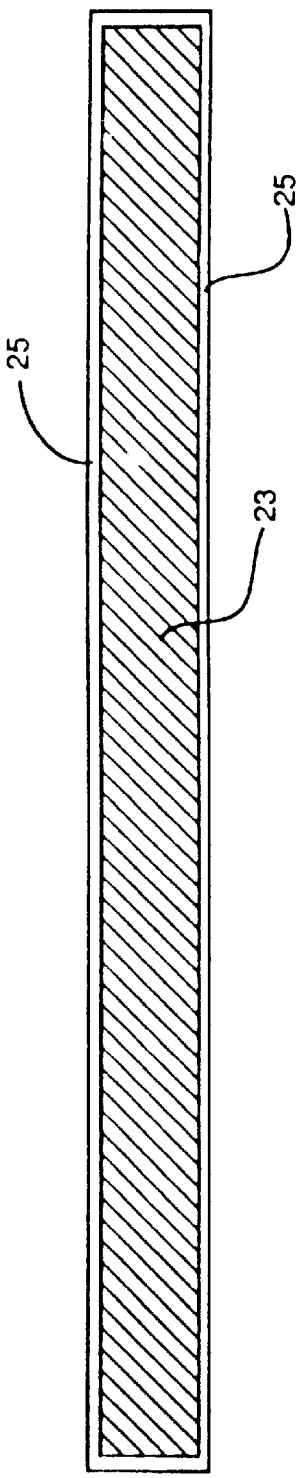
Fig_1h
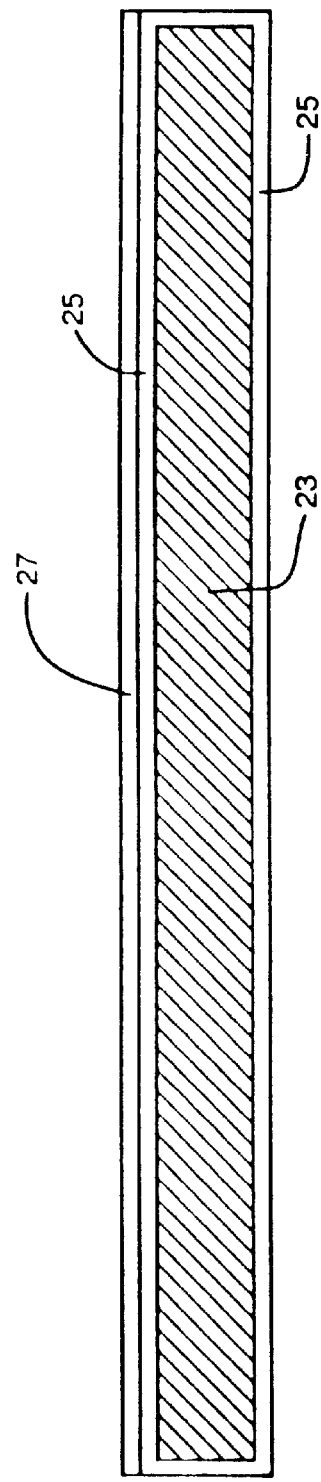
Fig_1i

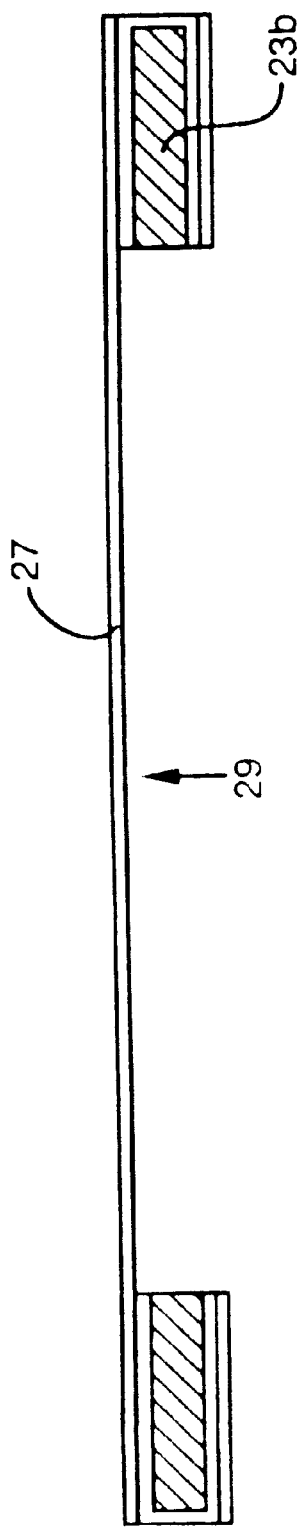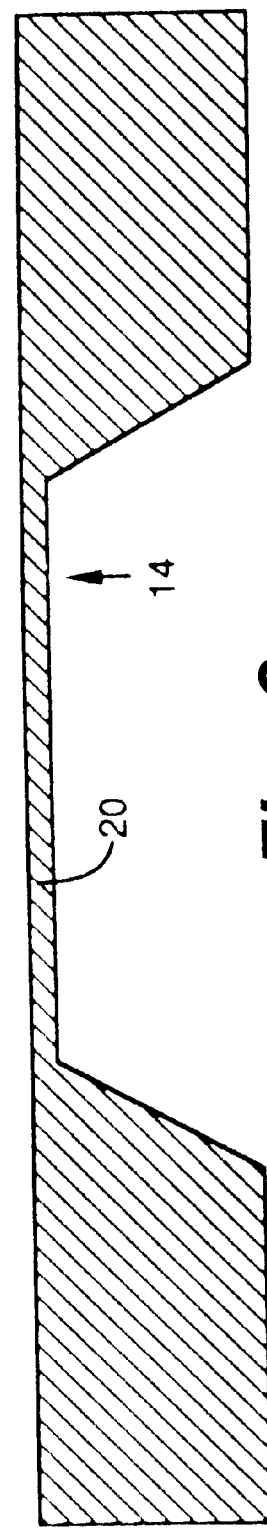

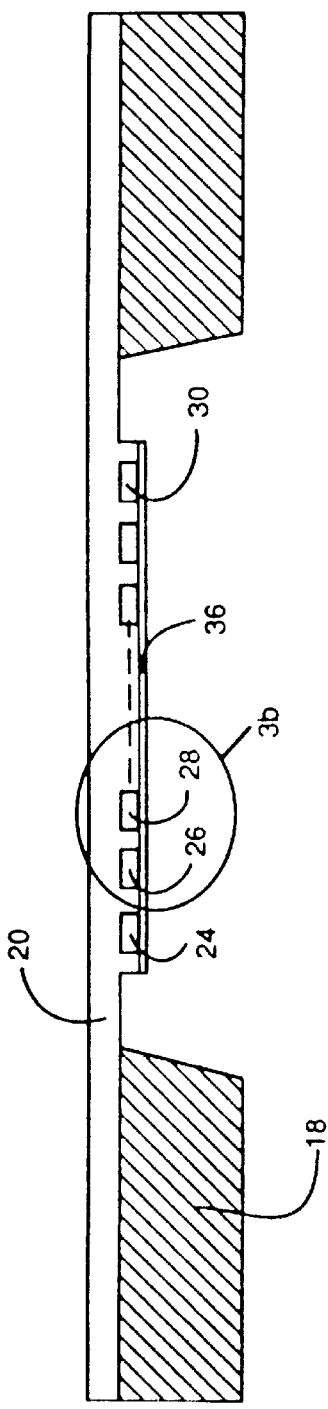
Fig_3a
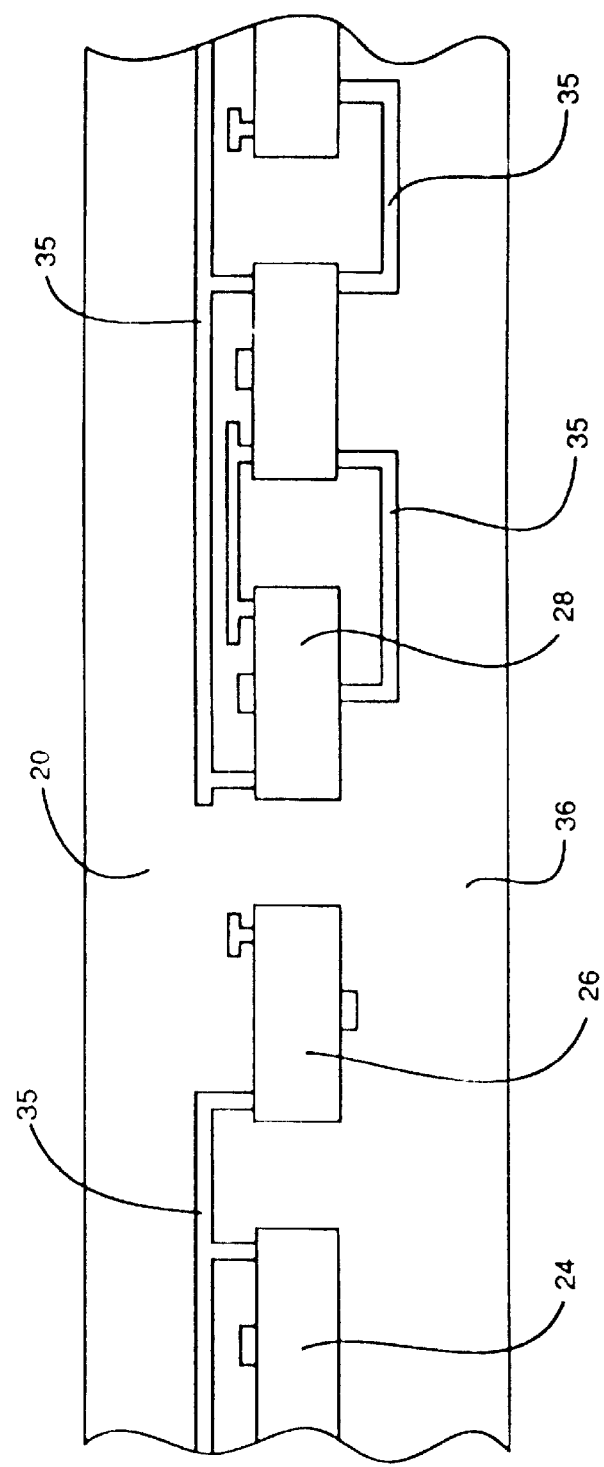
Fig_3b

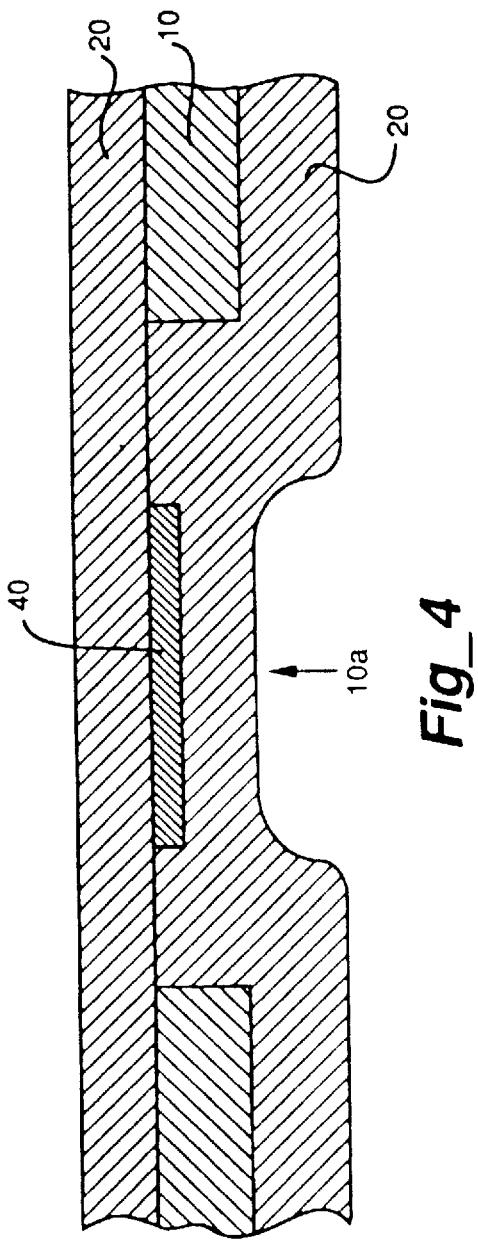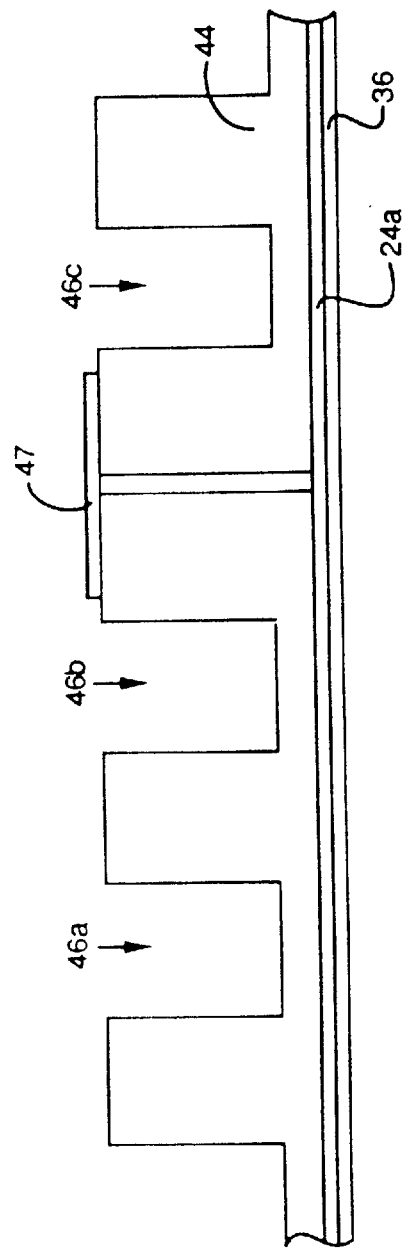

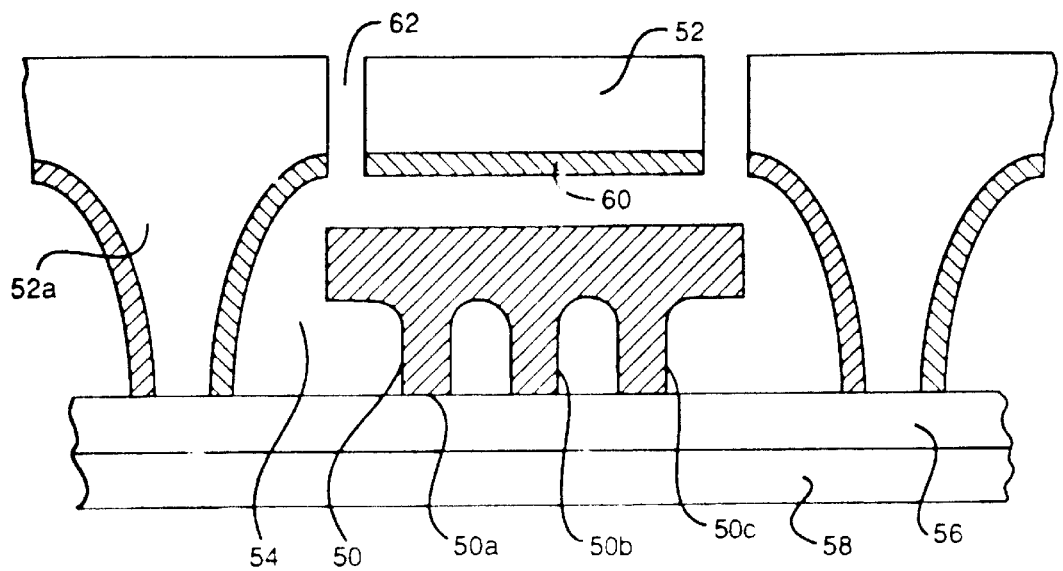
Fig_6a
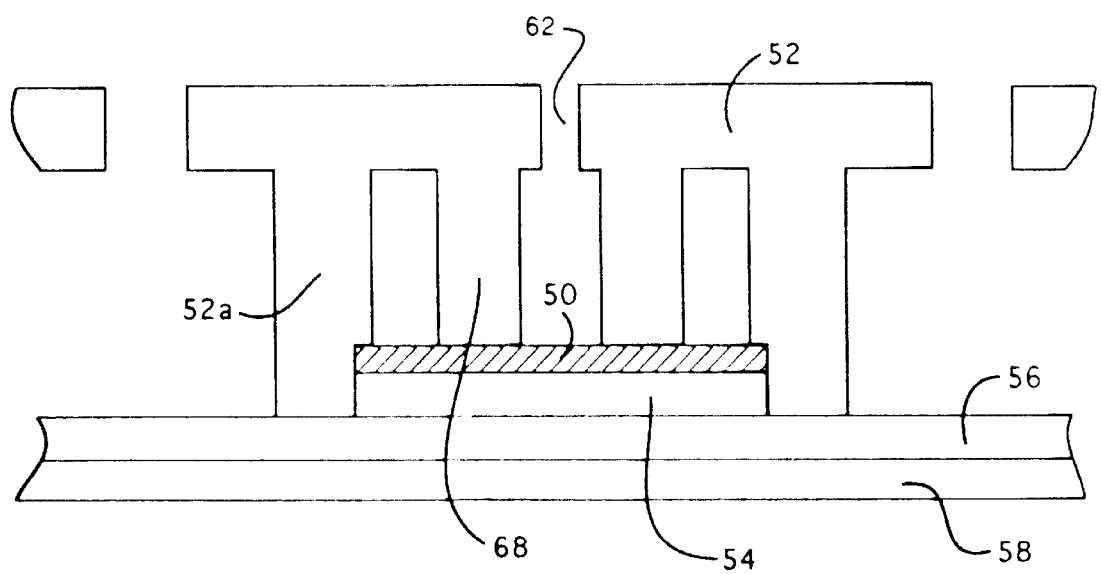
Fig_6b

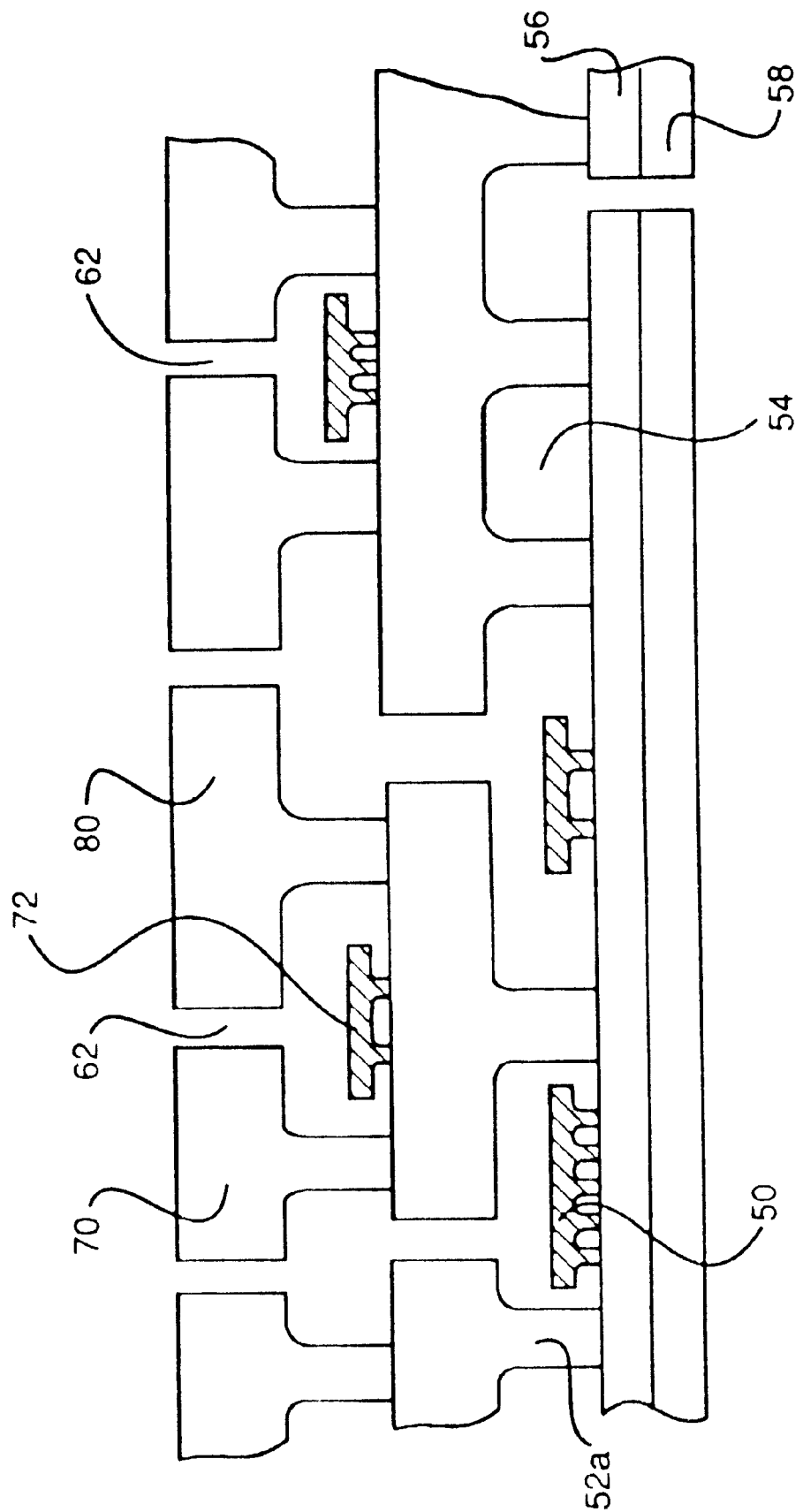
Fig_6c

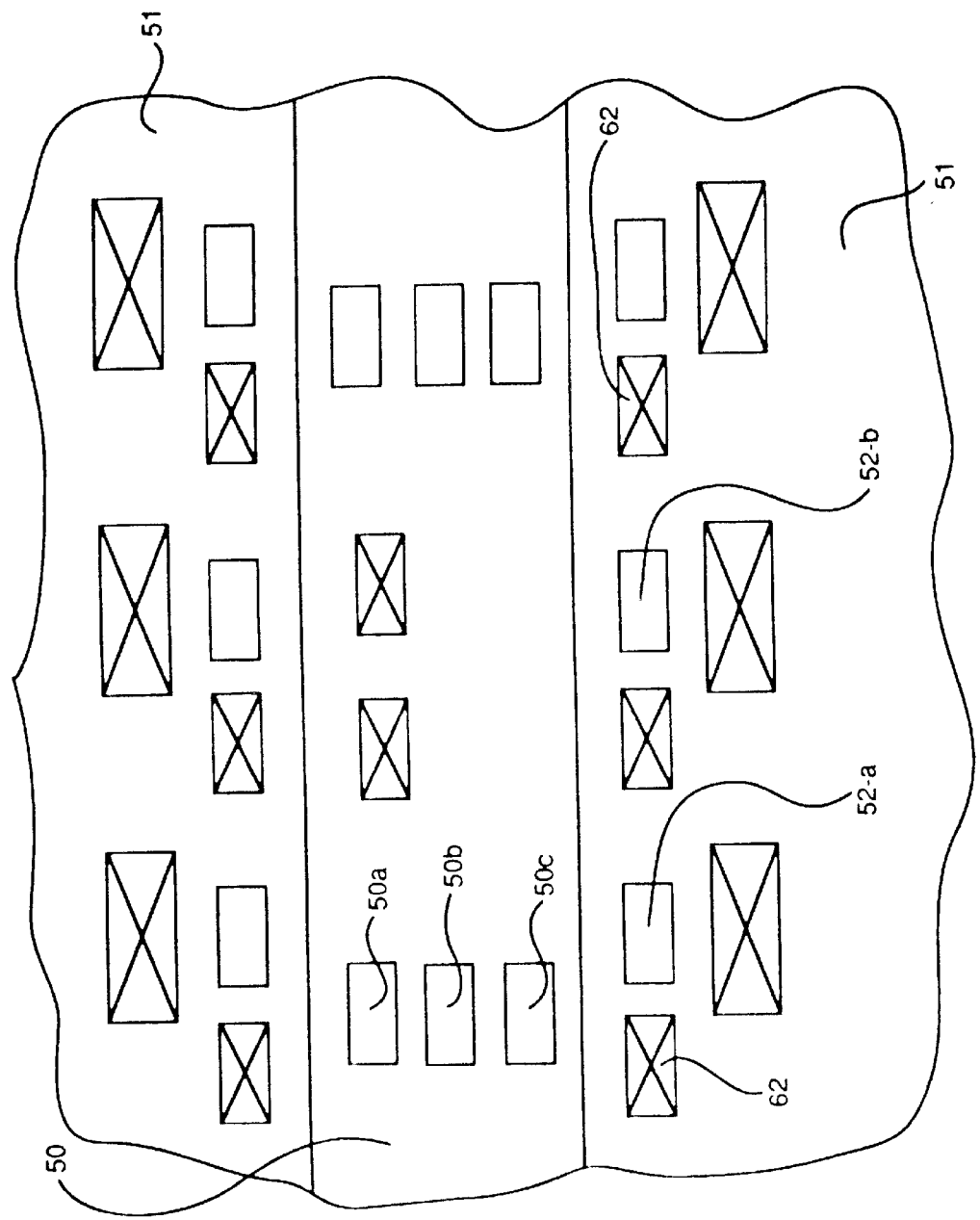
Fig_6d

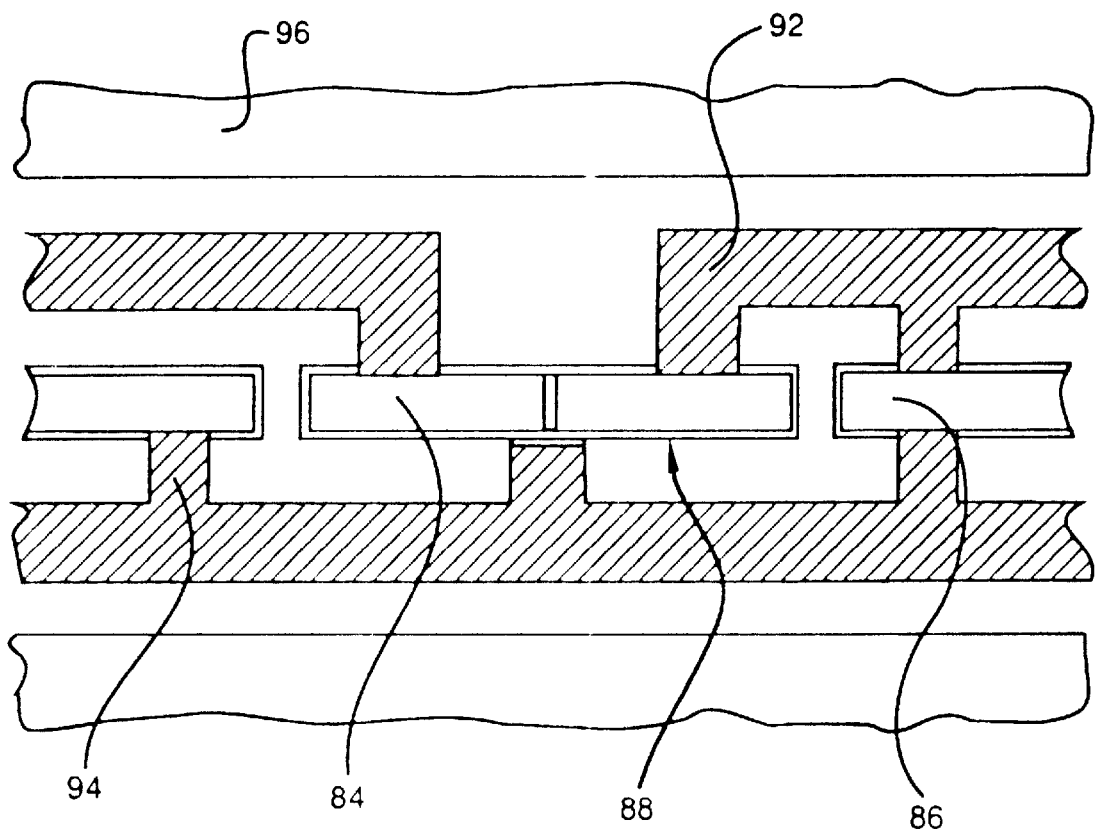
Fig_6e

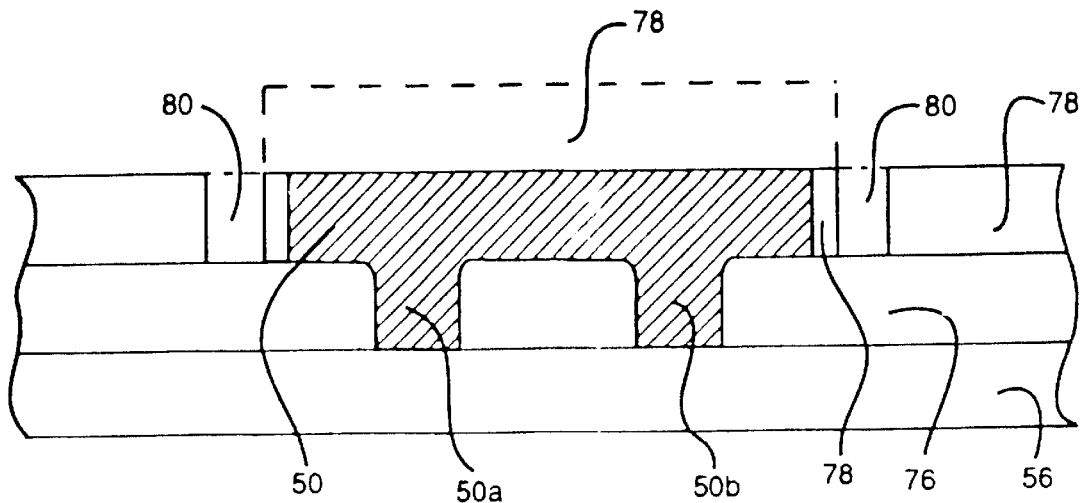
Fig_6f
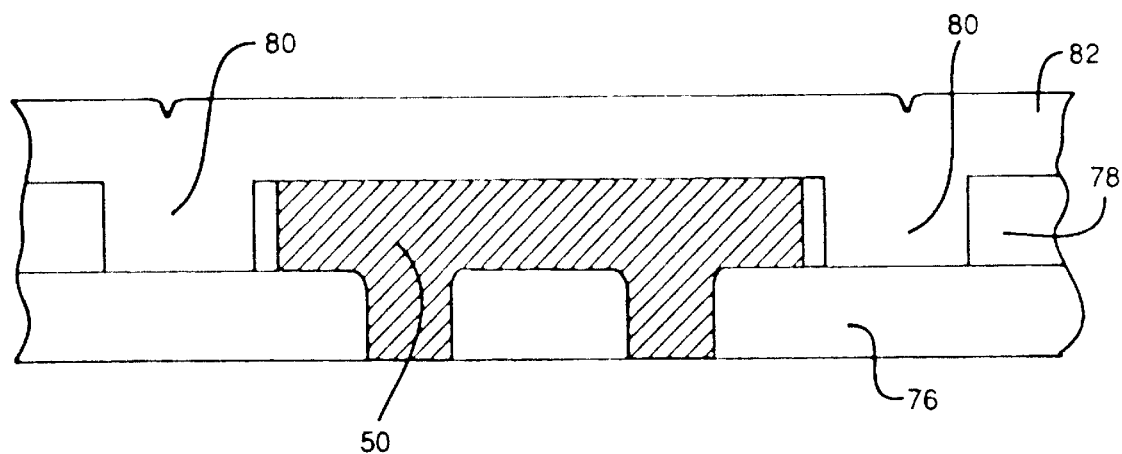
Fig_6g

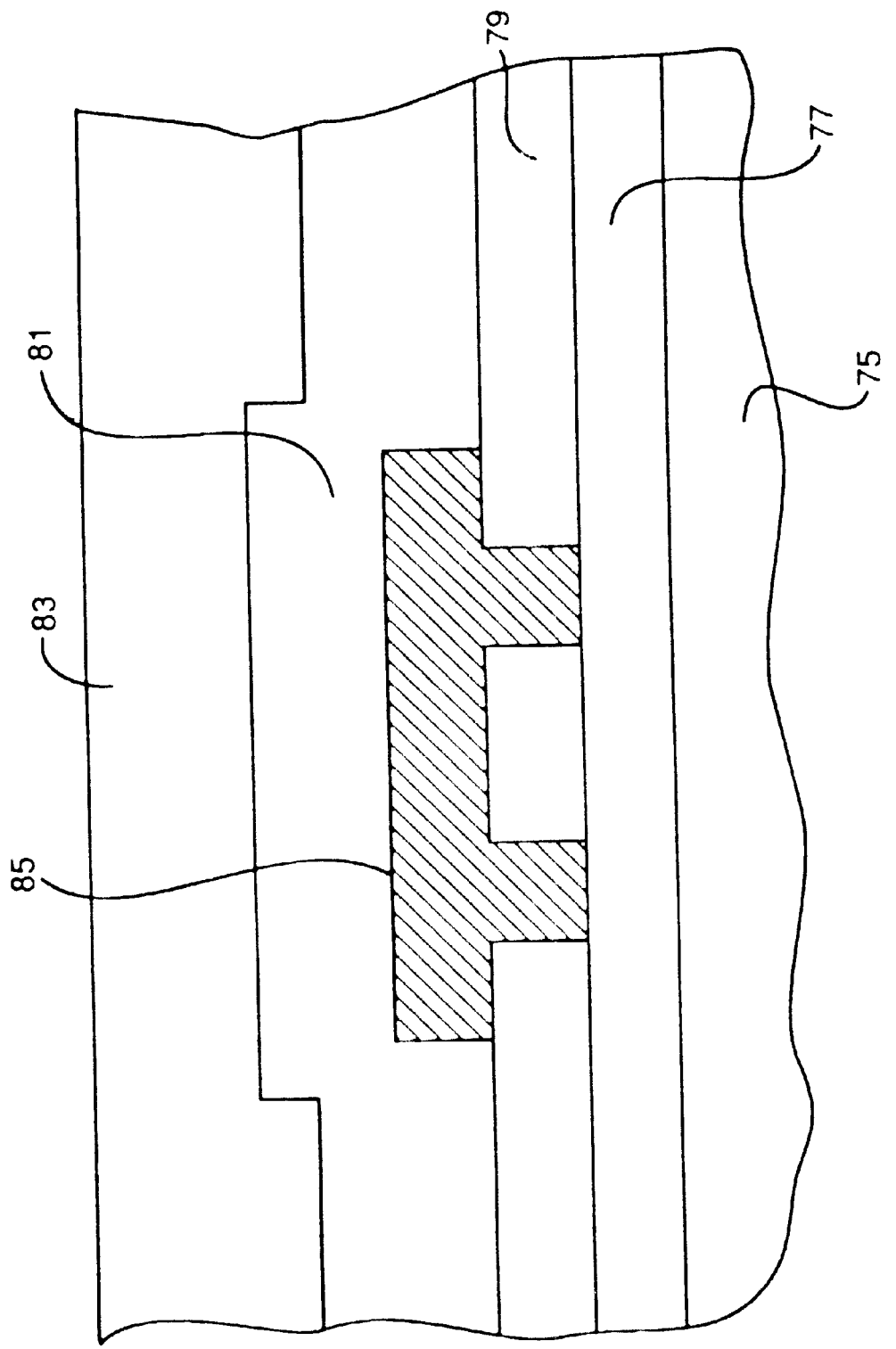
Fig_6h

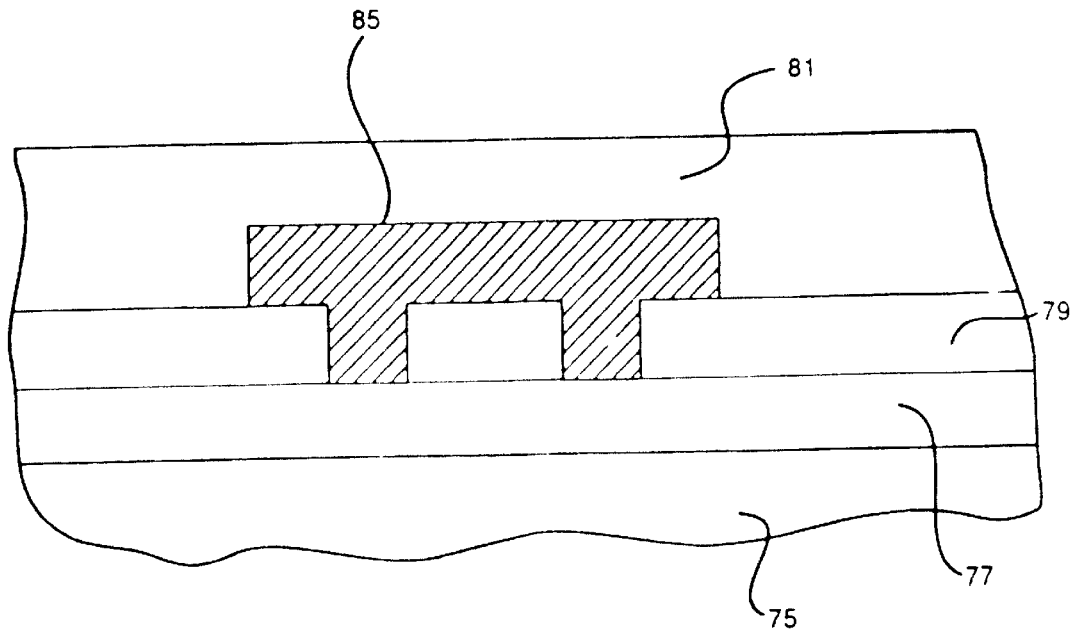
Fig_6i
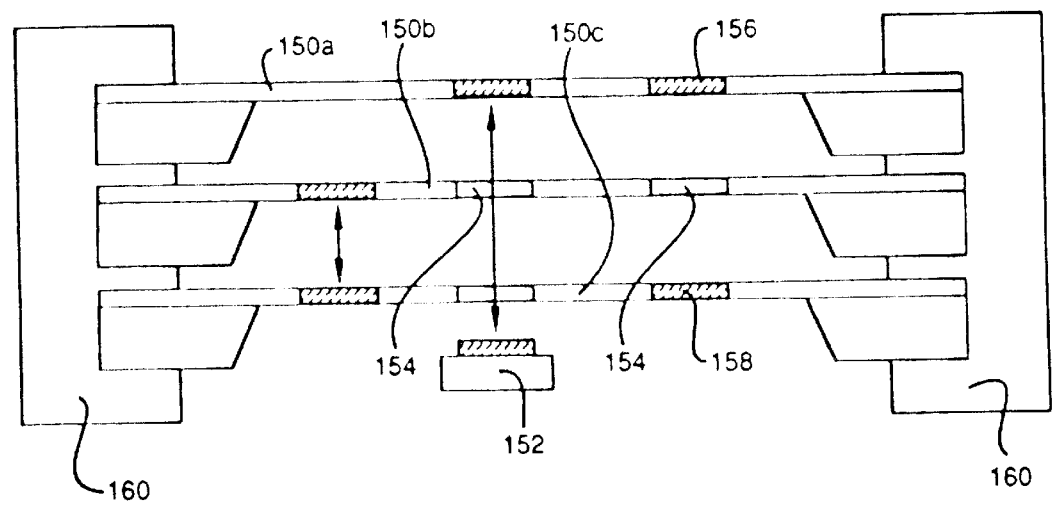
Fig_7

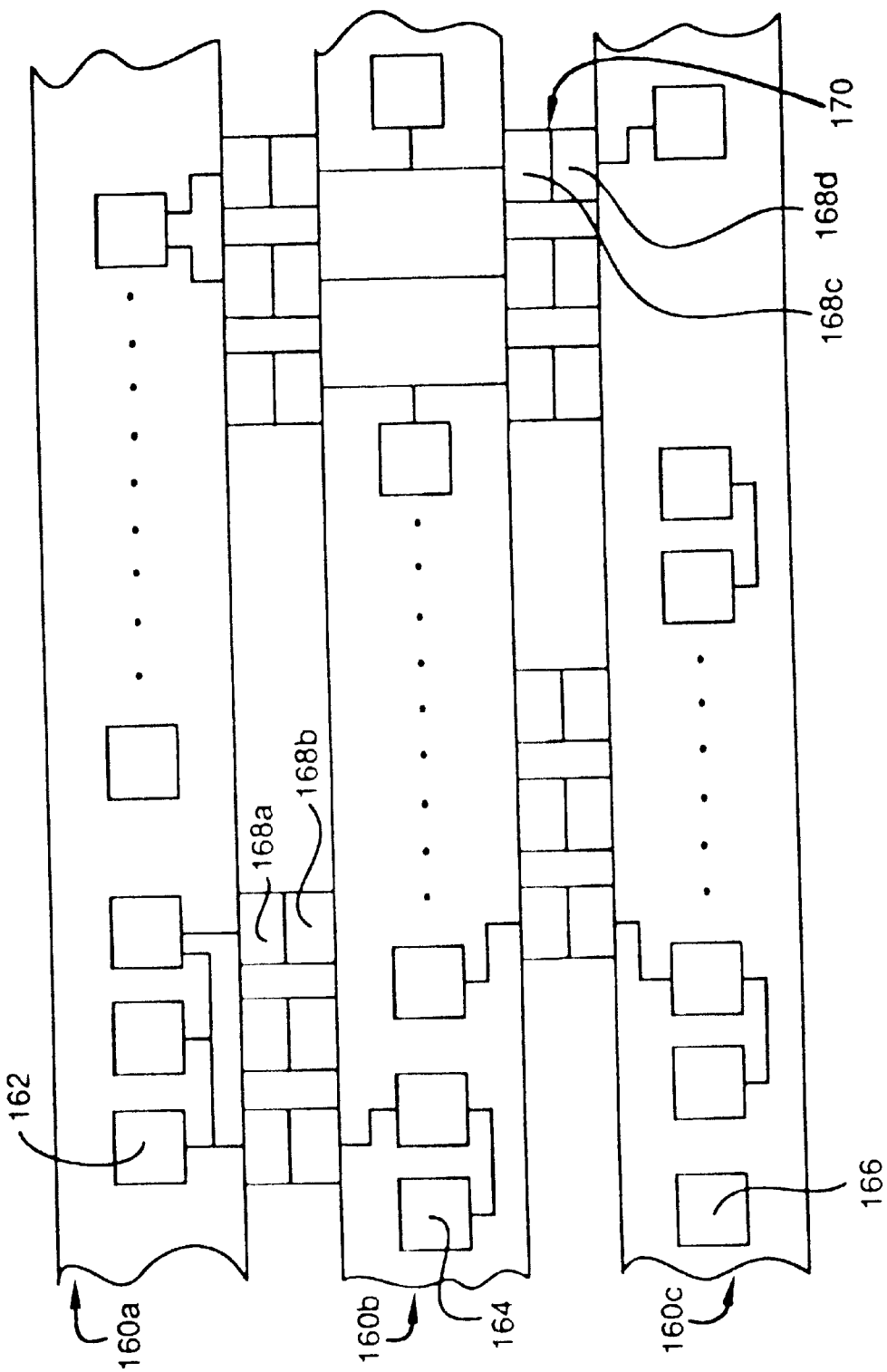
Fig_8

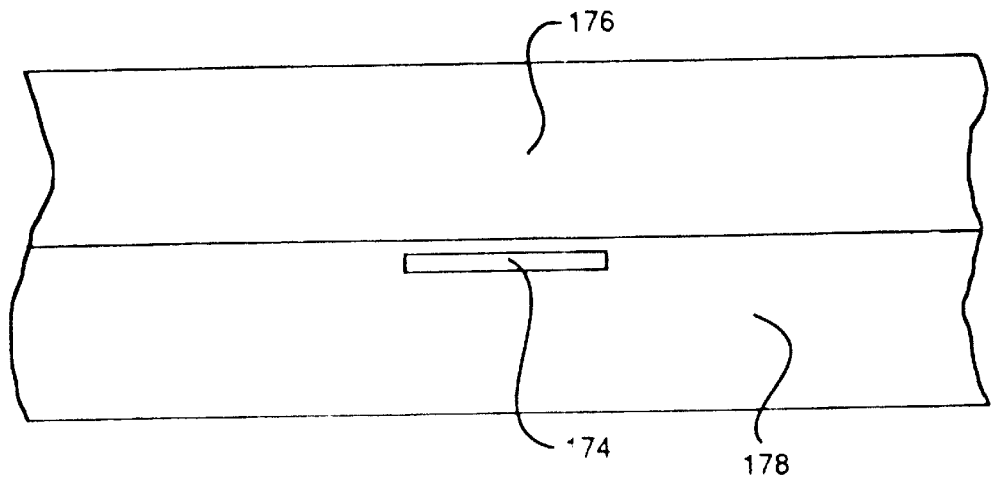
*Fig_9a*
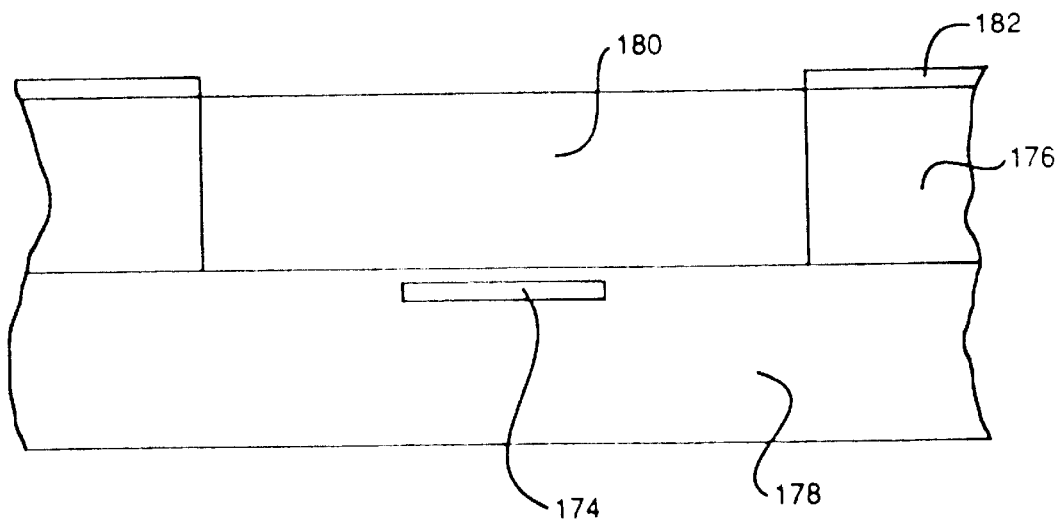
*Fig_9b*

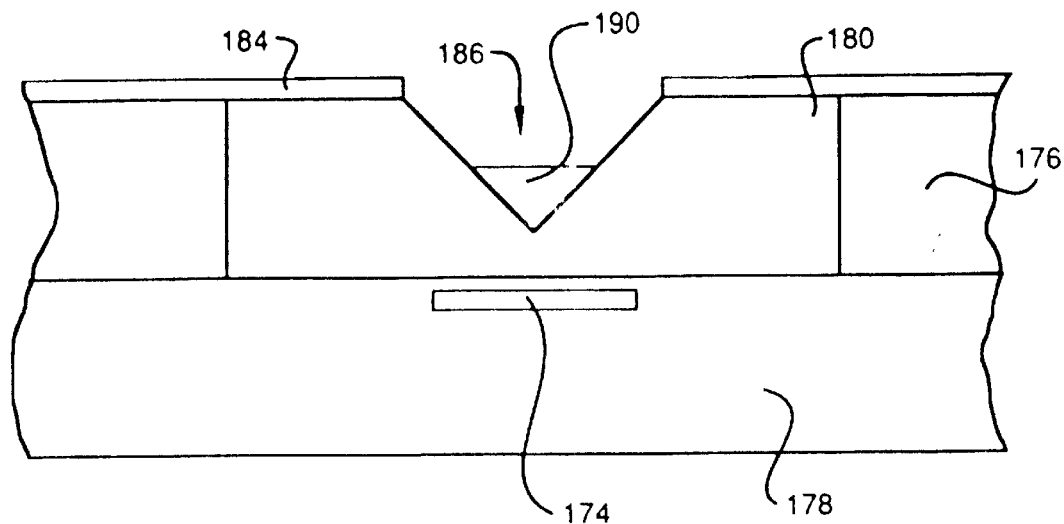
Fig_9c
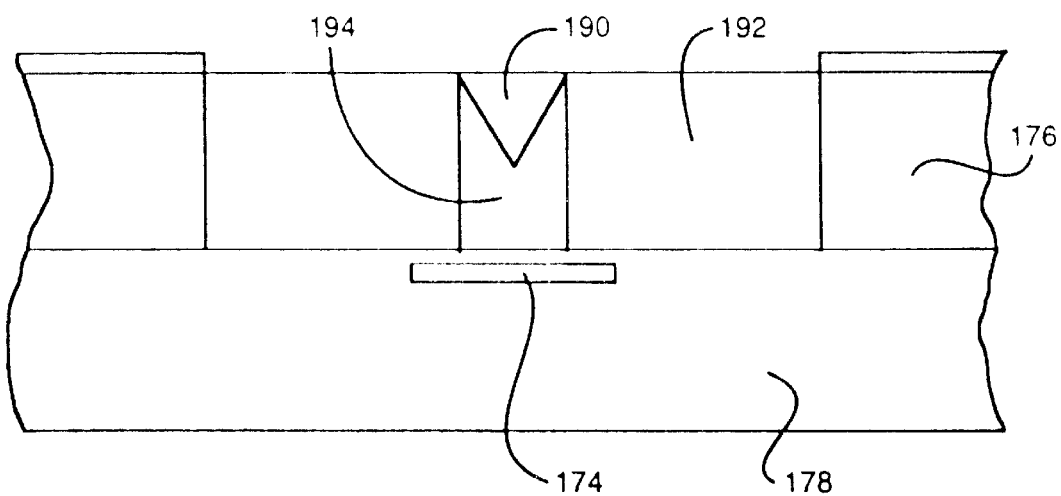
Fig_9d

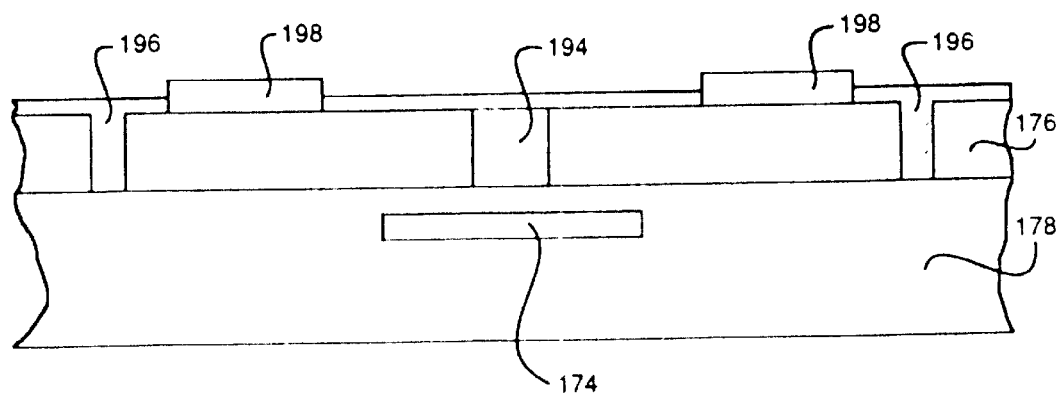
Fig_9e
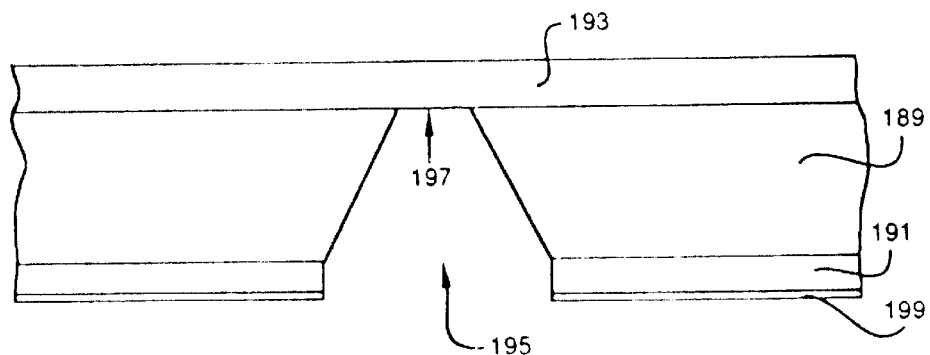
Fig_9f

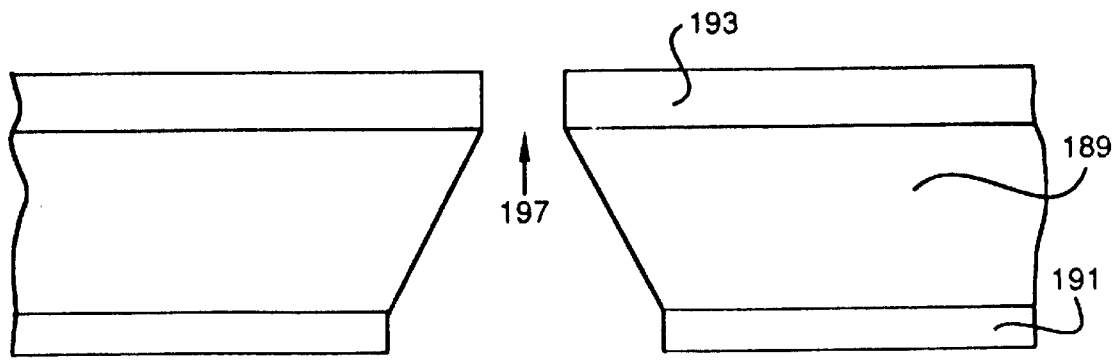
Fig_9g
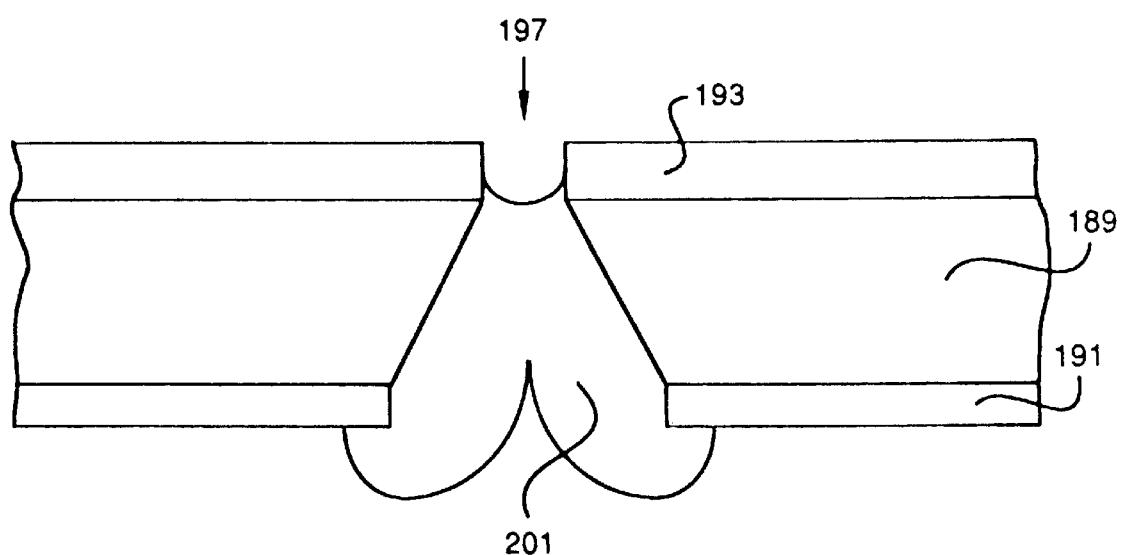
Fig_9h

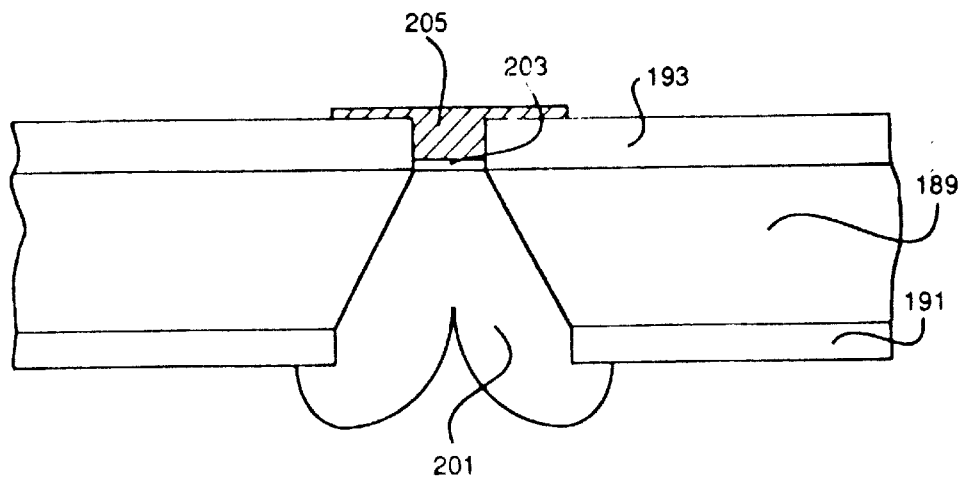
Fig_9i
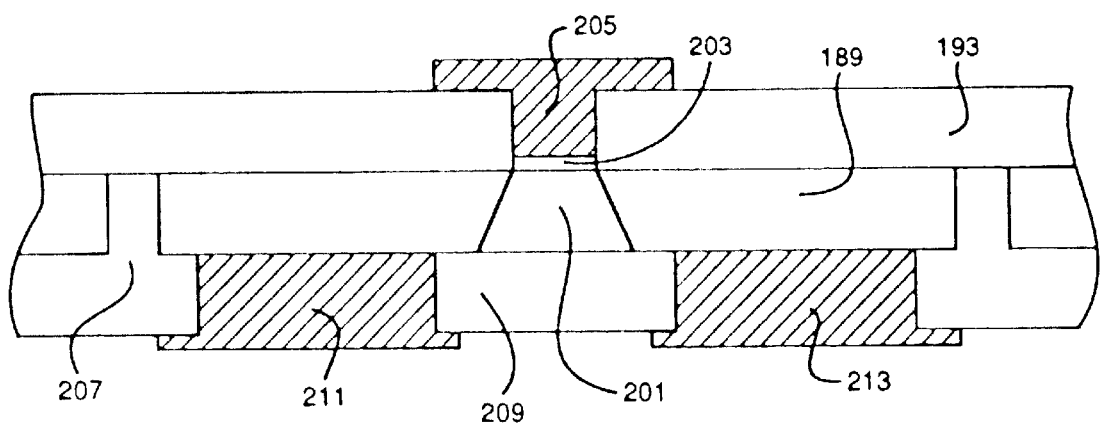
Fig_9j

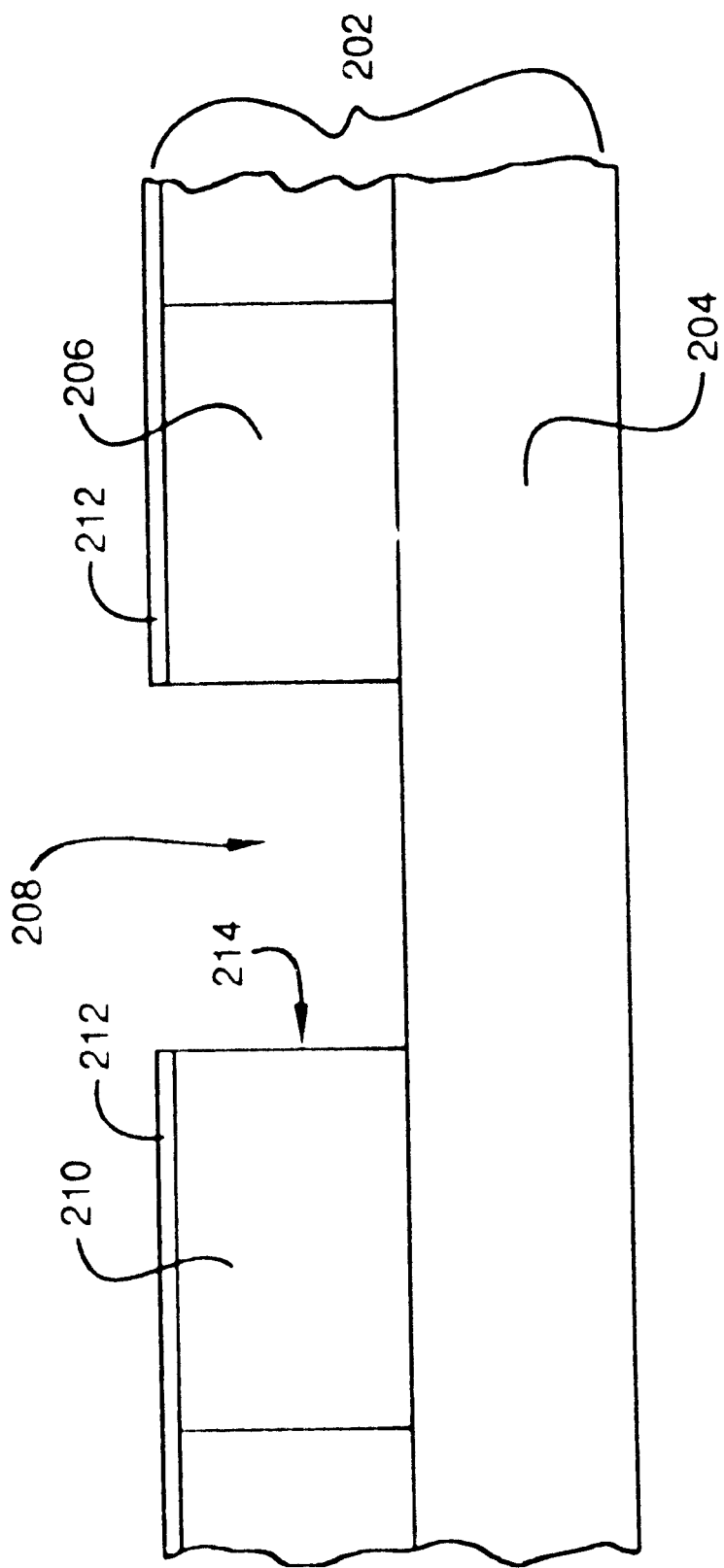
Fig_10a

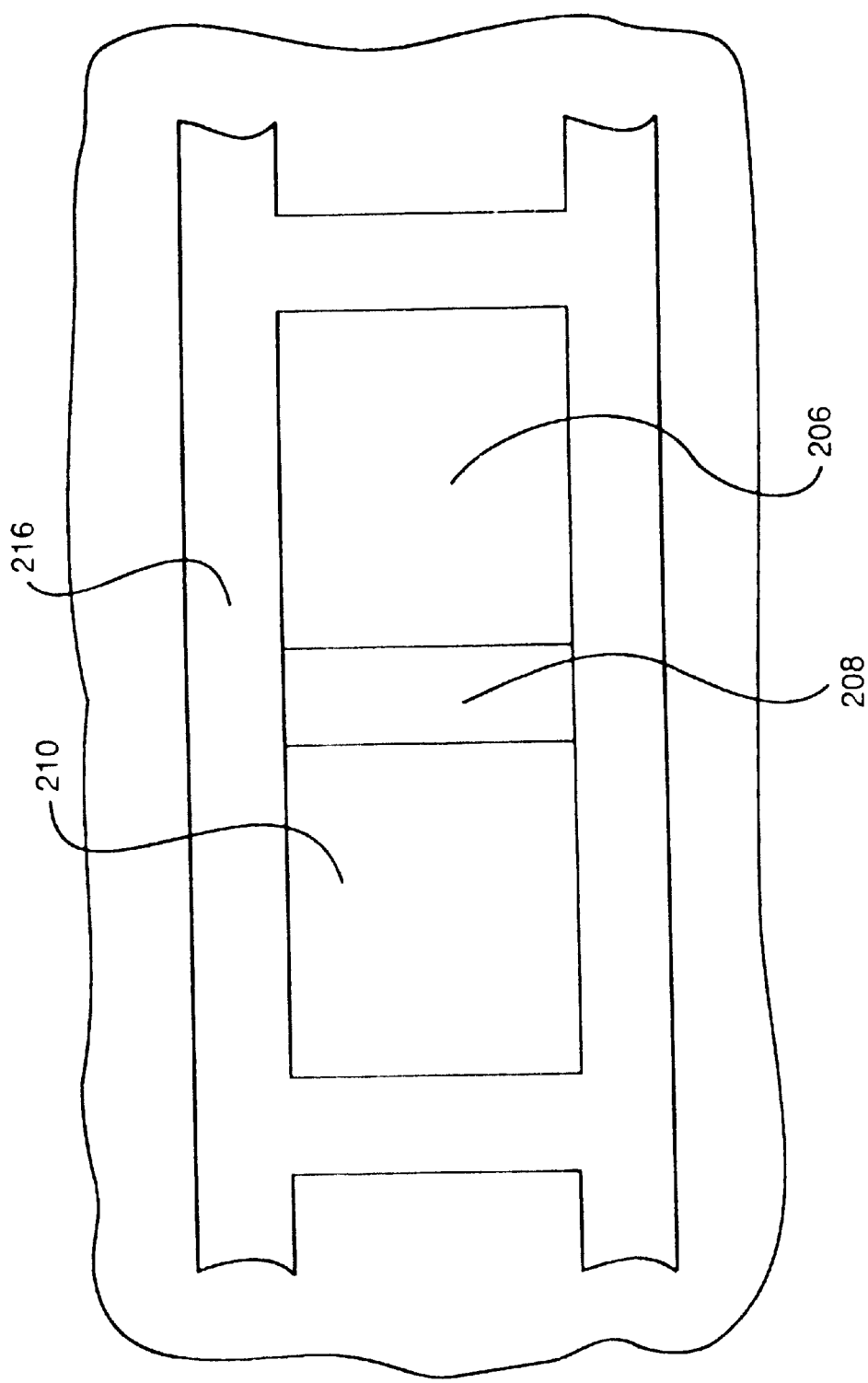
Fig_10b

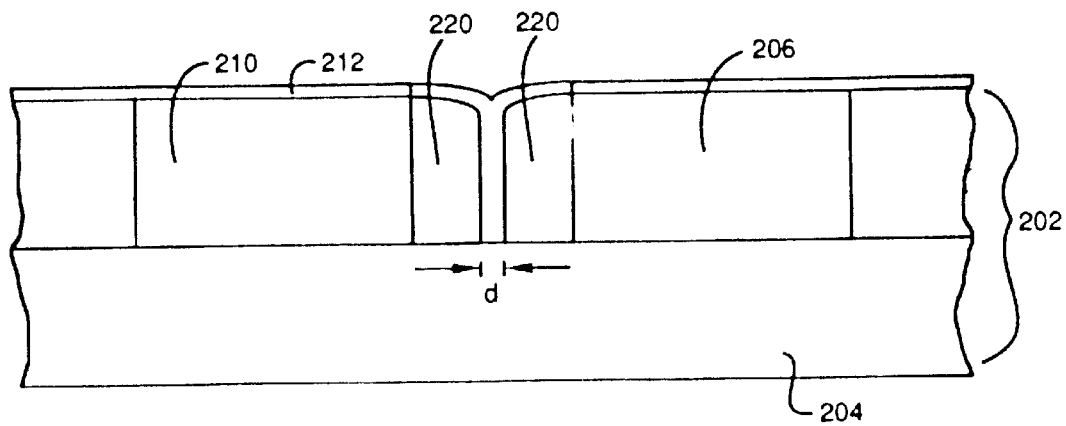
*Fig_10c*
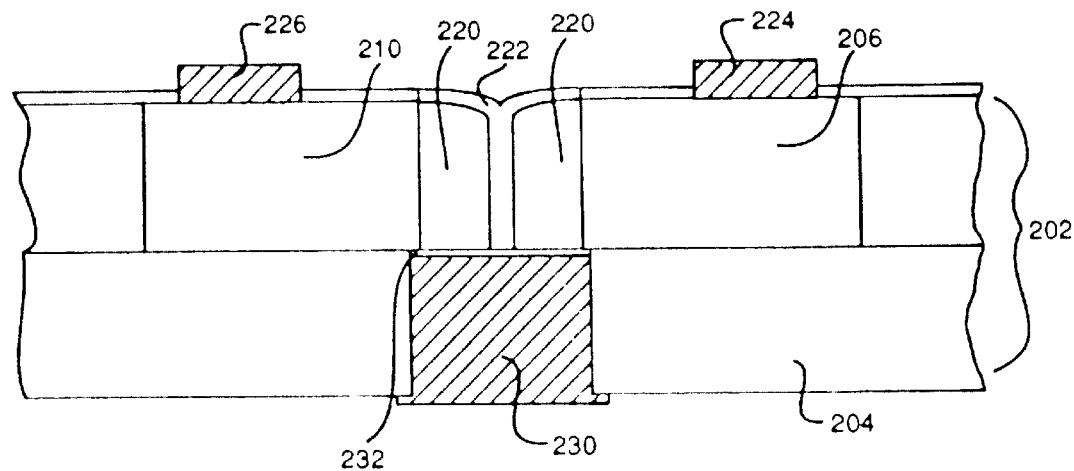
*Fig_10d*

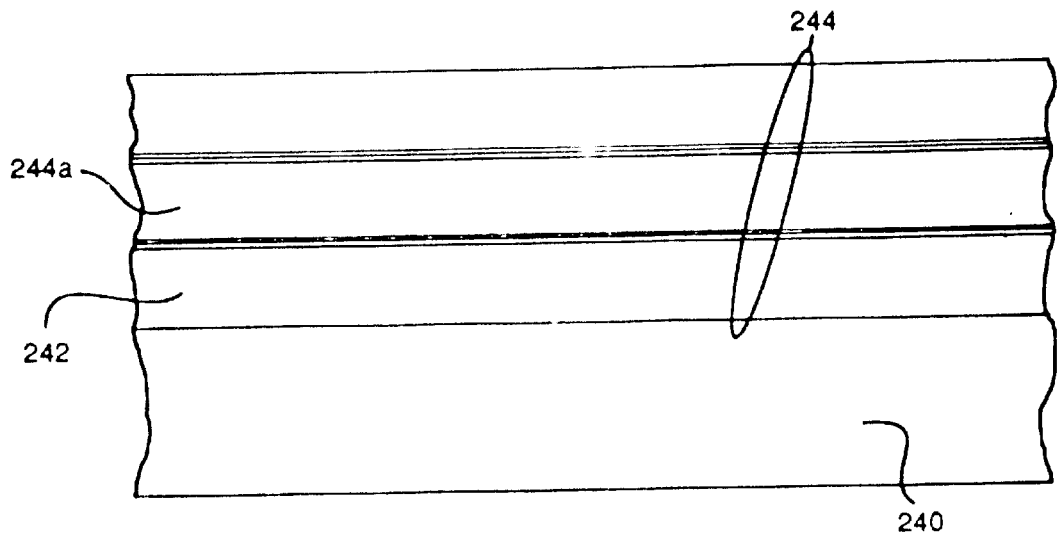
Fig_11a
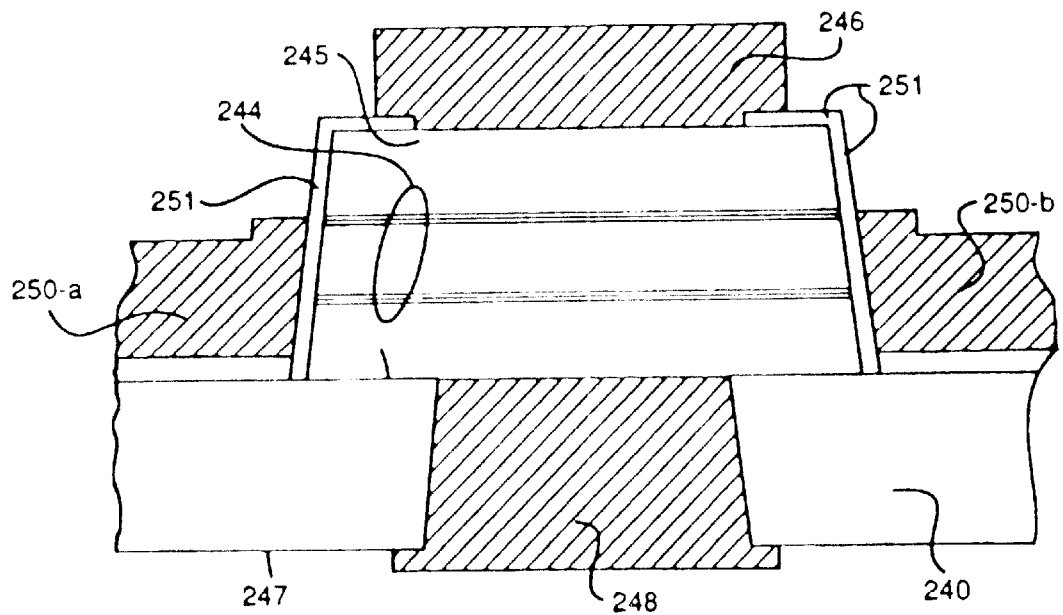
Fig_11b

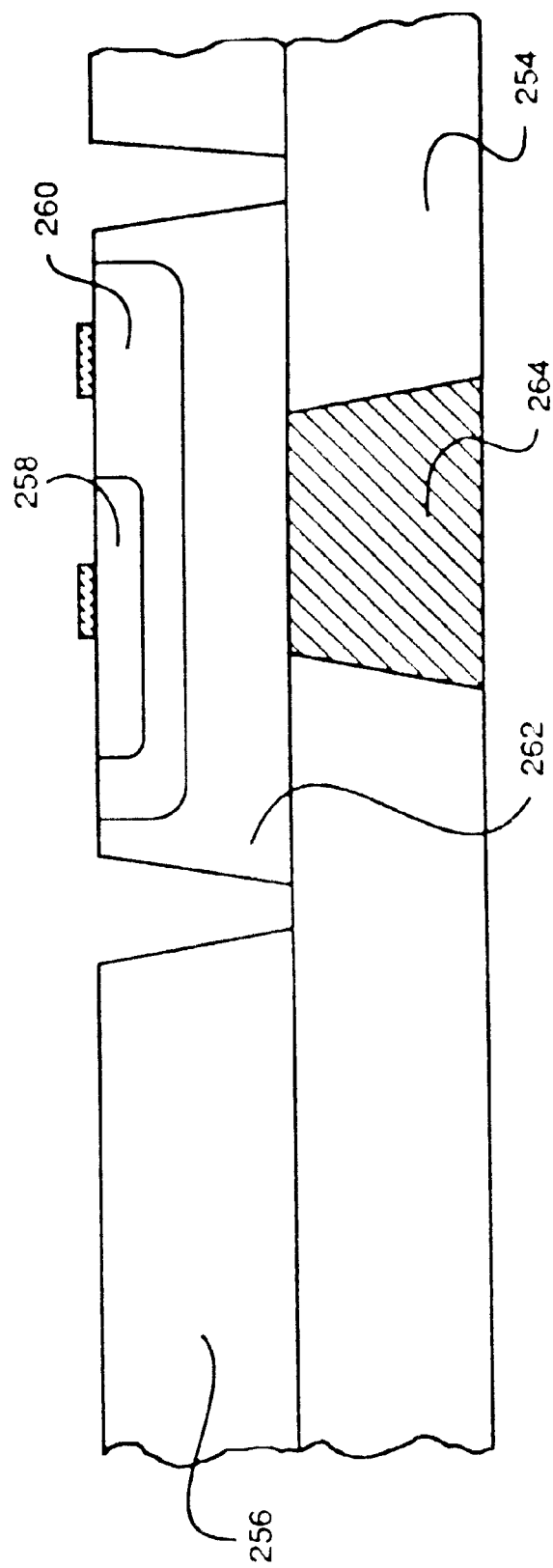
Fig_11c

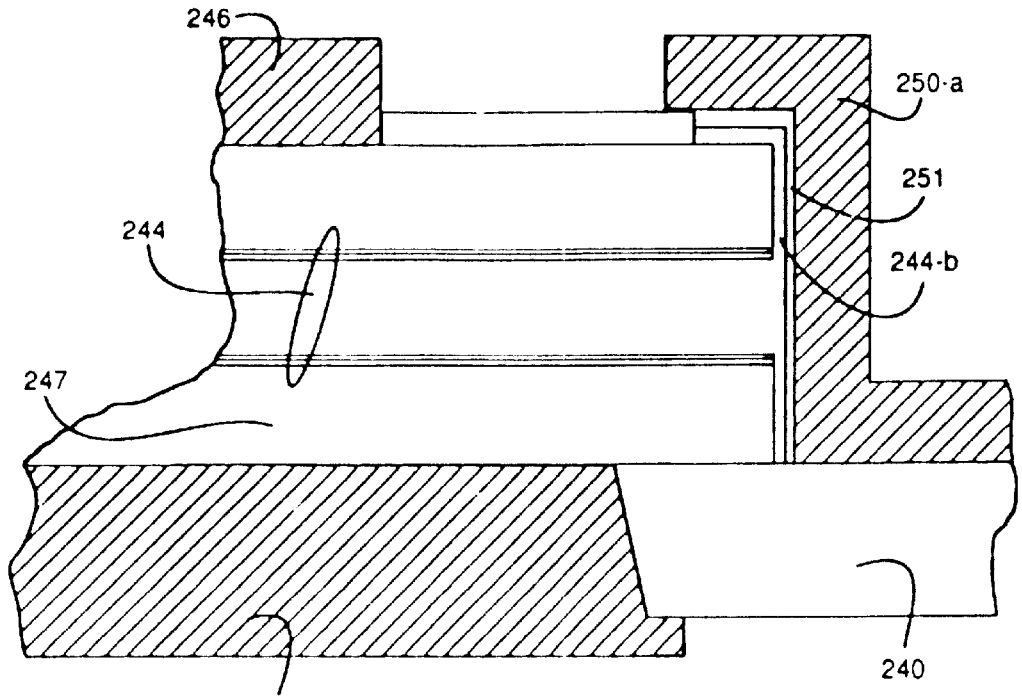
Fig_11d
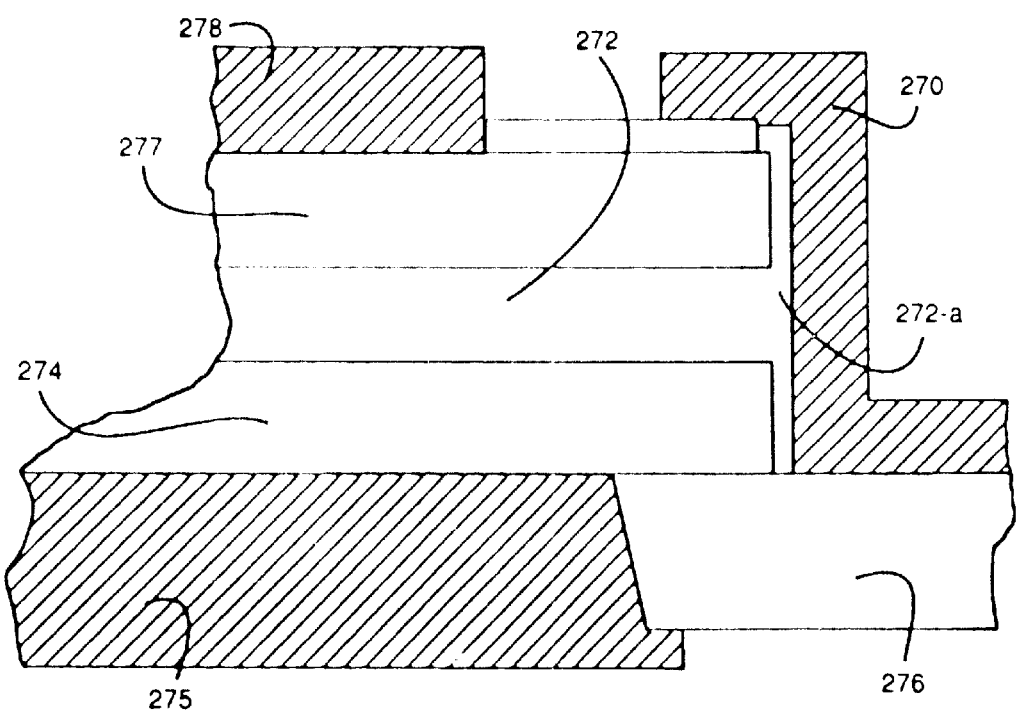
Fig_11e

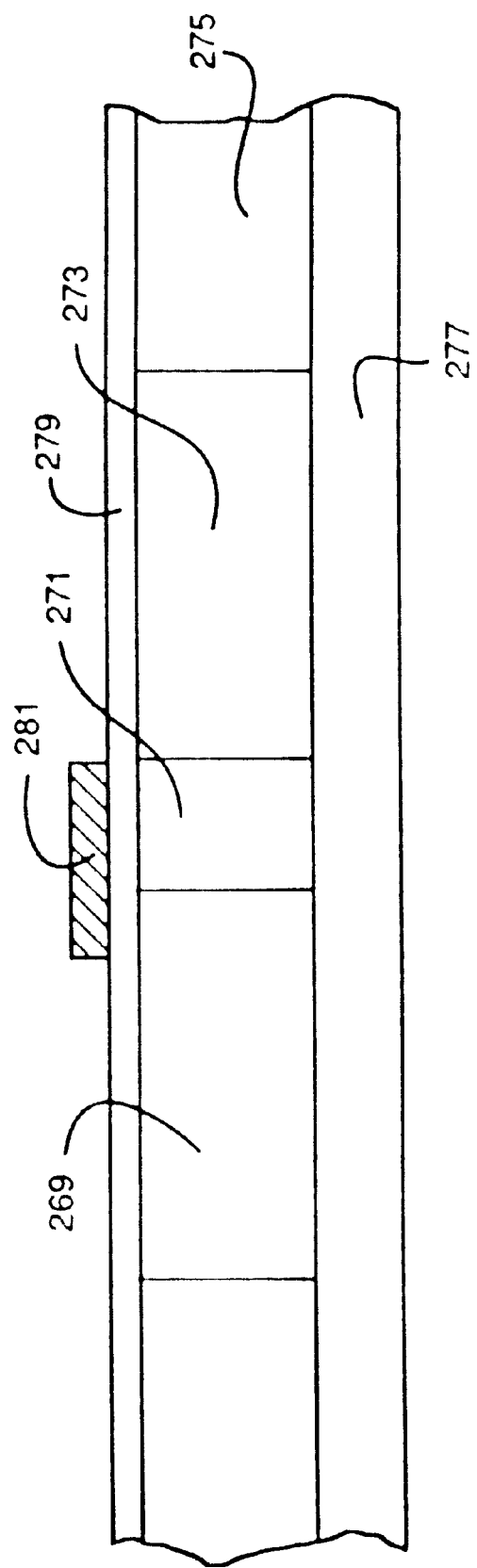
Fig_11f

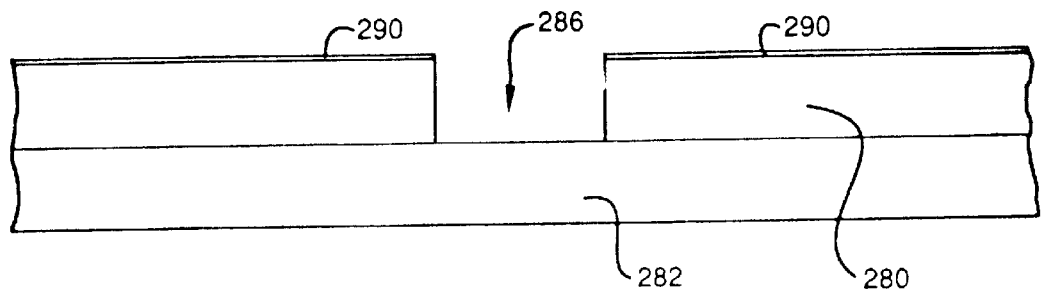
Fig_12a
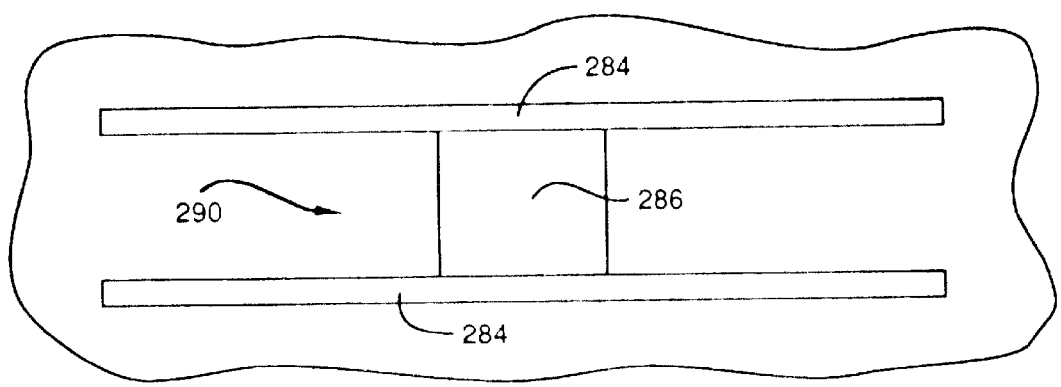
Fig_12b

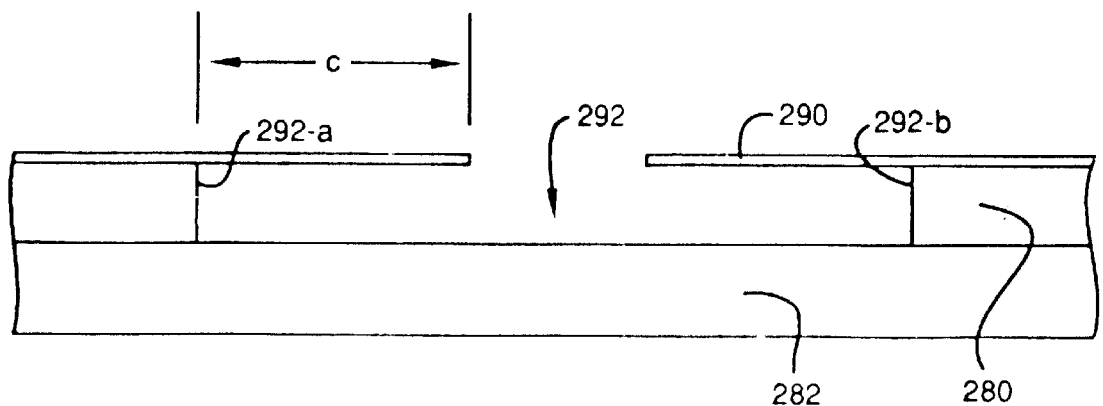
Fig_12c
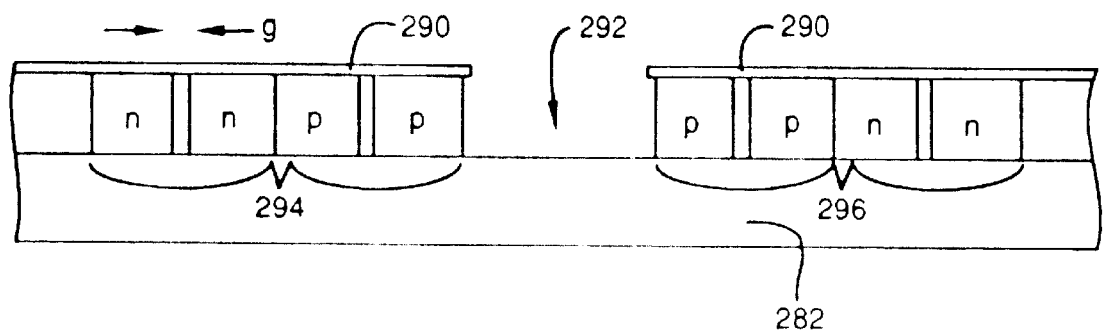
Fig_12d

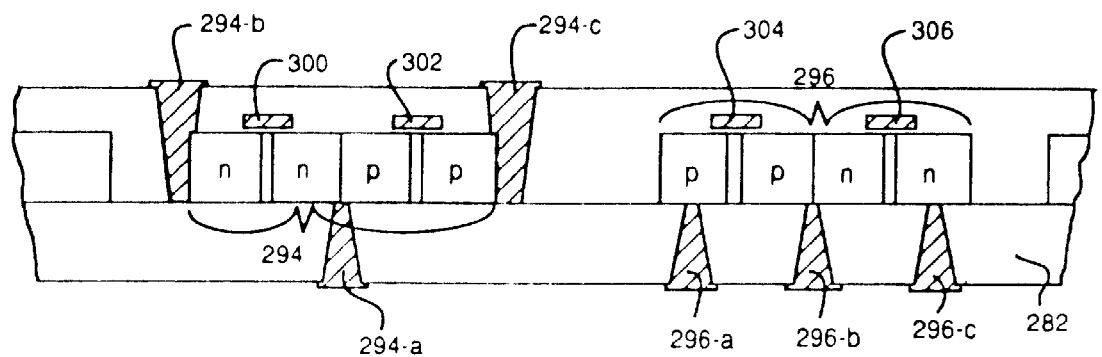
*Fig_12e*
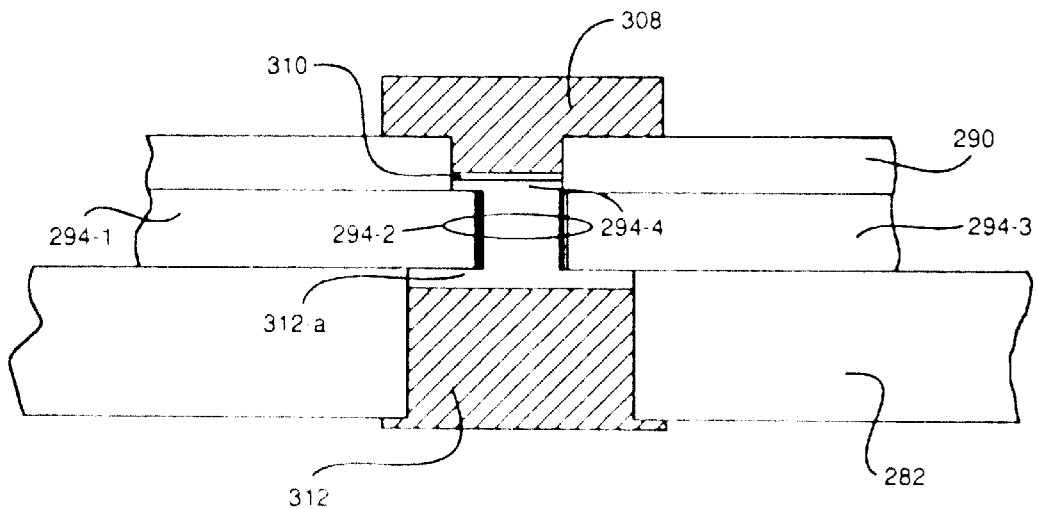
*Fig_12f*

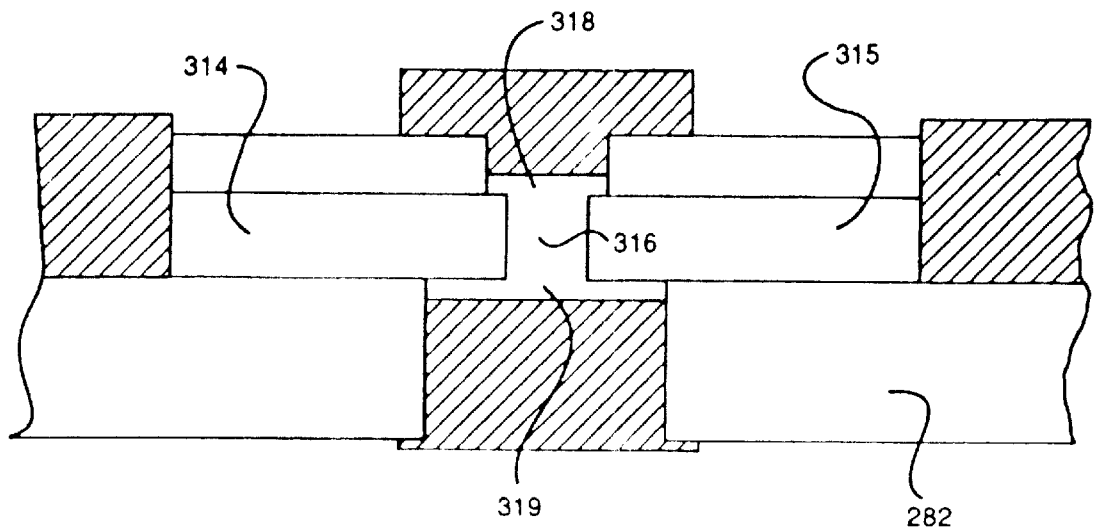
Fig_12g
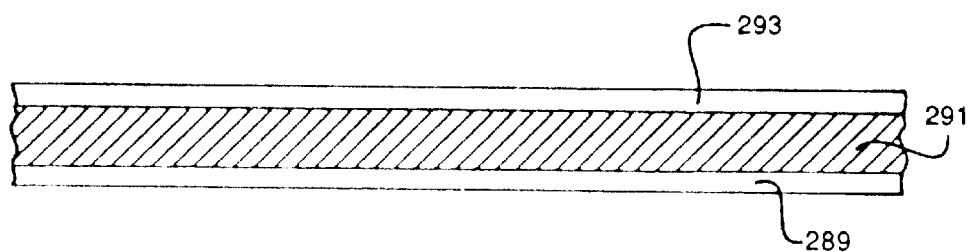
Fig_12h

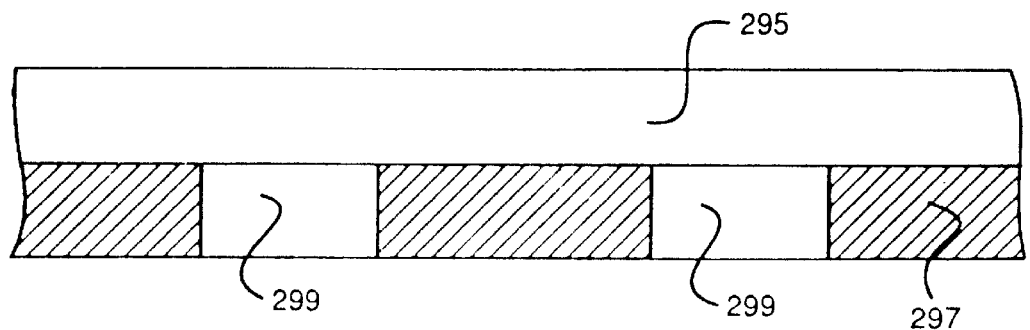
Fig_12i
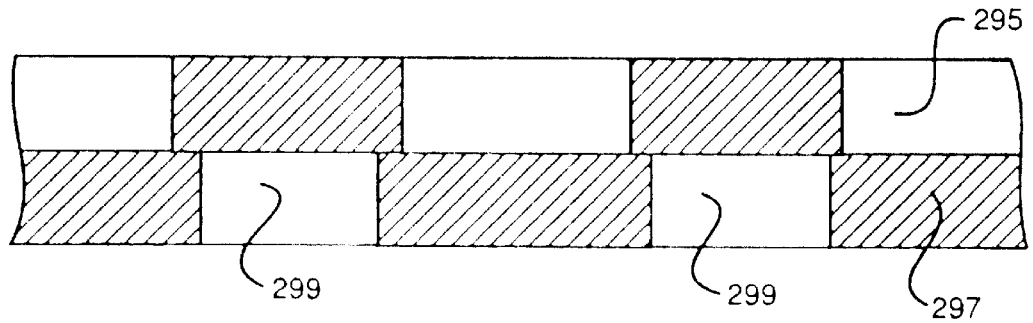
Fig_12j

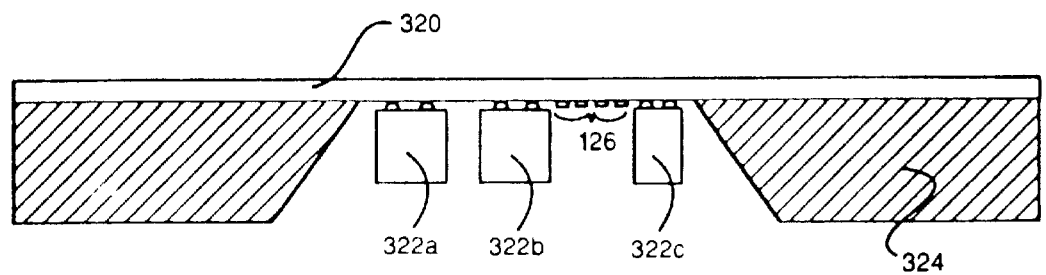
Fig_13a
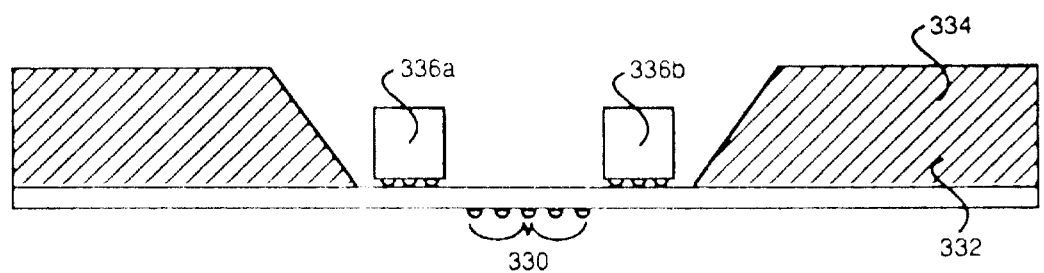
Fig_13b

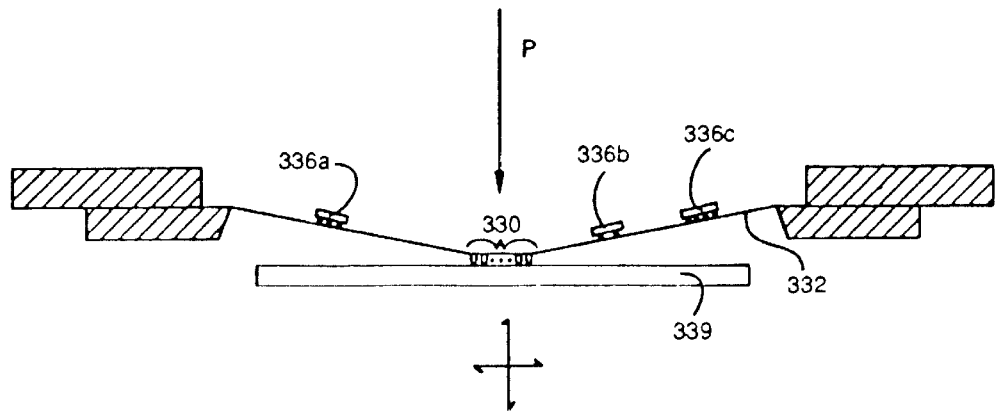
Fig_13c
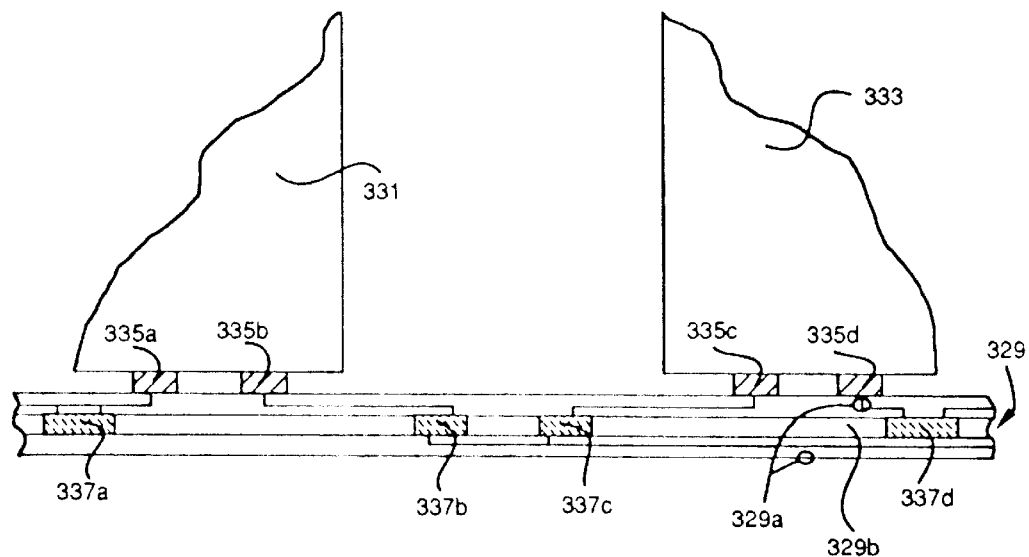
Fig_13d

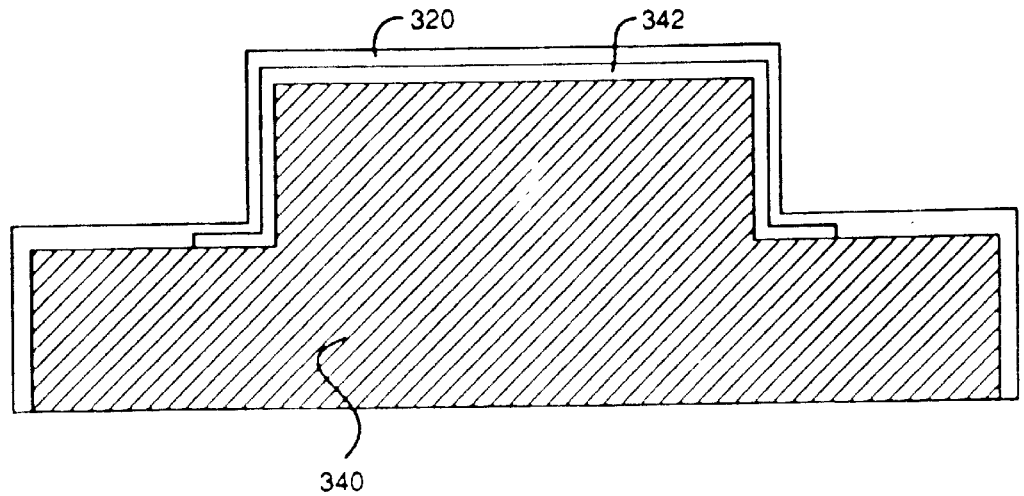
Fig_14
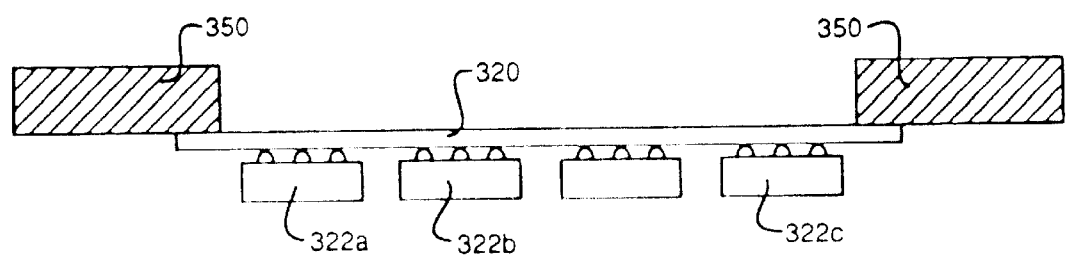
Fig_15

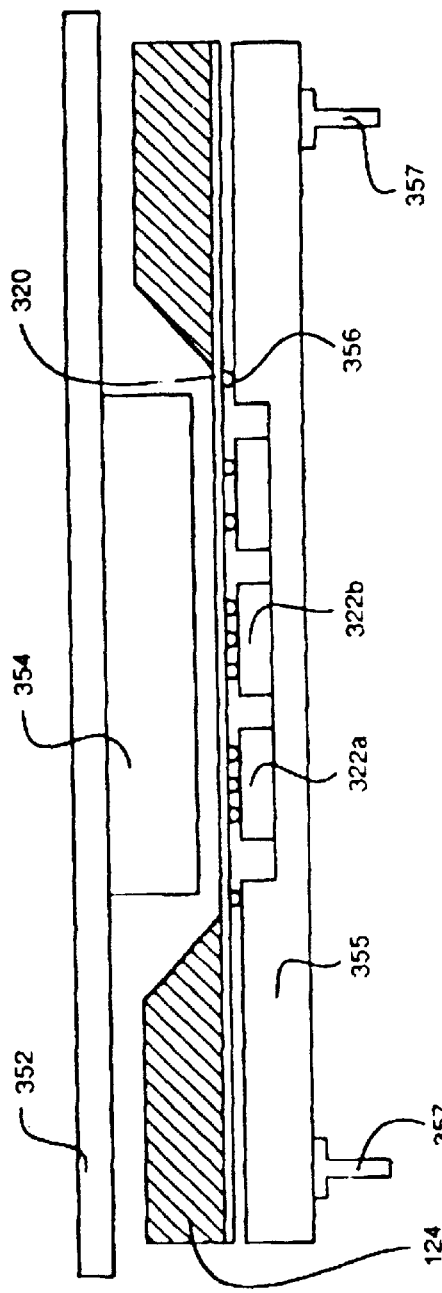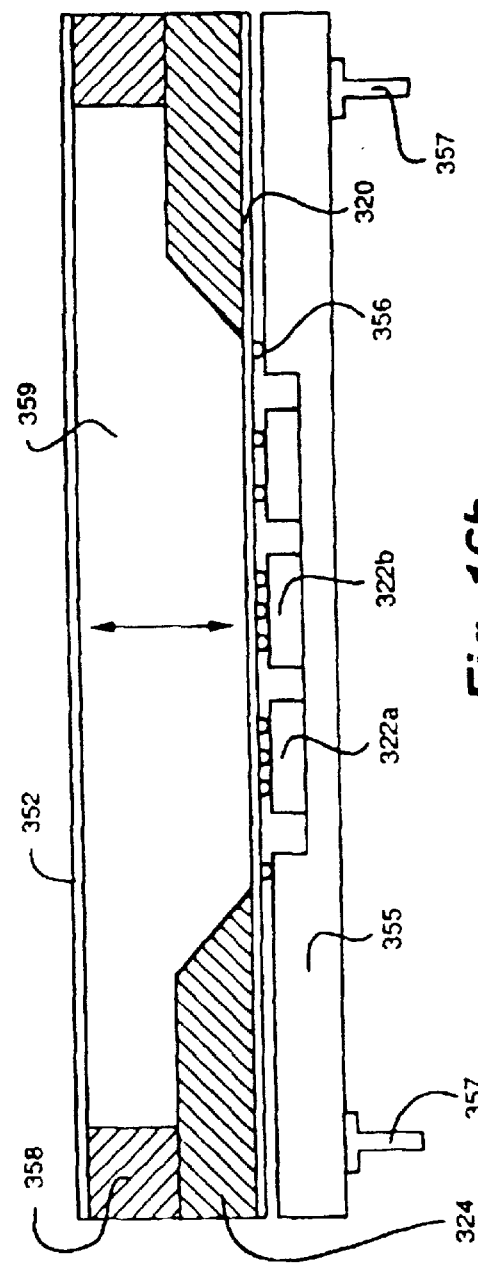
Fig_16a
Fig_16b

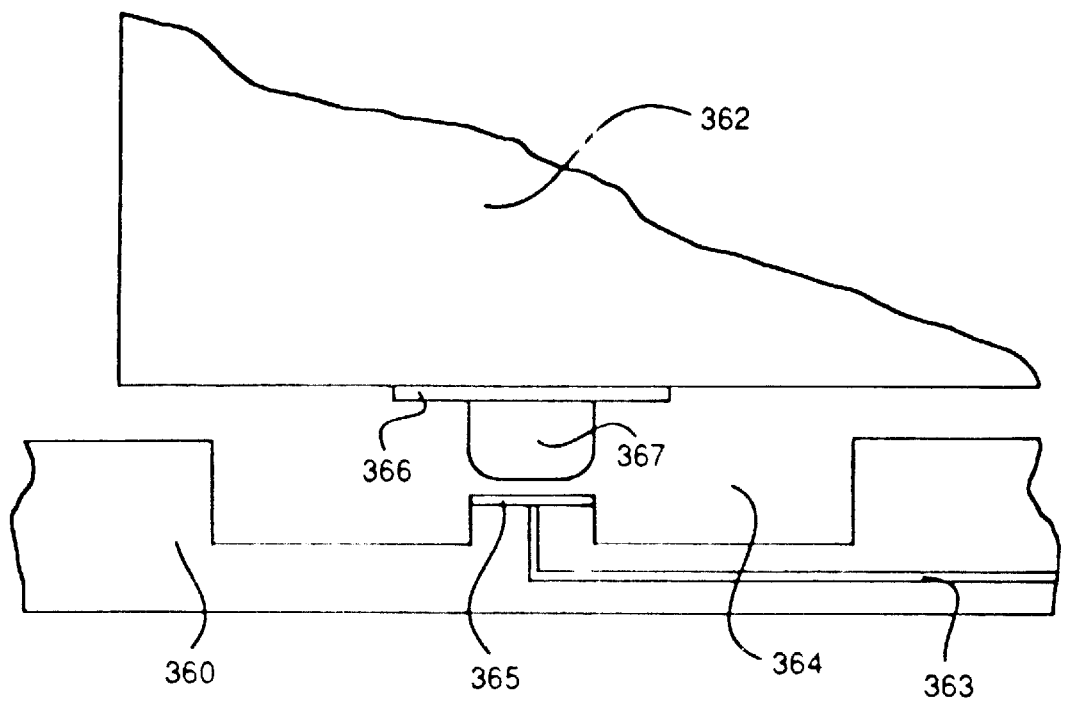
Fig_17a
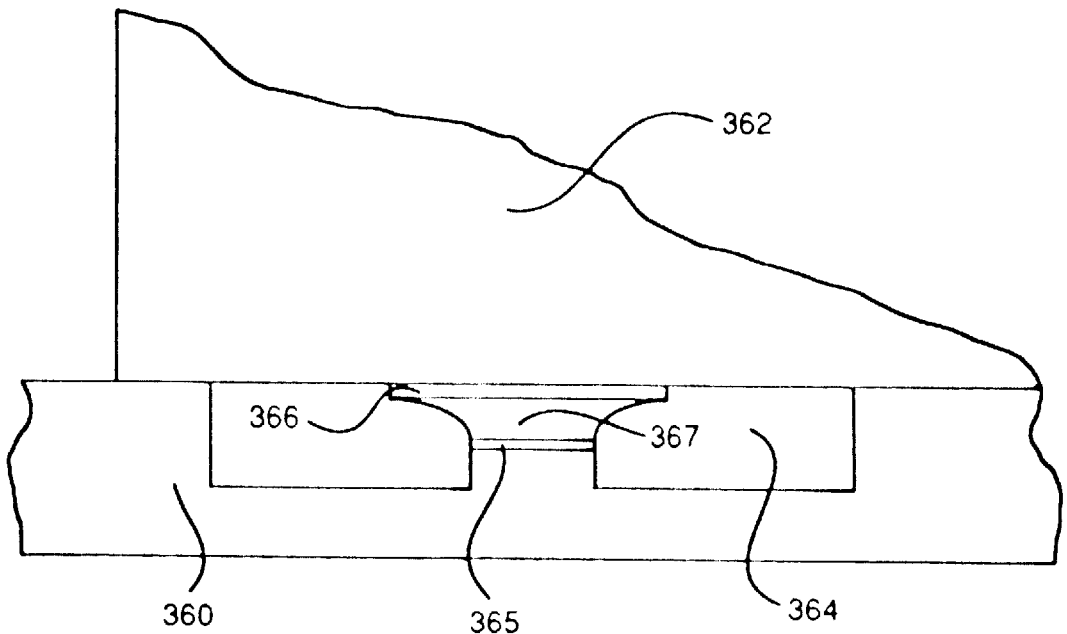
Fig_17b

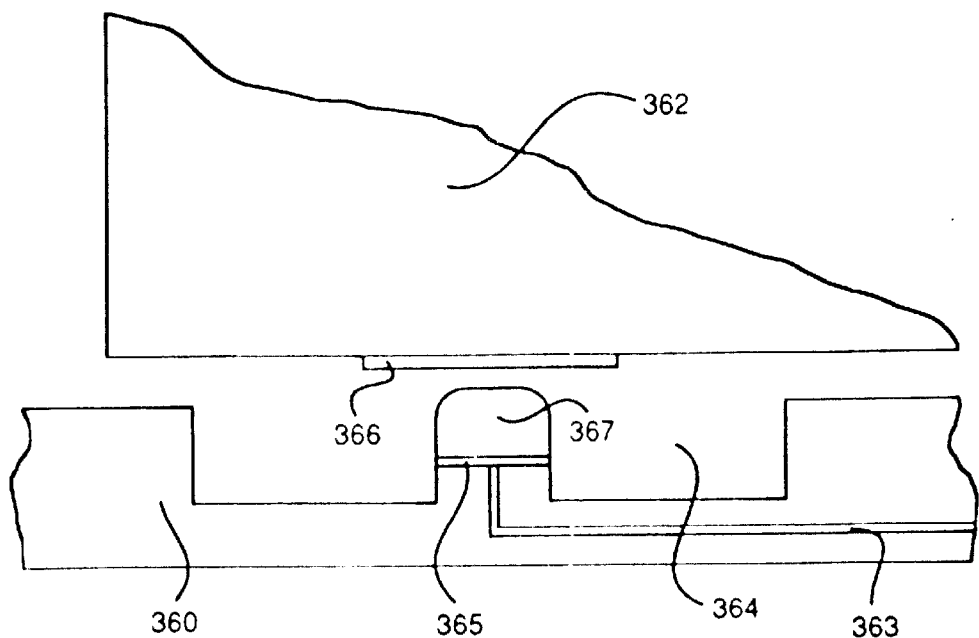
Fig_17c
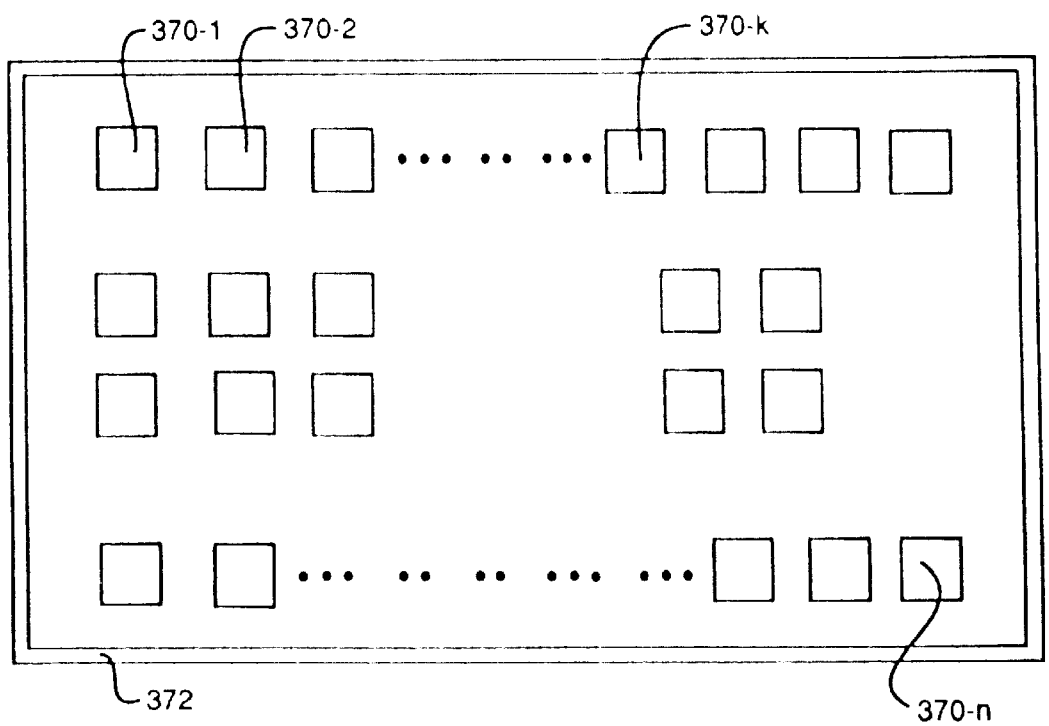
Fig_18

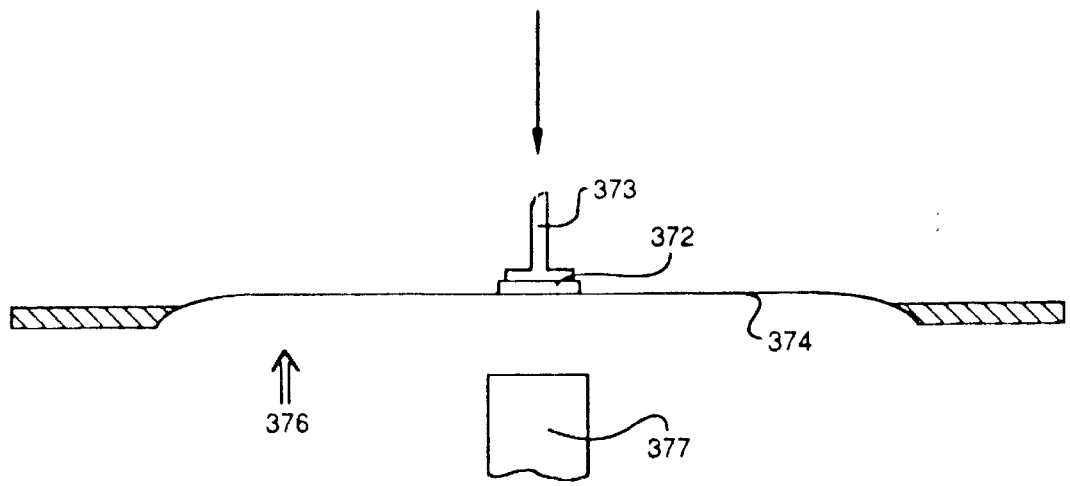
*Fig_19a*
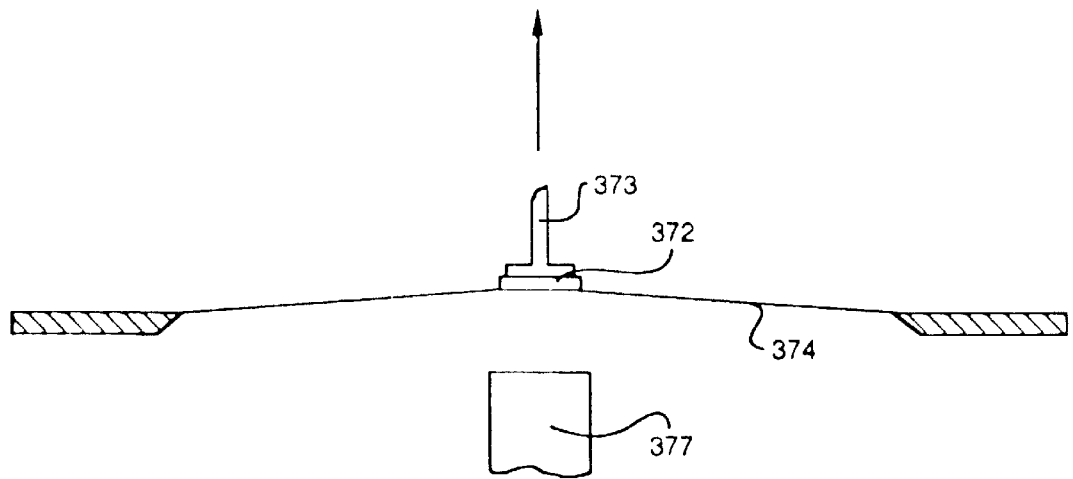
*Fig_19b*

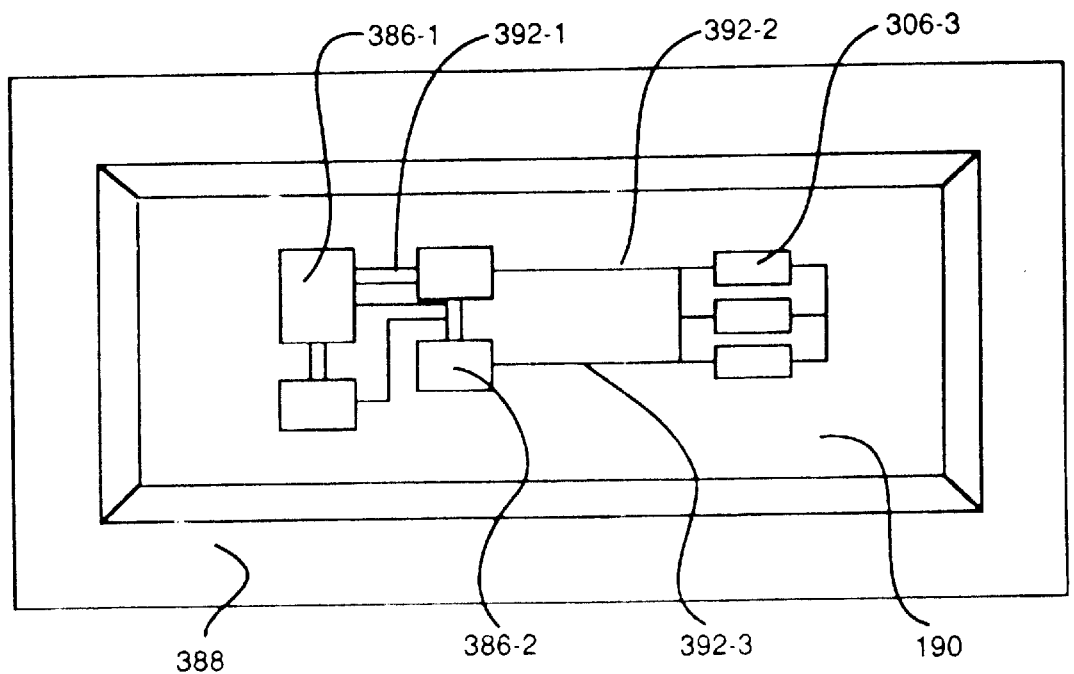
Fig_21
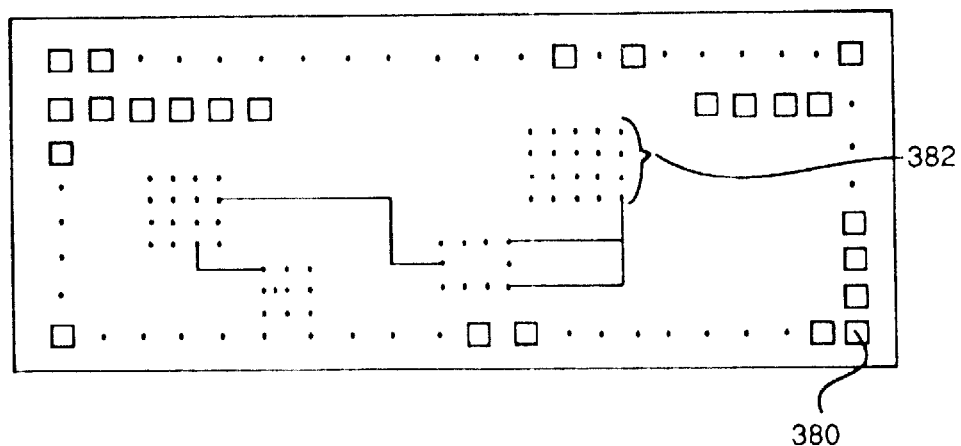
Fig_20

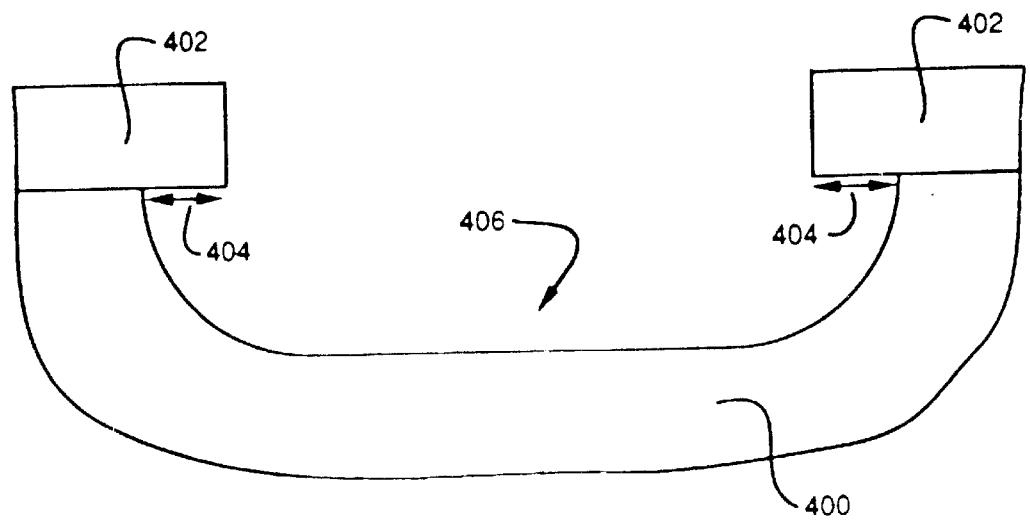
Fig_22a
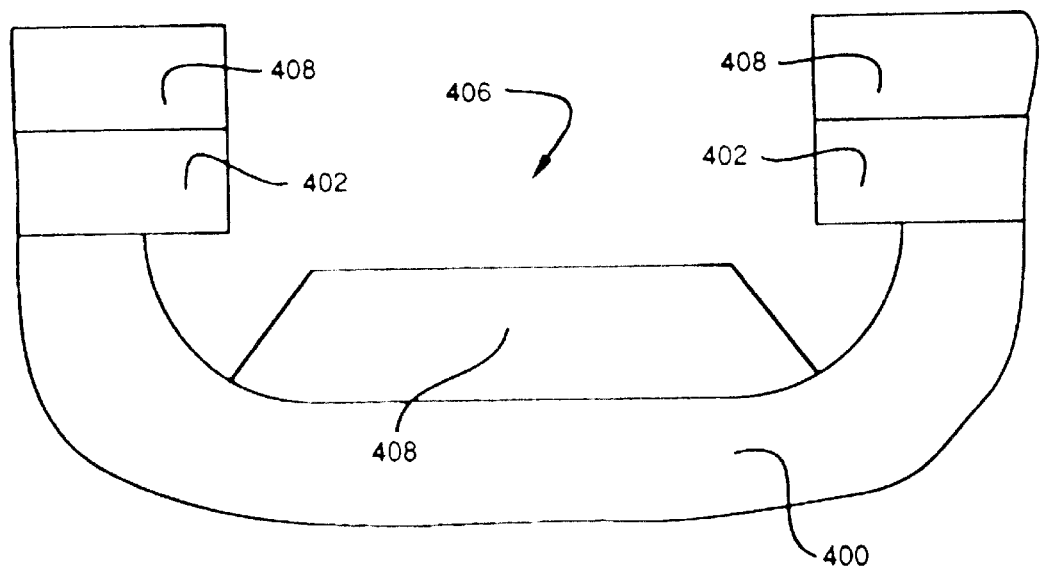
Fig_22b

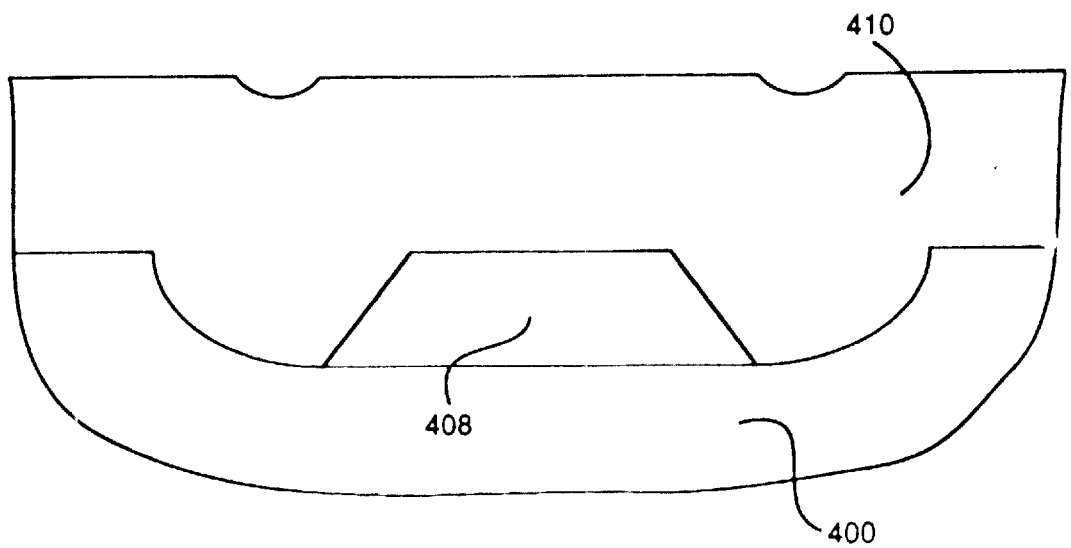
*Fig_22c*
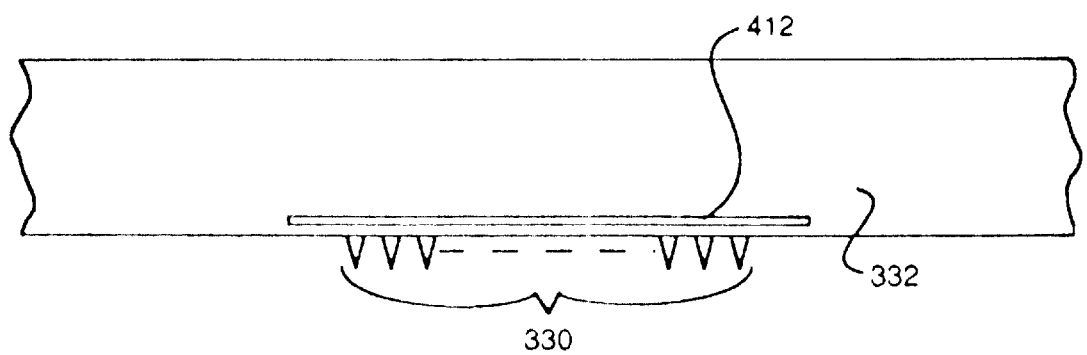
*Fig_23a*

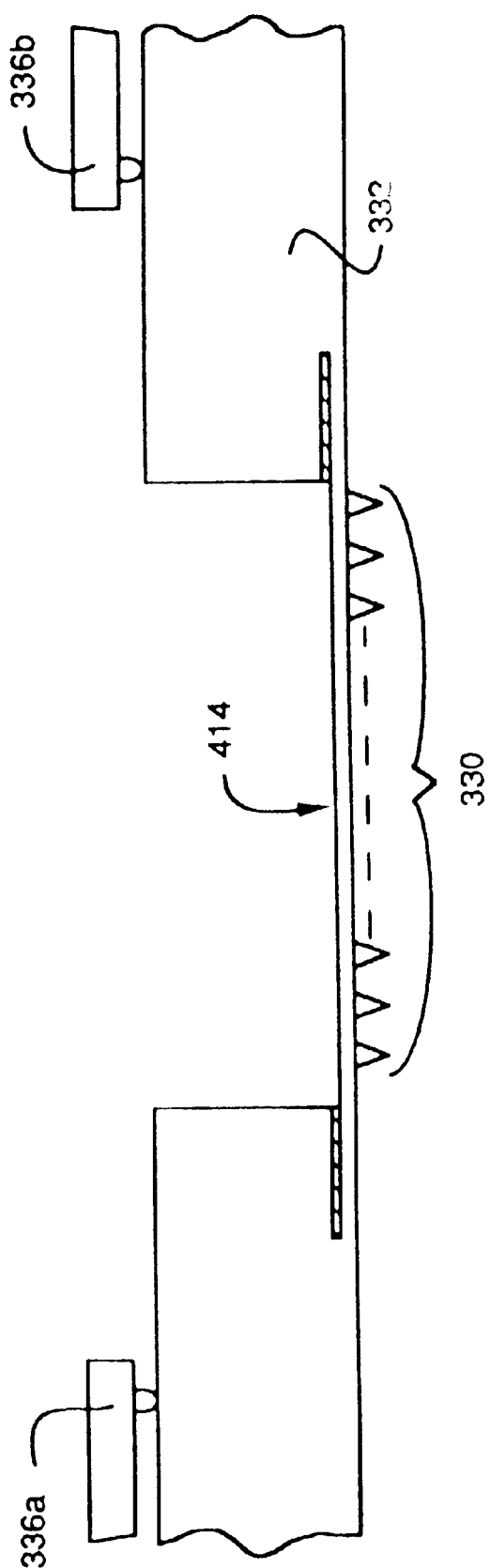
Fig_23b

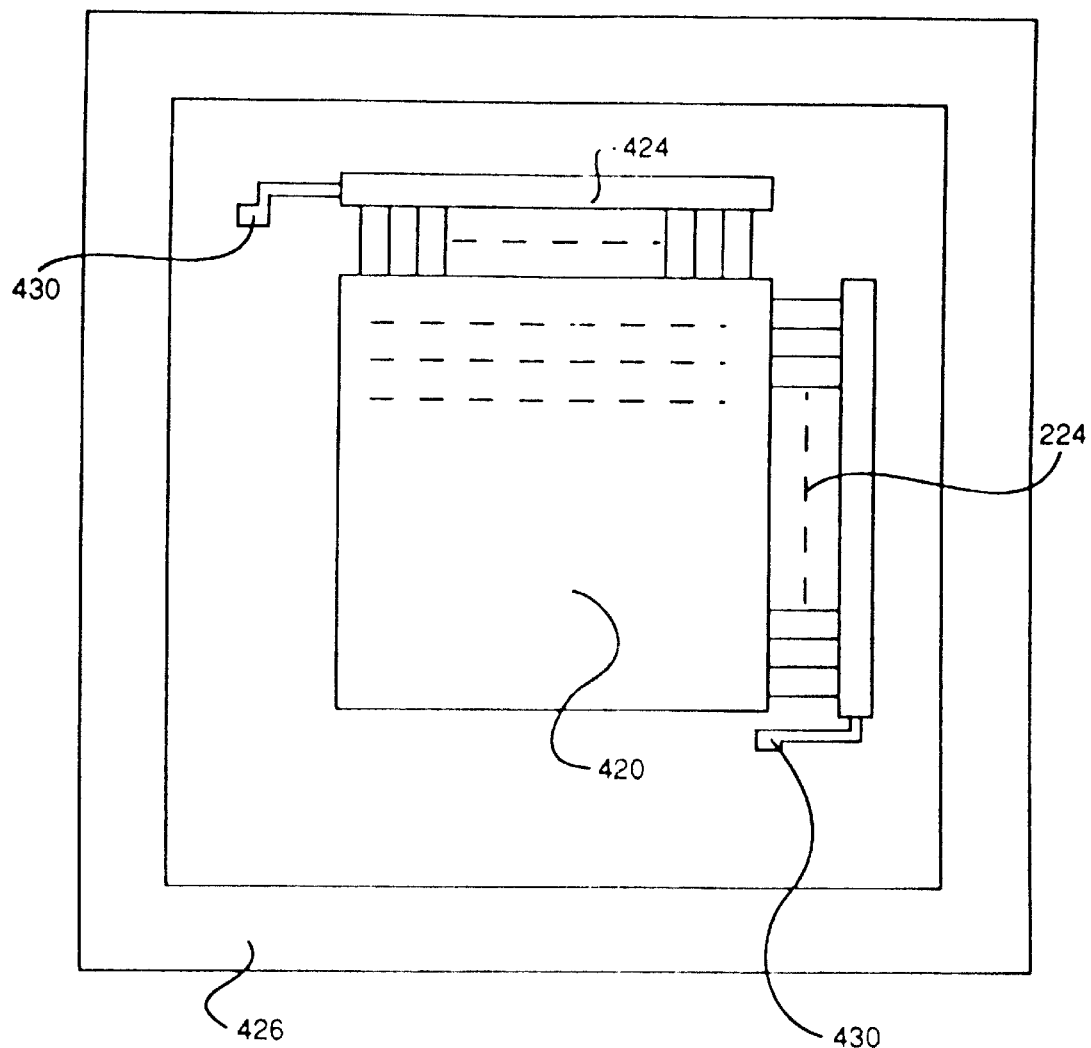
Fig_24

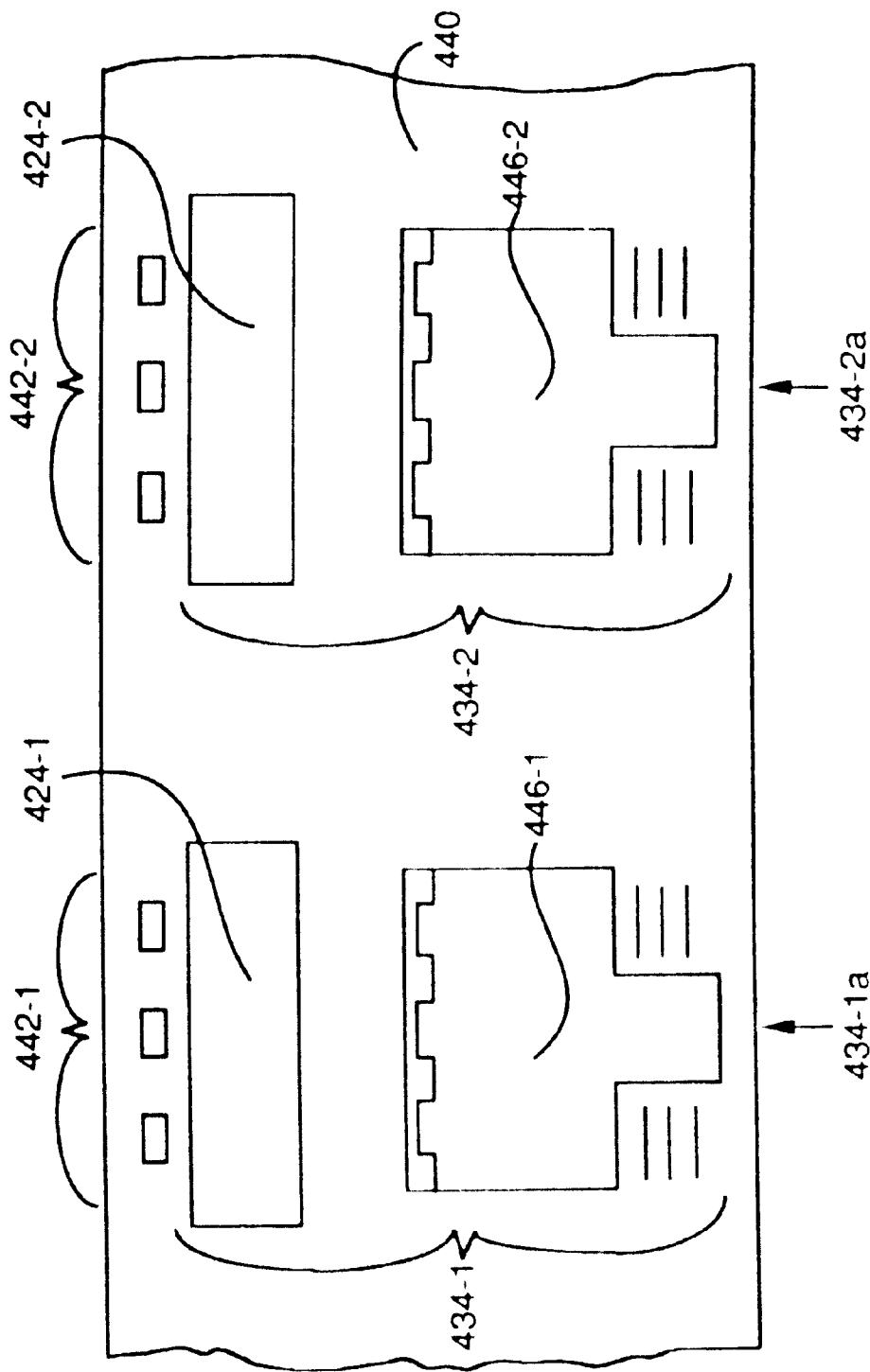
Fig_25

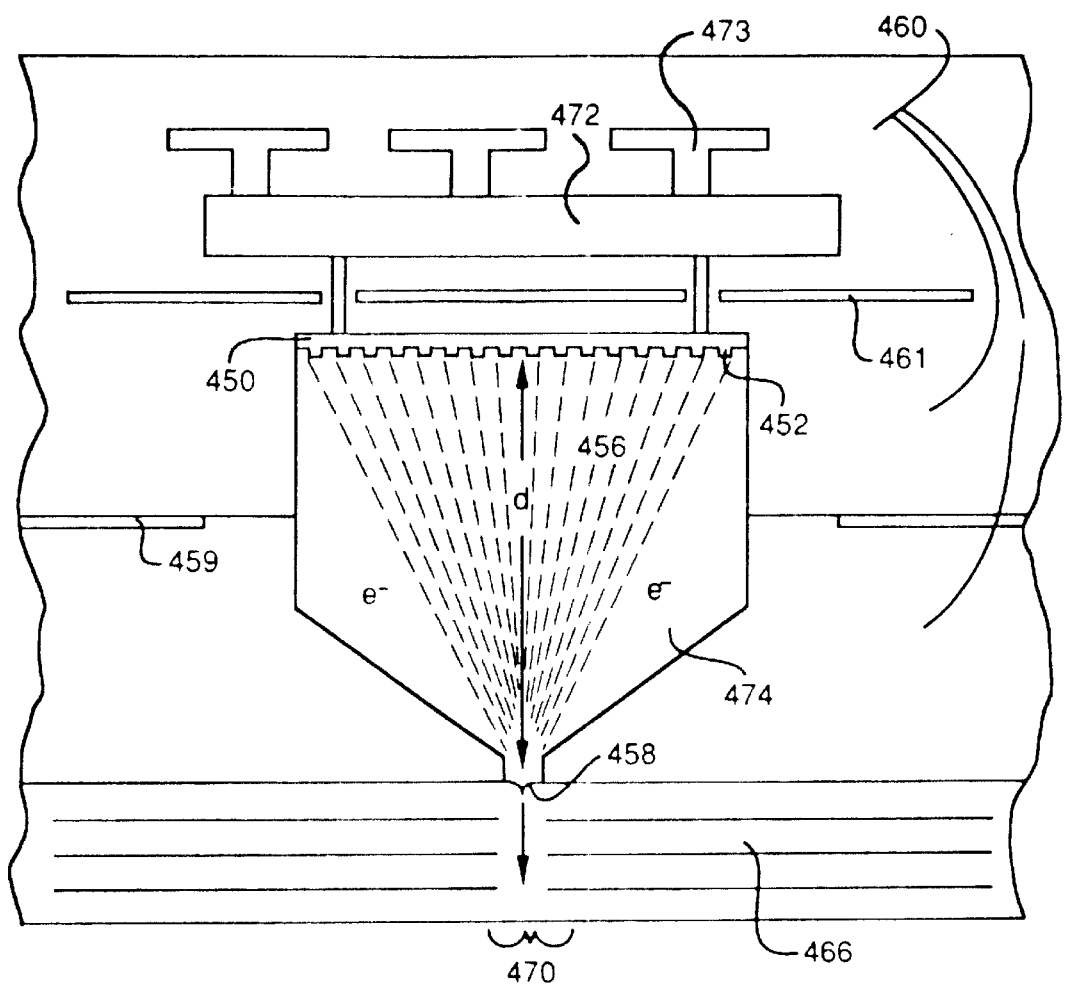
Fig_26

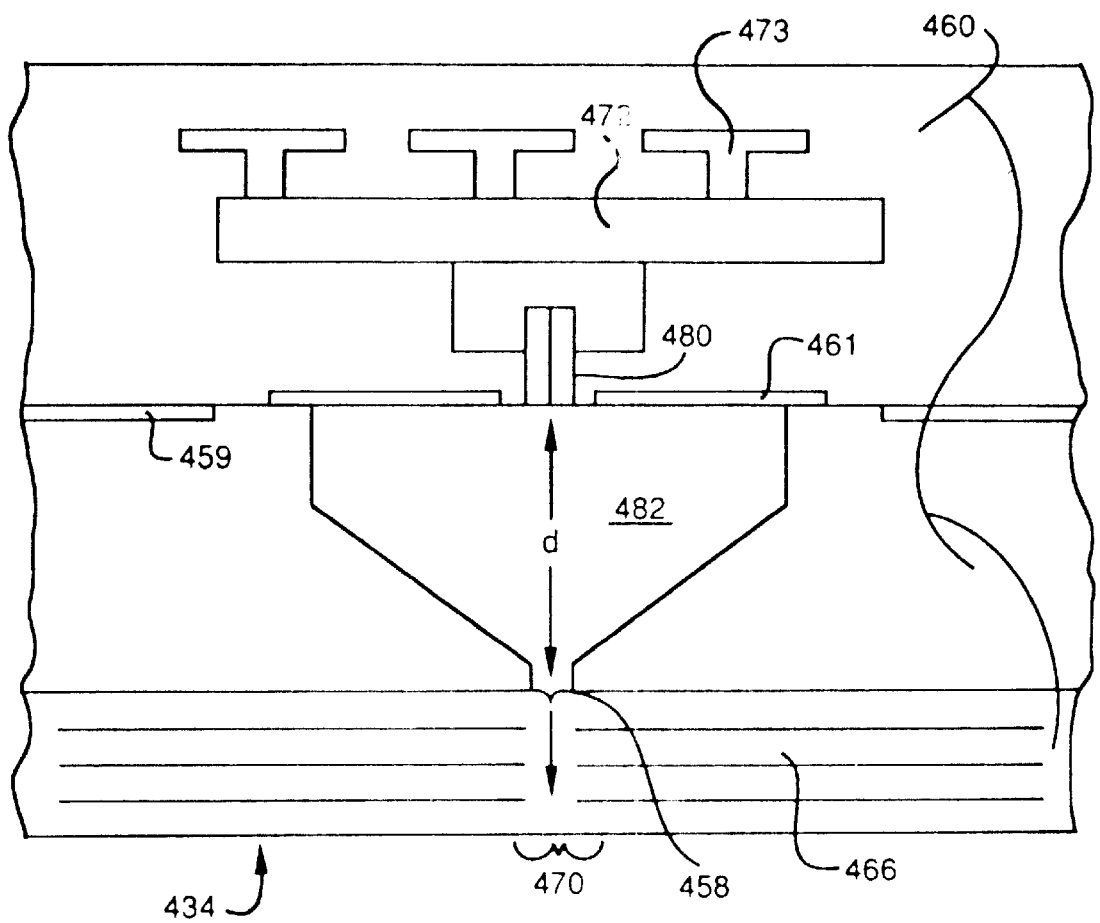
Fig_27

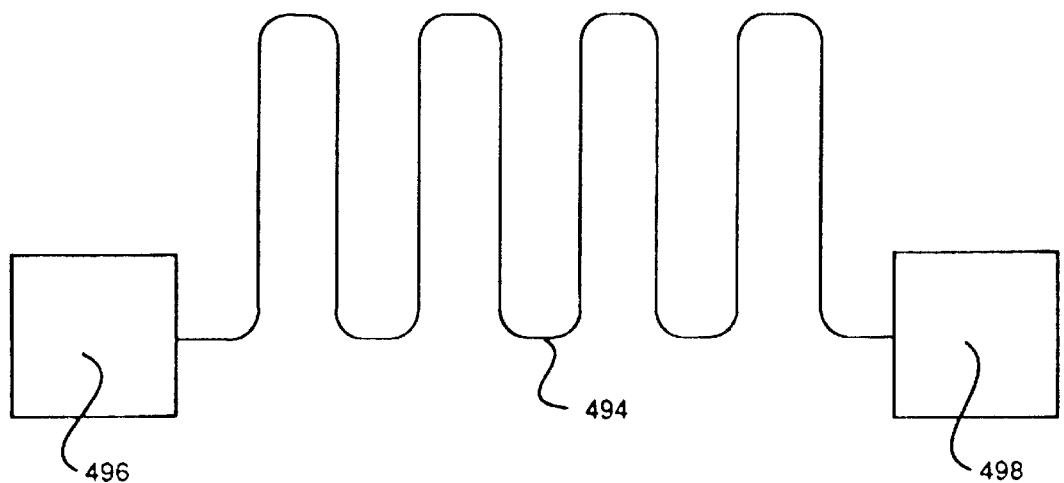
Fig_28a
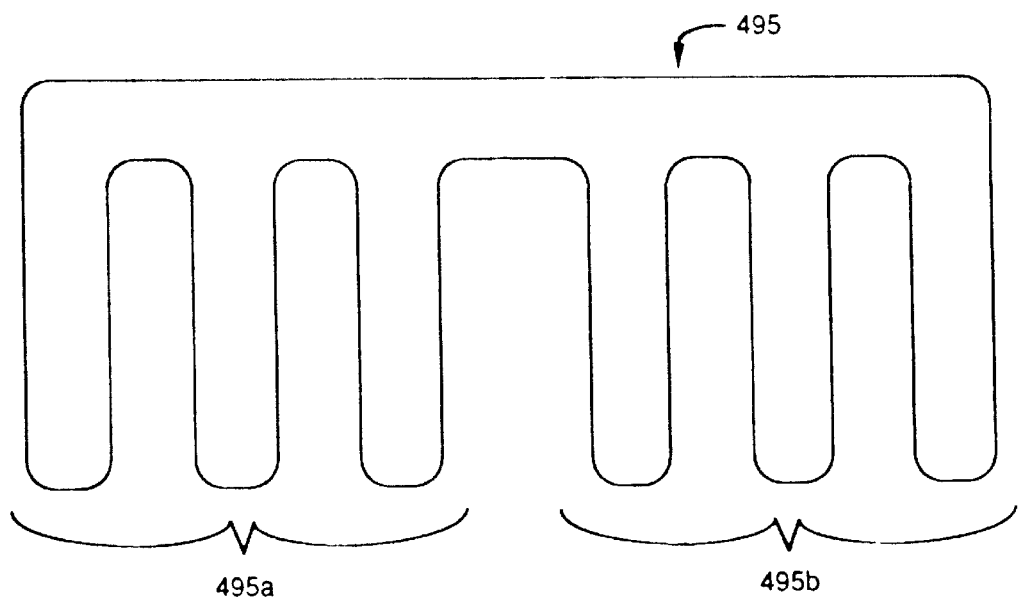
Fig_28b

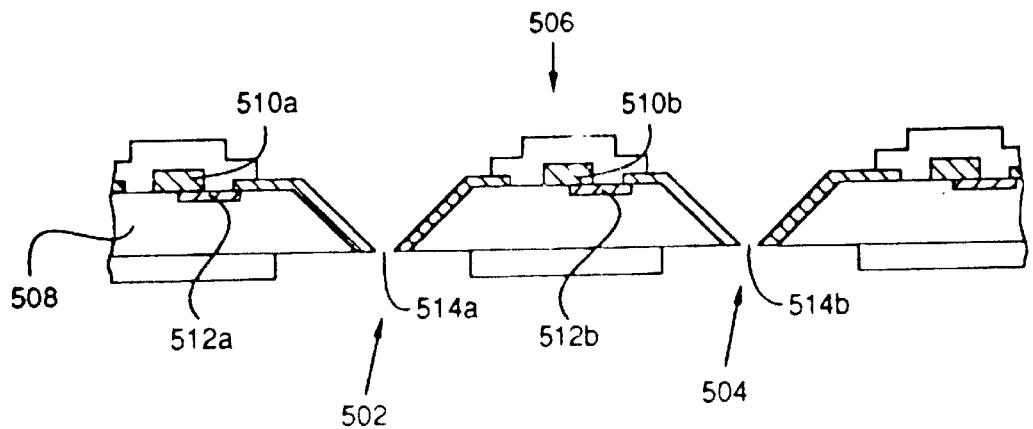
*Fig_29a*
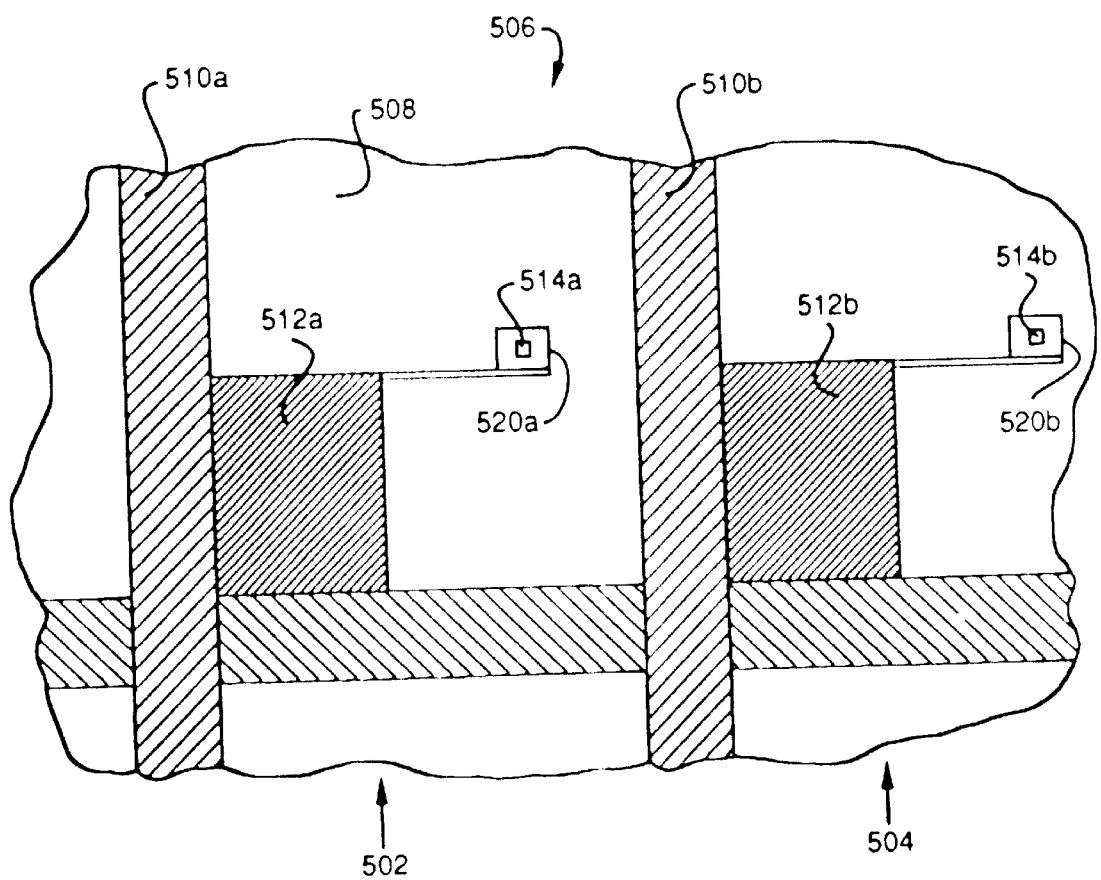
*Fig_29b*

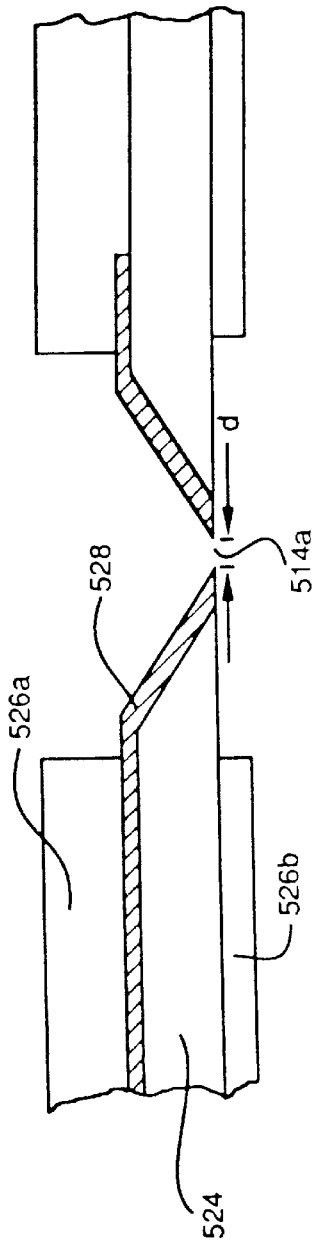
Fig_29c
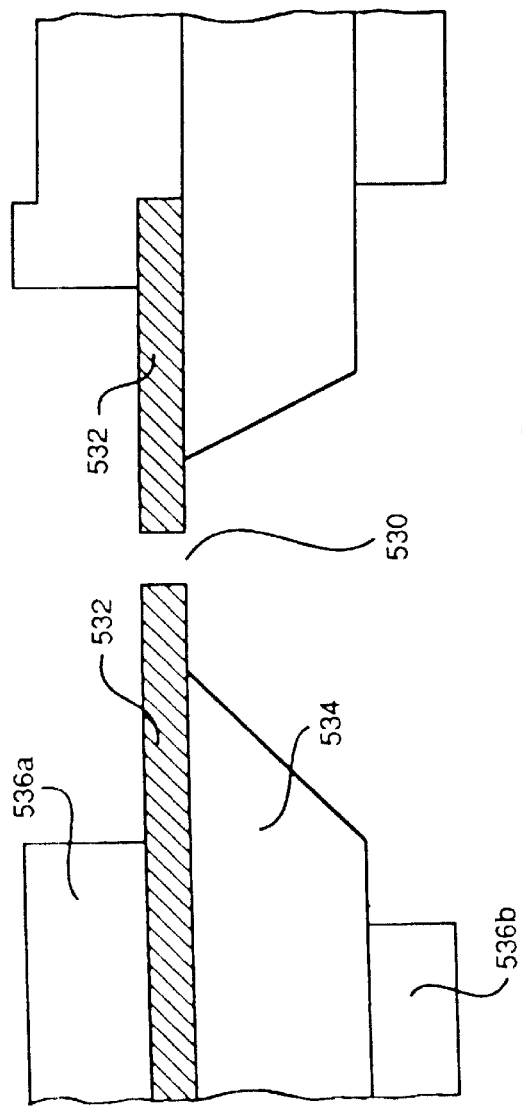
Fig_29d

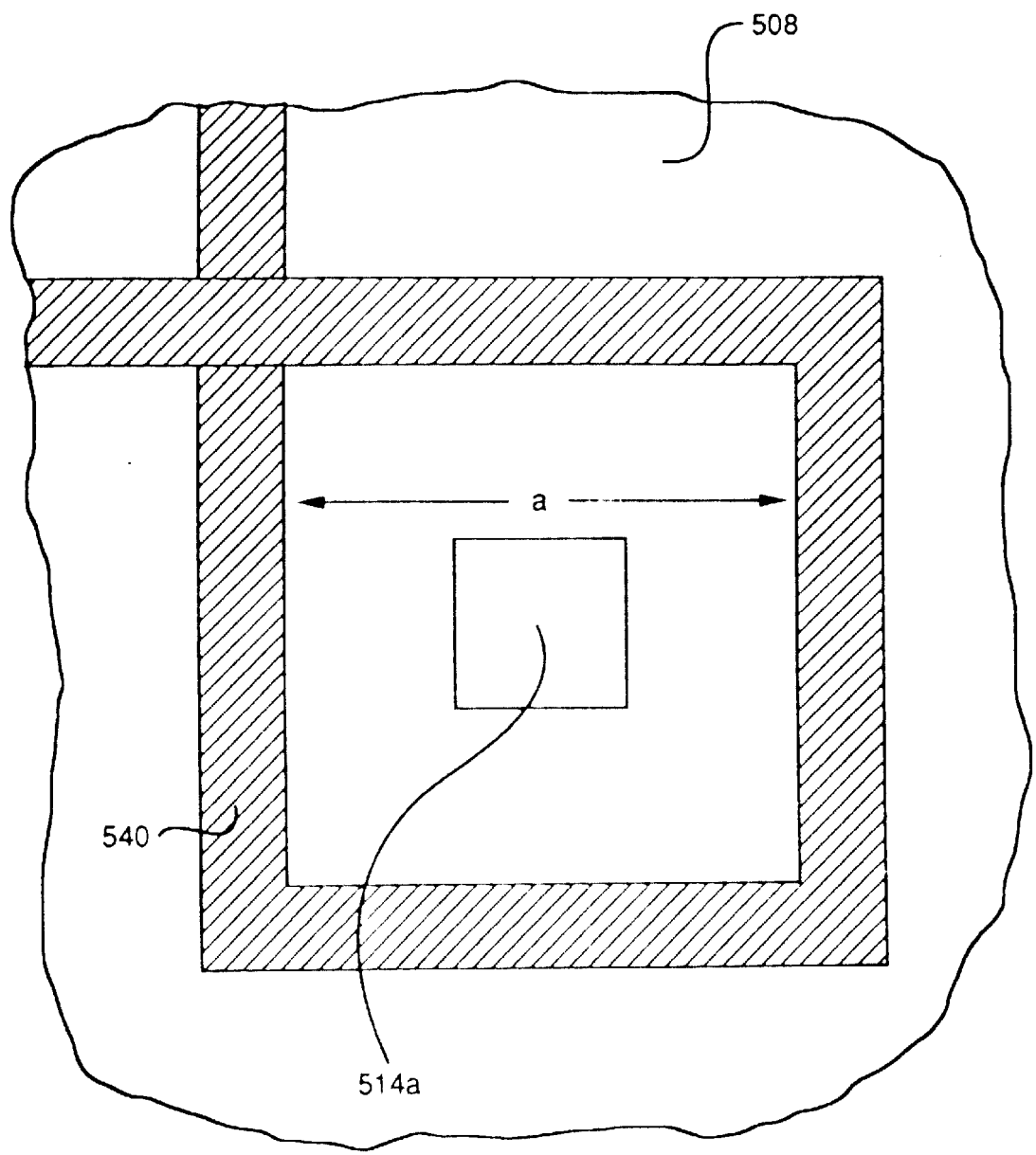
Fig_29e

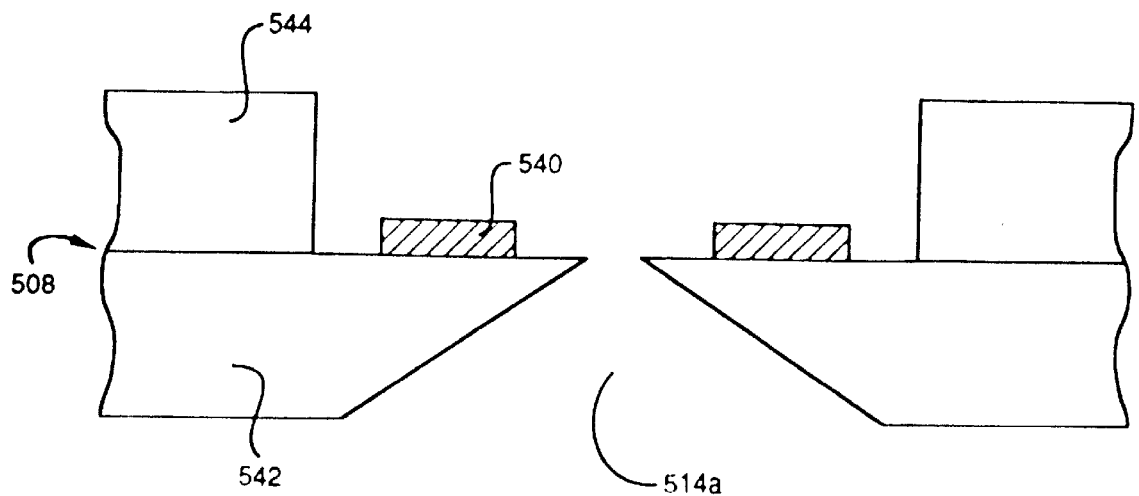
Fig_29f
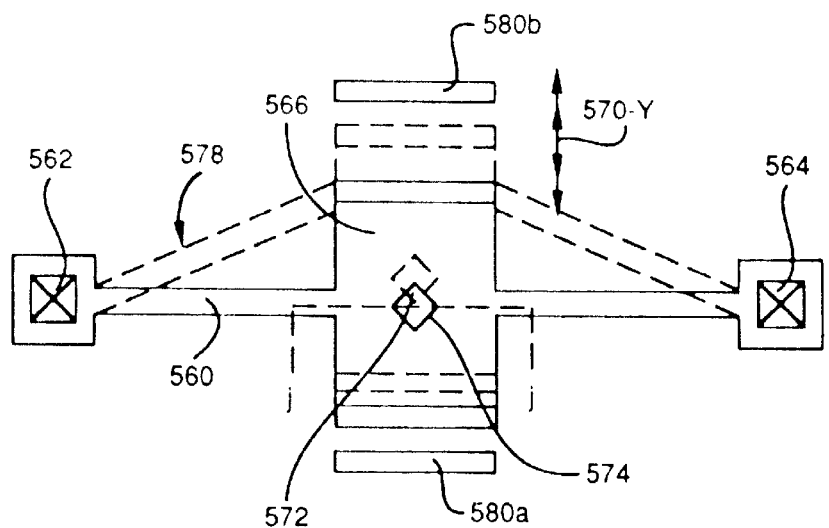
Fig_29h

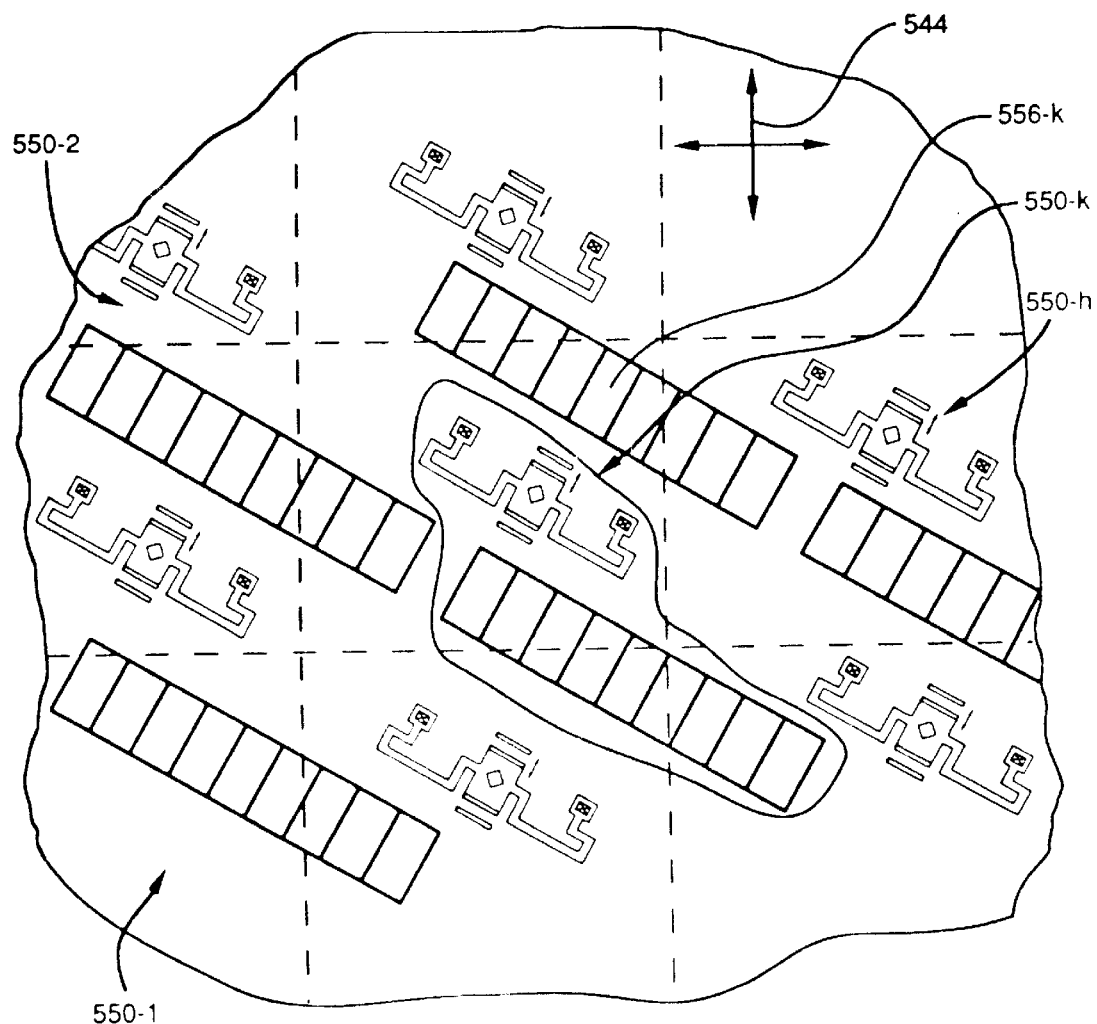
Fig_29g

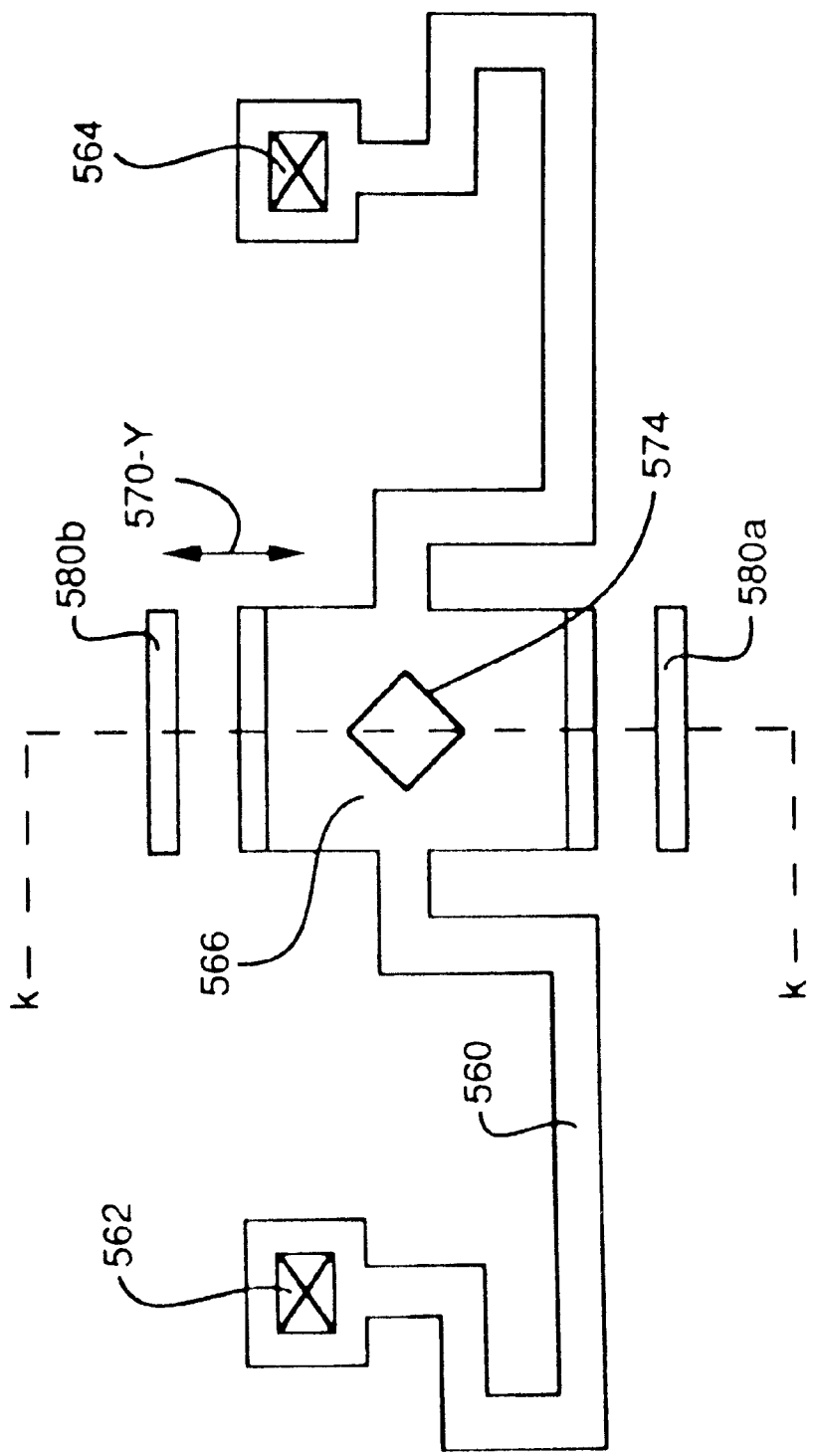
Fig_29i

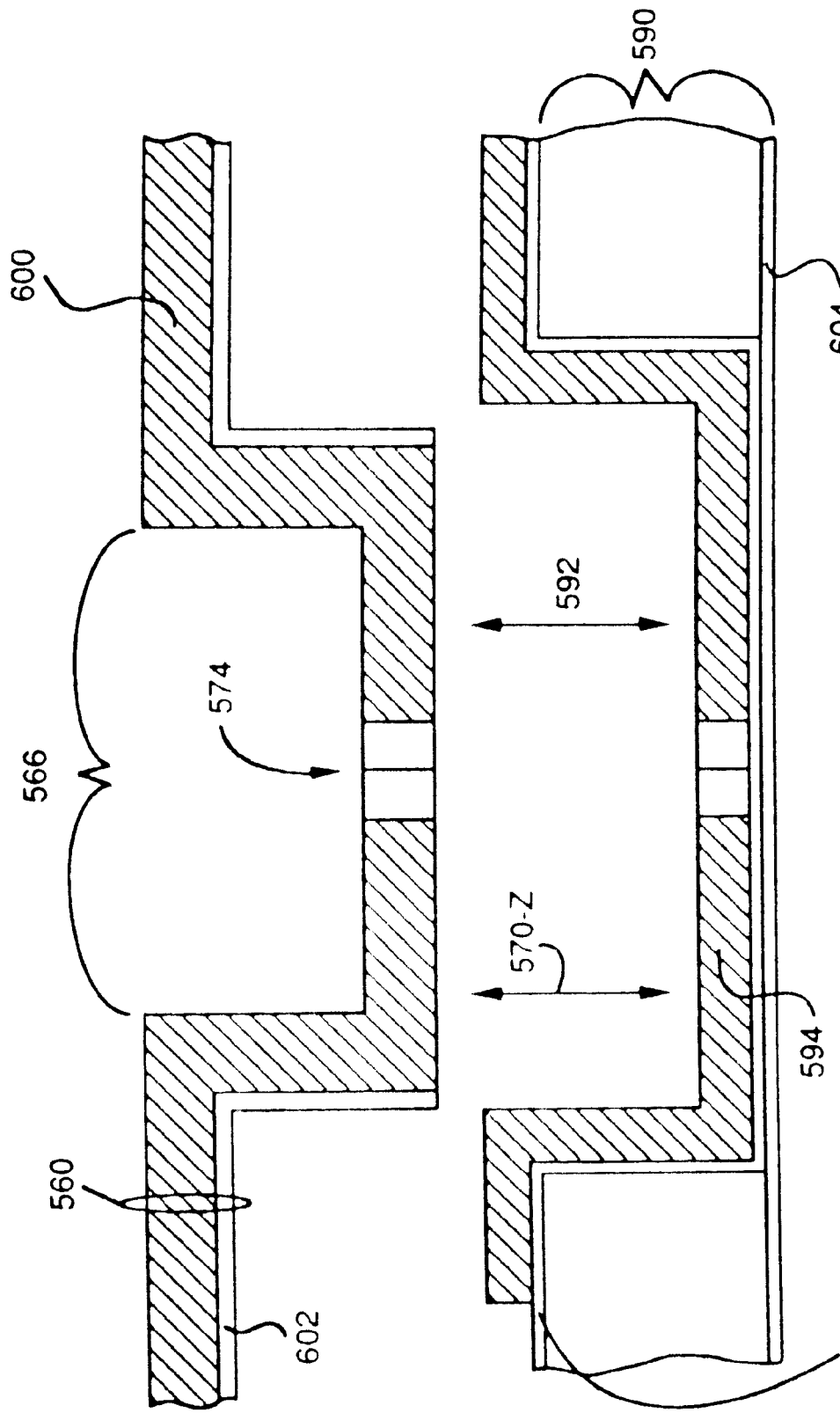
Fig_29j

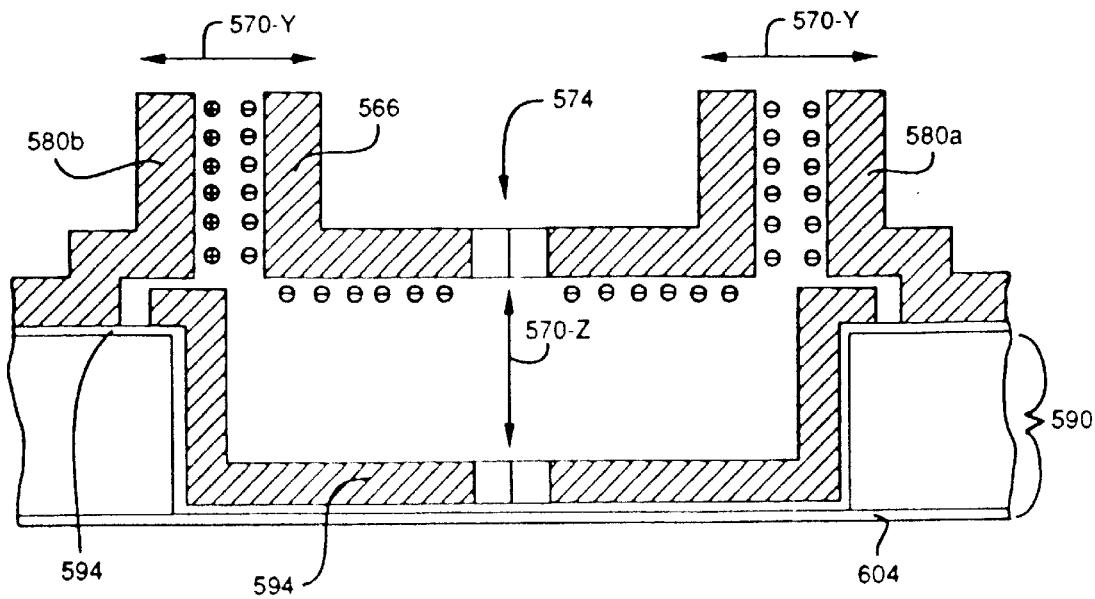
*Fig_29k*
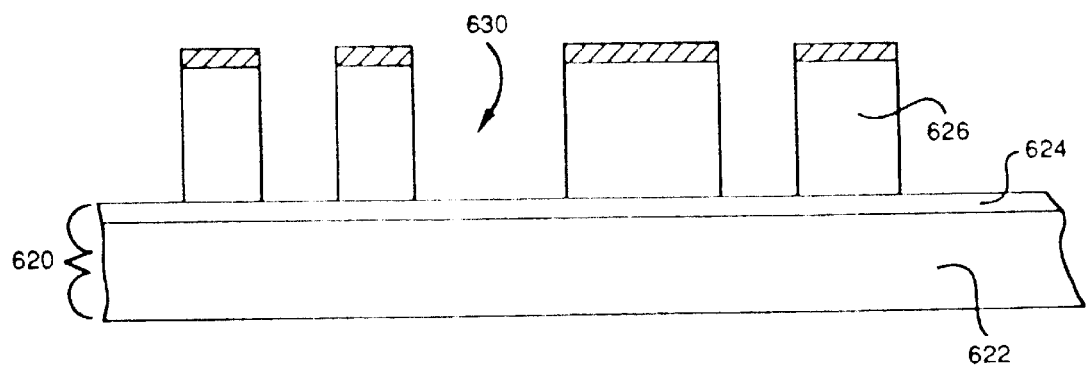
*Fig_29l*

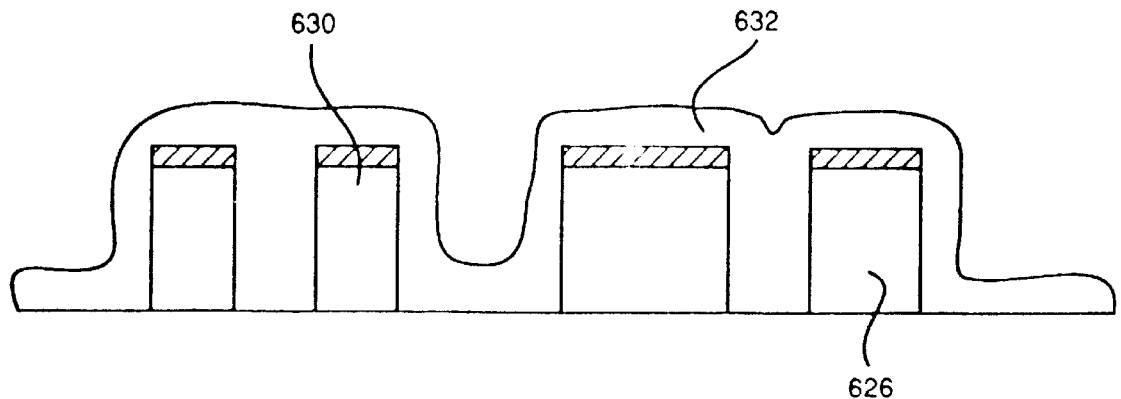
Fig_29m
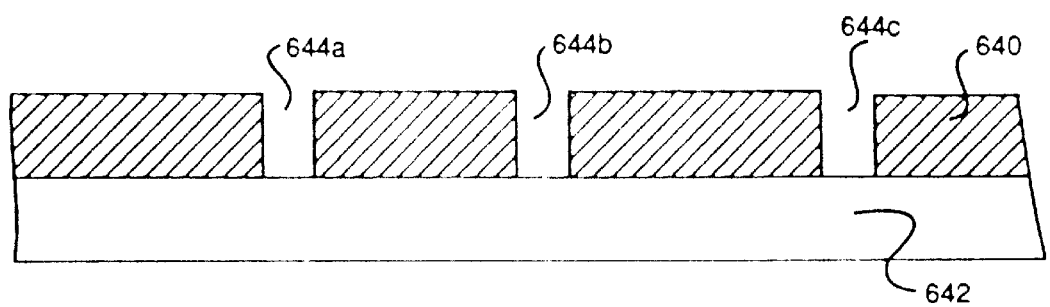
Fig_29n
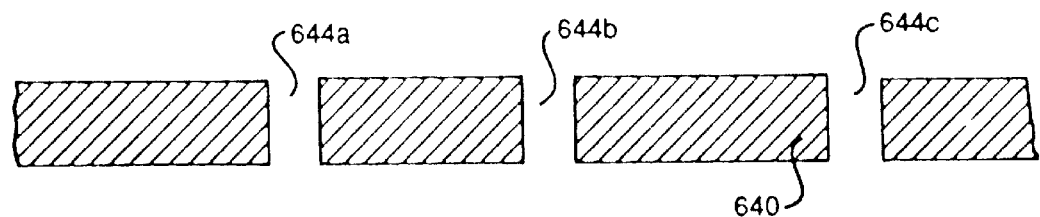
Fig_29p

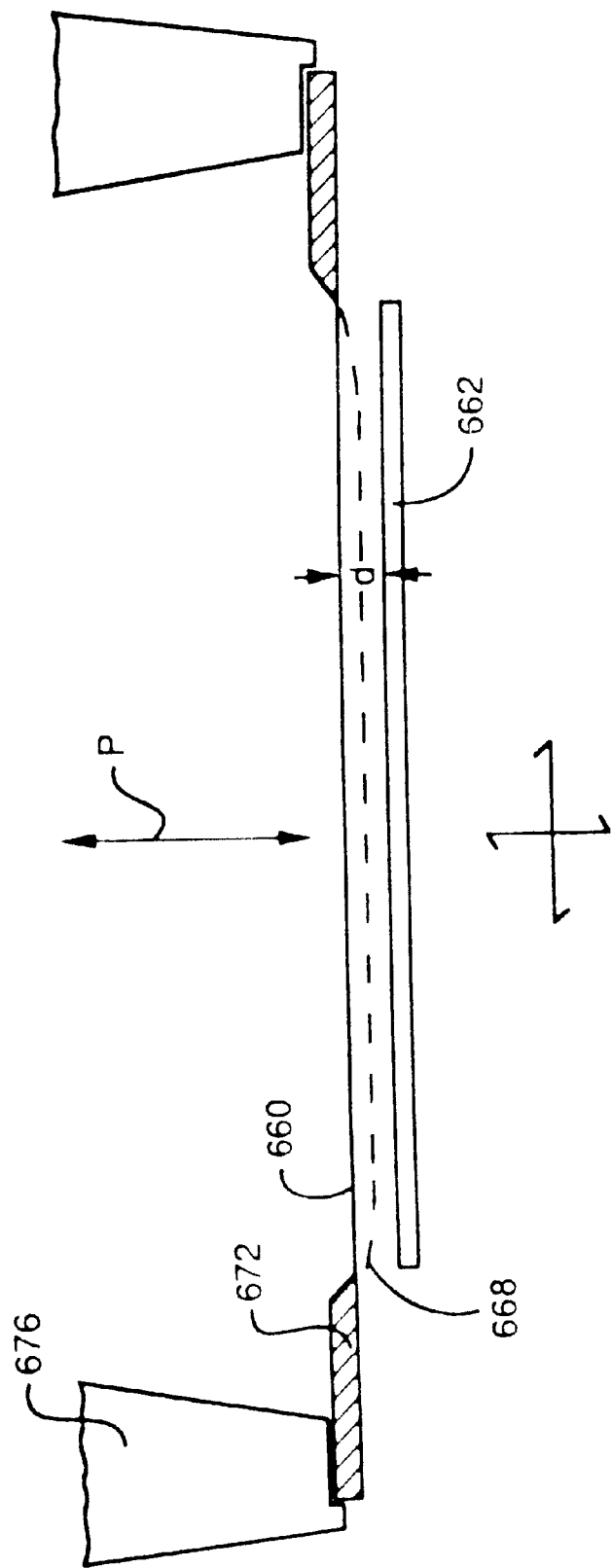
Fig_30

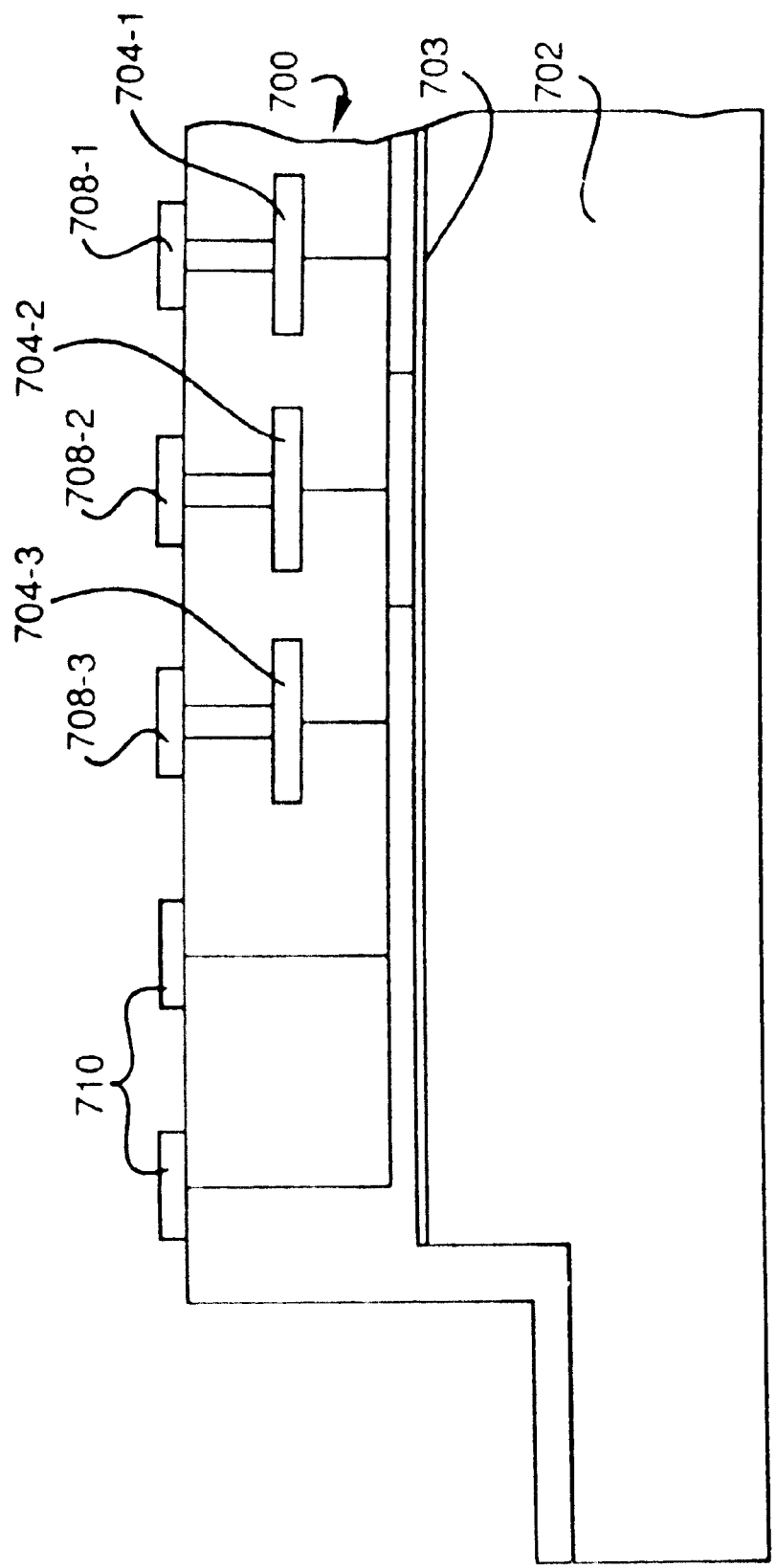
Fig_31a

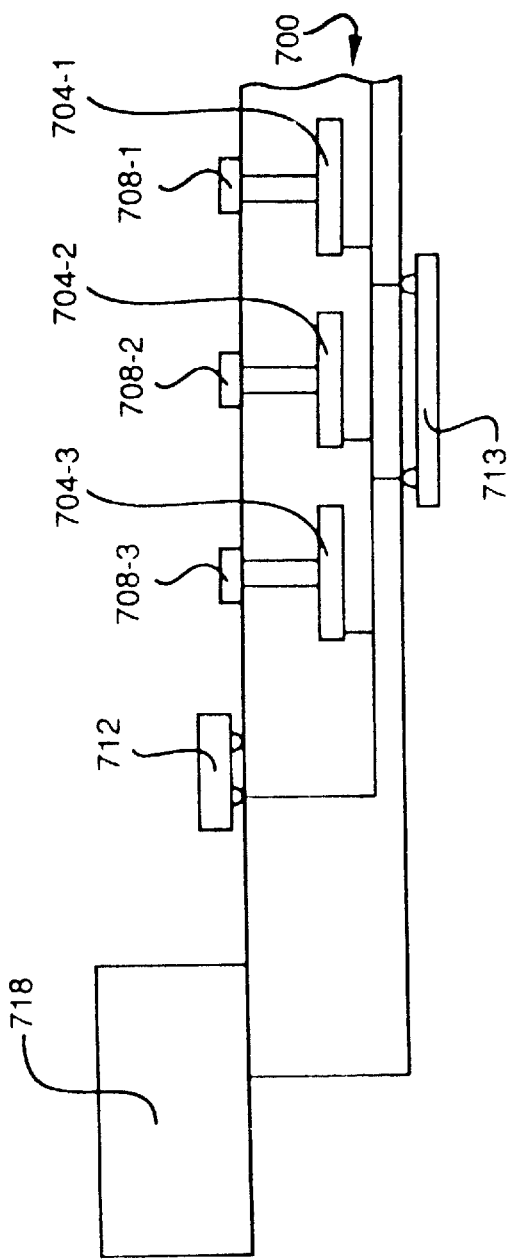
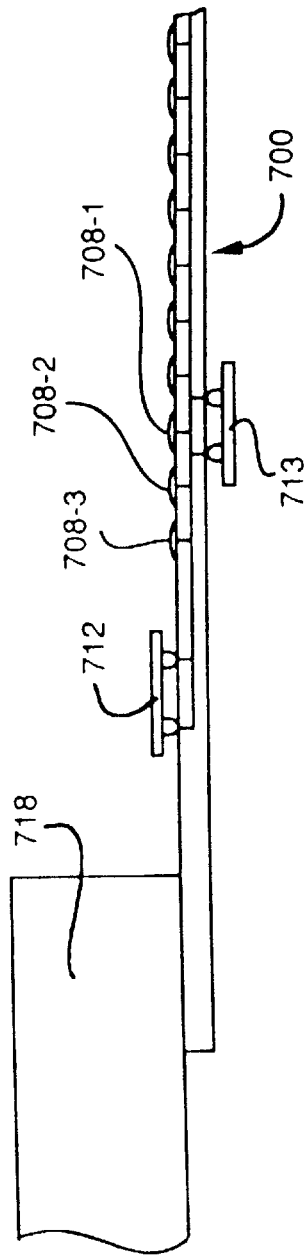
Fig_31b
Fig_31c

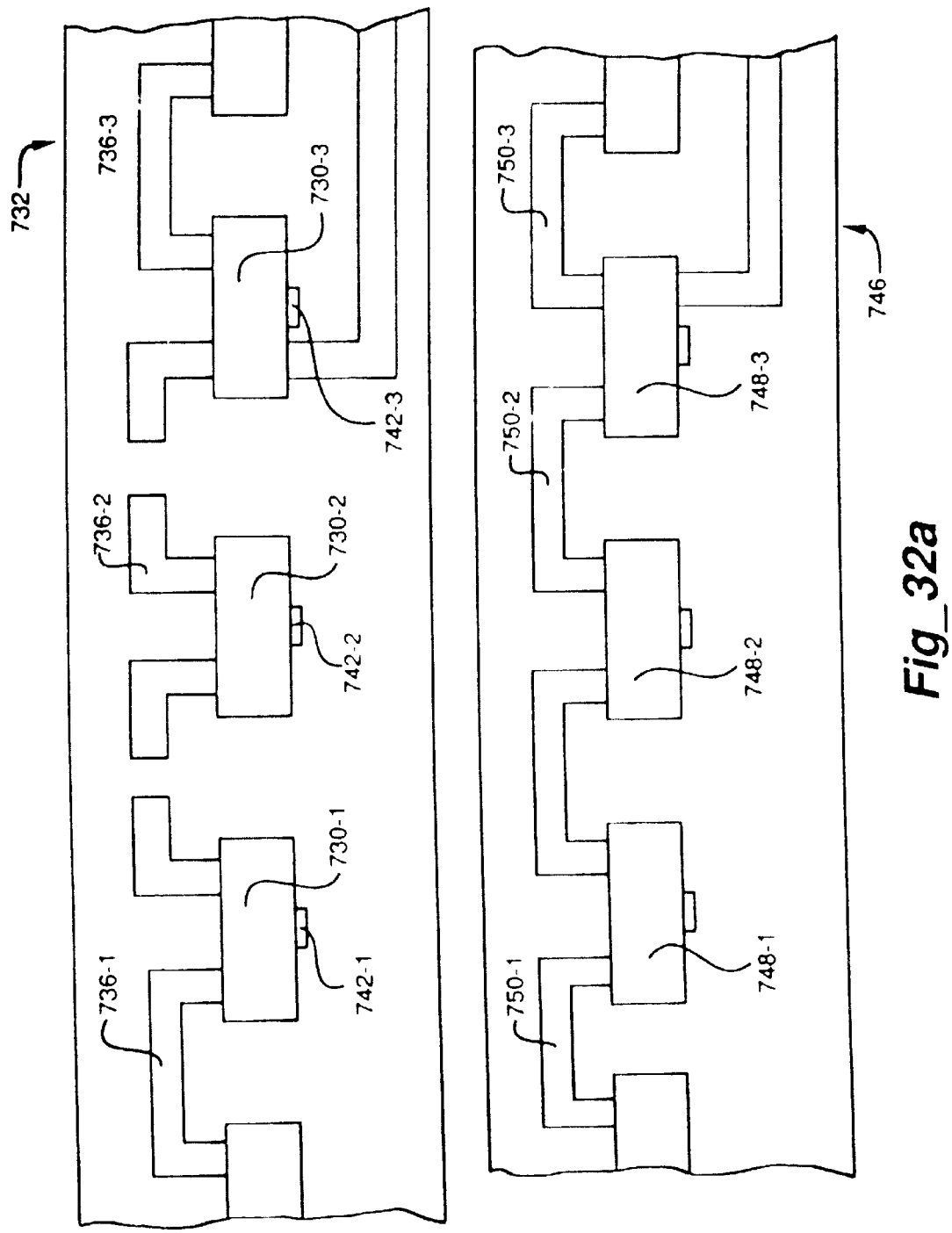
Fig_32a

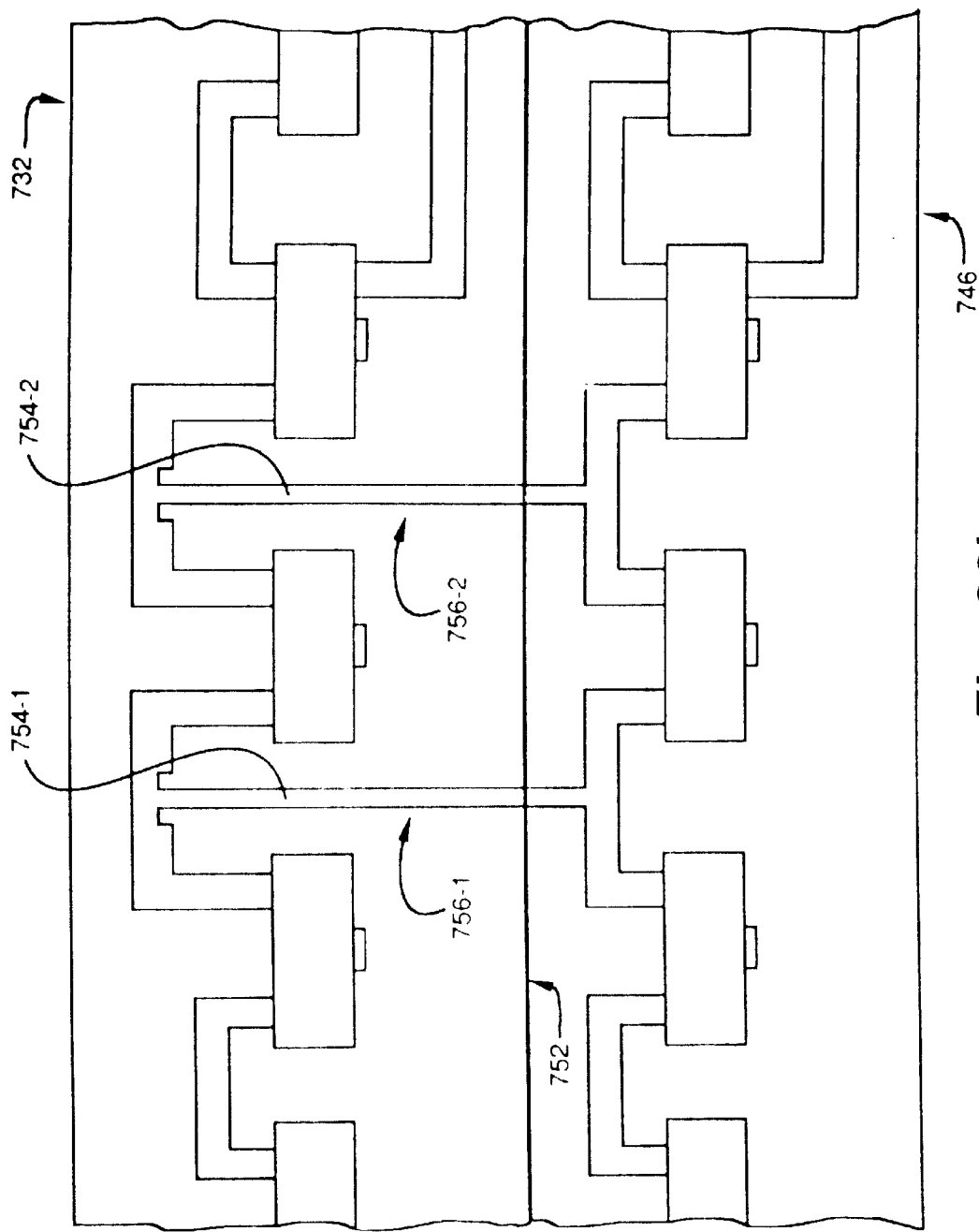
Fig_32b

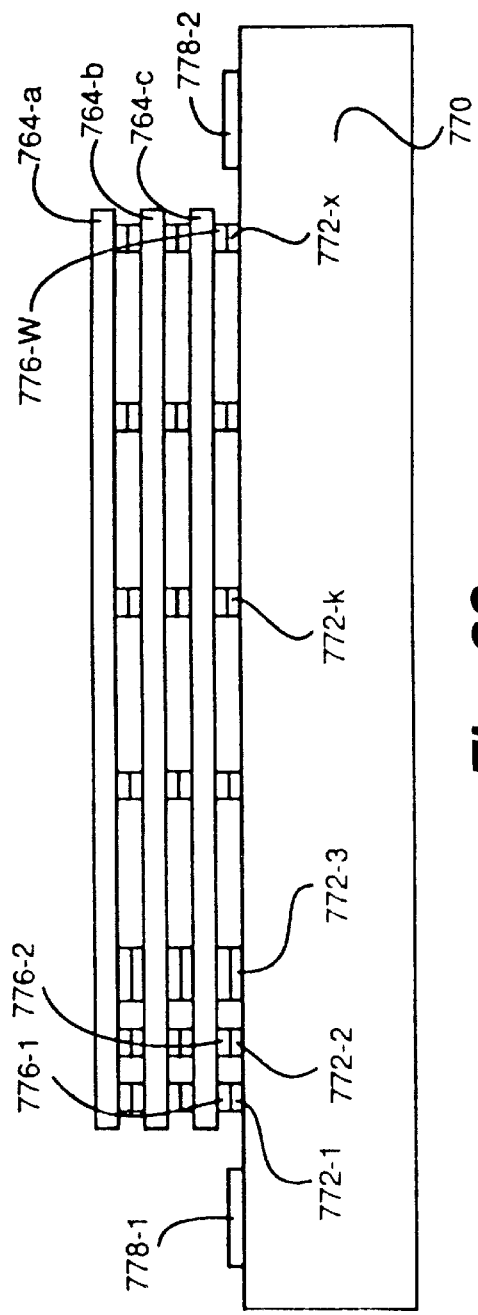
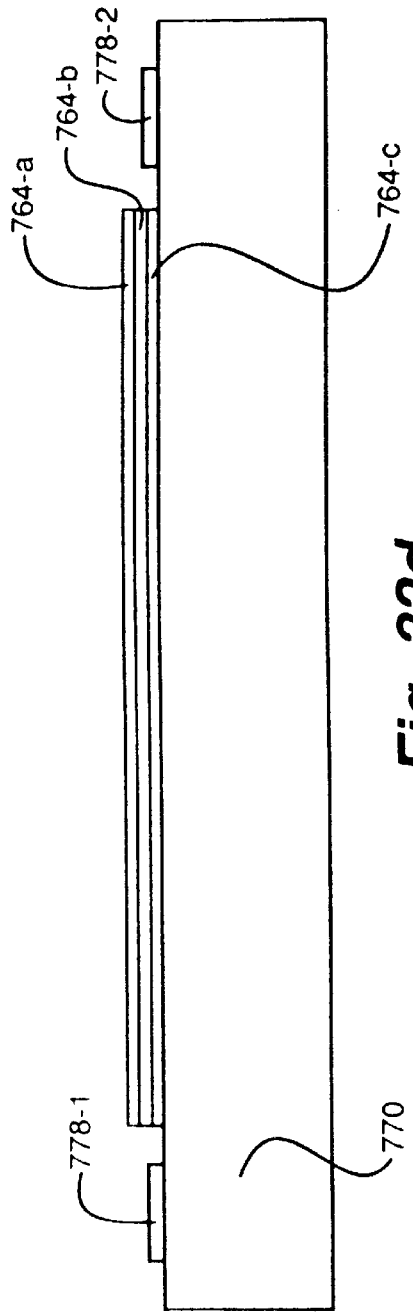

MEMBRANE DIELECTRIC ISOLATION IC FABRICATION

This is a continuation of Ser. No. 08/315,905, filed on Sep. 30, 1994, now U.S. Pat. No. 5,869,354 which is a divisional of application Ser. No. 07/865,412, filed Apr. 8, 1992, U.S. Pat. No. 5,354,695.

BACKGROUND OF THE INVENTION

1. Field of the Invention

This invention relates to methods for fabricating integrated circuits on and in flexible membranes, and to structures fabricated using such methods.

2. Description of Related Art

Mechanically and thermally durable free standing dielectric and semiconductor membranes have been disclosed with thicknesses of less than 2 $\mu$m. (See commonly invented U.S. Pat. No. 4,924,589, and U.S. patent application Ser. No. 07/482,135, filed Feb. 16, 1990, now U.S. Pat. No. 5,103,557, both incorporated herein by reference). This disclosure combines the novel use of these technologies and other integrated circuit (IC) processing techniques to form ICs as membranes typically less than 8 $\mu$m thick. This approach to IC fabrication falls under the generic industry-established title known as Dielectric Isolation (DI), and is inclusive of subject areas such as Silicon-on-Insulator (SOI) and Silicon-on-Sapphire (SOS). ICs formed from dielectric and semiconductor membranes can reduce significantly the number and complexity of processing steps presently used to provide complete IC device isolation; dielectric isolation techniques that provide dielectric isolation on all surfaces of the individual circuit devices comprising the complete IC are not as yet widely used in volume IC fabrication. Integrated Circuits are defined as commonly understood today when referring to SSI, MSI, LSI, VLSI, ULSI, etc. levels of circuit complexity.

SUMMARY OF THE INVENTION

This invention is directed to a general method for the fabrication of integrated circuits and interconnect metallization structures from membranes of dielectric and semiconductor materials. The fabrication technology in accordance with this invention is referred to herein as Membrane Dielectric Isolation (MDI), and the circuits made from it as circuit membranes. The novel use of materials and processing techniques provides for the fabrication of high temperature, mechanically durable, large area free standing membranes (greater than 1 square cm in area) from low stress dielectric and/or semiconductor films. These membranes permit the application (continued use) of most of the established integrated processing methods for the fabrication of circuit devices and interconnect metallization.

In accordance with the invention, an integrated circuit is formed on a tensile low stress dielectric membrane comprised of one layer or a partial layer of semiconductor material in which are formed circuit devices and several layers of dielectric and interconnect metallization. Also, a structure in accordance with the invention is a tensile membrane of semiconductor material in which are formed circuit devices with multiple layers of tensile low stress dielectric and metallization interconnect on either side of the semiconductor membrane.

The membrane structure is a processing or manufacturing structure for enabling the manufacture of novel and more cost effective integrated circuits. This is in addition to an objective to manufacture an integrated circuit, or portion thereof, in a membrane or thin film form.

The general categories of circuit membranes that can be made by this invention are:

1. Large scale dielectric isolated integrated circuits formed on or from semiconductor or non-semiconductor substrates.

2. Multi-layer interconnect metallization circuits formed on or from semiconductor or non-semiconductor substrates.

The primary objectives of the MDI fabrication technology disclosed herein are the cost effective manufacture of high performance, high density integrated circuits and integrated circuit interconnect with the elimination or reduction of detrimental electrical effects on the operation of individual circuit devices (e.g. diodes, transistors, etc.) by completely isolating with a dielectric material each such circuit device from the common substrate upon which they are initially fabricated, and therefore, from each other, and to provide a more versatile and efficient physical form factor for the application of integrate circuits. Some of the benefits of the MDI IC fabrication process are the elimination or reduction of substrate current leakage, capacitive coupling and parasitic transistor effects between adjoining circuit devices. The MDI IC fabrication process benefits extend to several other categories of IC fabrication such as lower IC processing costs due to fewer IC isolation processing steps, greater IC transistor densities through the capability to use established IC processing techniques to fabricate interconnect metallization on both sides of a MDI IC circuit membrane, and greater IC performance through novel transistor structures.

The strength of the MDI processes is primarily drawn from two areas:

(1) The ability to make a large area flexible thin film free standing dielectric membrane, typically framed or suspended or constrained at its edges by a substrate frame or ring, or bonded frame or ring. This membrane is able to withstand a wide range of IC processing techniques and processing temperatures (of at least 400° C.) without noticeable deficiency in performance. The present dielectric materials that meet these requirements are silicon dioxide and silicon nitride films when prepared with specific low stress film deposition recipes for instance on equipment supplied by Novellus Systems, Inc. Dielectric free standing films created by CVD process methods such as silicon carbide, boron nitride, boron carbon nitride aluminum oxide, aluminum nitride, tantalum pentoxide, germanium nitride, calcium fluoride, and diamond have been produced, and can potentially be used as one of the dielectric materials in a MDI circuit membrane when deposited at an appropriate level of surface stress. Advances in the technology for making low stress dielectric films will likely produce additional free standing films that can be used as described herein.

(2) The ability to form a uniform thin film single crystal semiconductor substrate either as the primary substrate of semiconductor devices or as a carrier substrate upon which semiconductor devices could be grown epitaxially. Several methods toward this end are disclosed herein, and other techniques which are modifications thereof exist. Further, in certain applications polycrystalline semiconductor membranes such as polysilicon can be used in substitution for monocrystalline material.

It is the combination of the use of low stress free standing dielectric films with the appropriate processing qualities and membrane or thin film single crystalline (monocrystalline), polycrystalline or amorphous semiconductor substrate formation that provides much of the advantage of the MDI IC fabrication process. The following methods are encompassed within the present disclosure:

1. Methods for the fabrication of low stress free standing (thin film) dielectric membranes that encapsulate each semiconductor device that comprises an IC.
2. Methods for the formation of uniform thickness semiconductor membrane (thin film) substrates for use in combination with low stress dielectric materials.
3. Methods for the fabrication of semiconductor devices within and on a dielectric membrane that comprises a circuit membrane.
4. Methods for the formation of interconnect metallization structures within and on a dielectric membrane that comprises a circuit membrane.

The MDI circuit fabrication process in one embodiment starts with a semiconductor wafer substrate, and results in an IC in the form of a circuit membrane where each transistor or semiconductor device (SD) in the IC has complete dielectric isolation from every other such semiconductor device in the IC. Only interconnect at the specific electrode contact sites of the semiconductor devices provides electrical continuity between the semiconductor devices. The primary feature of the MDI process is complete electrical isolation of all semiconductor devices of an IC from all of the intervening semiconductor substrate on which or in which they were initially formed and to do so at lower cost and process complexity than existing bulk IC processing methods. Other features of the MDI process are vertical electrode contact (backside interconnect metallization), confined lateral selective epitaxial growth, non-symmetric dopant profiles, and the use of a MDI circuit membrane to serve as a conformal or projection mask for lithography processing. Even if the initial substrate with which MDI processing begins with is the most commonly used semiconductor silicon, the resulting IC need not be composed of silicon-based devices, but could be of any semiconductor device material such as GaAs, InP, HgCdTe, InSb or a combination of technologies such as silicon and GaAs grown on a silicon substrate through epitaxial means. Silicon is an inexpensive and well understood semiconductor substrate material with superior mechanical handling properties relative to most other presently established semiconductor materials. The MDI process is not limited to starting with a silicon substrate and the process definition of MDI is not dependent on use of silicon; however, there are presently clear advantages to using silicon as a starting semiconductor substrate, and the chief embodiment disclosed herein of MDI uses a starting semiconductor substrate material of silicon.

The benefits to fabricating an IC with the MDI process are significant over prior art methods, some of these benefits being:

1. Complete electrical isolation of semiconductor devices.
2. Vertical semiconductor device structures.
3. Lower processing costs through lower processing complexity or fewer device isolation processing steps.
4. Conformal mask lithography through the membrane substrate.
5. Control of depth of focus during lithography exposure due to control of substrate thickness.
6. Application of interconnect metallization to both sides of the IC.
7. Through-membrane (substrate) interconnect metallization routing.
8. Three dimensional IC structures through the bonding of circuit membrane IC layers.
9. Efficient conductive or radiant cooling of IC components of circuit membrane.
10. Direct optical (laser) based communication between parallel positioned membrane ICs.
11. Higher performance ICs.
12. Vertical semiconductor device structure formation.
13. Novel selective epitaxial device formation.

In some semiconductor technologies it is not necessary to have complete isolation between each transistor or semiconductor device, such as certain applications using polycrystalline or amorphous TFTs (thin film transistors). This is not a limitation on the MDI process, because semiconductor device side wall isolation is an option in the MDI process. What is novel is that the MDI process provides general methods by which thin films or membranes of dielectric and semiconductor materials can be formed into a free standing IC or circuit membrane.

BRIEF DESCRIPTION OF THE FIGURES

FIGS. 1*a* to 1*j* show a dielectric and semiconductor membrane substrate in cross-section.

FIG. 2 shows an etched silicon substrate membrane in cross-section.

FIGS. 3*a*, 3*b* show dielectric membranes with semiconductor devices.

FIG. 4 shows an alignment mark of a circuit membrane in cross-section.

FIG. 5 shows support structures for a membrane structure isolation structure.

FIG. 6*a* to 6*i* show a circuit membrane Air Tunnel structure.

FIG. 7 shows stacked circuit membranes with optical input/output.

FIG. 8 shows a three dimensional circuit membrane.

FIGS. 9*a* to 9*j* show fabrication of a MOSFET in a membrane.

FIGS. 10*a* to 10*d* show fabrication of a transistor by lateral epitaxial growth on a membrane.

FIGS. 11*a* to 11*f* show vertical MOSFET and bipolar transistors formed on a membrane.

FIG. 12*a* to 12*g* show transistor fabrication on a membrane using confined laterally doped epitaxy.

FIGS. 12*h* to 12*j* show cross-sections of selective epitaxial growth on a membrane.

FIGS. 13*a* to 13*d* show cross-sections of multi-chip modules.

FIG. 14 shows a cross-section of a membrane formed on a reusable substrate.

FIG. 15 shows a cross-section of the membrane of FIG. 14 with a support frame attached.

FIGS. 16*a*, 16*b* show multi-chip modules in packages.

FIGS. 17*a* to 17*c* show soldering of bond pads of a circuit membrane to a die.

FIG. 18 shows bond pads on a die.

FIGS. 19*a*, 19*b* show bonding and de-bonding of a die to a circuit membrane.

FIGS. 20, 21 show two sides of a circuit membrane.

FIGS. 22*a* to 22*c* show formation of a metal trace in a circuit membrane by a lift-off process.

FIGS. 23*a*, 23*b* show use of a buried etch stop layer to form a circuit membrane having a thinner inner portion.

FIGS. 24, 25 show a source-integrated light valve for direct write lithography.

FIGS. 26, 27 are cross-sections of X-ray sources for the device of FIGS. 24, 25.

FIGS. 28a to 28b show a coil for the device of FIG. 24.

FIGS. 29a to 29k show portions of a source-external radiation valve for direct write lithography device.

FIGS. 29l to 29p show use of fixed freestanding membrane lithography masks.

FIG. 30 shows a cross-section of a lithographic tool.

FIGS. 31a to 31c show cross-sections of a display formed on a membrane.

FIGS. 32a, 32b show bonding of two circuit membranes.

DETAILED DESCRIPTION OF THE INVENTION

The MDI process is the formation of an IC or interconnect metallization circuit as a free standing dielectric and/or semiconductor circuit membrane. Each semiconductor device comprising an IC circuit membrane is a semiconductor device optionally isolated from adjoining semiconductor devices, and where each semiconductor device is formed on or in a membrane of semiconductor material typically less than 8 $\mu$m in thickness. The overall thickness of a circuit membrane is typically less than 50 $\mu$m and preferably less than 8 $\mu$m. The dielectric membrane is compatible with most higher temperature IC processing techniques.

MDI Fabrication Process

Several process variations can be used to form the thin film or membrane of semiconductor material for use in the MDI process. Additional related methods for forming semiconductor membranes may exist or come into existence and are included in the MDI technology.

Examples of some of the methods that can be used for forming silicon single crystal thin films are:

1. Heavily boron doped (typically greater than $10^{18}$ atoms/cm$^2$) etch stop layer (formed by diffusion, implant or epitaxy) with optional epitaxial SiGe (less than 20% Ge) anti-autodoping overlayer layer and optional epitaxial layer.

2. O$_2$ (oxide) and N$_2$ (Nitride) implant etch stop barrier layer. Implant concentrations are typically between 10 to 100 times less for formation of an etch stop barrier layer than that required to form a buried oxide or nitride dielectric isolation layer as presently done with a standard thickness silicon substrate.

3. Buried oxide etch stop barrier layer formed from a porous silicon layer.

4. High precision double sided polished substrate and masked timed chemical etch back of back-side.

5. Electro-chemical etch stop.

6. Buried etch stop layer formation through anodic or thermal wafer bonding in combination with precision substrate polishing and chemical etching.

There are many established methods for forming thin semiconductor substrates or membranes. The MDI process requires that the semiconductor membrane forming process (thinning process) produce a highly uniform membrane typically less than 2 $\mu$m thick and that the surface tension of the semiconductor membrane be in low tensile stress. If the membrane is not in tensile stress, but in compressive stress, surface flatness and membrane structural integrity will in many cases be inadequate for subsequent device fabrication steps or the ability to form a sufficiently durable free standing membrane.

The use of highly doped layers on the surface or near the surface of the substrate formed by diffusion, implant or epitaxial means is an established method for forming a barrier etch stop layer. A heavily doped boron layer will etch 10 to 100 times slower than the rest of the substrate. However, if it is to form an effective uniform membrane surface, autodoping to the lower substrate and to the upper device layer must be prevented or minimized. This is accomplished in one method by epitaxially growing a SiGe layer of less than 4000 Å (1 Å=$10^{-10}$m) and less than 25% Ge on either side of the barrier etch stop. The SiGe layers and the barrier etch stop layers are subsequently removed after formation of the membrane in order to complete device dielectric isolation.

The MDI process for forming a dielectric membrane requires that the dielectric material be deposited in net surface tensile stress and that the tensile surface stress level be 2 to 100 times less than the fracture strength of the dielectric. Consideration is also given to matching the coefficient of thermal expansion of the semiconductor material and the various dielectric materials being used in order to minimize the extrinsic net surface stress of the membrane. Thermally formed silicon dioxide forms as a strongly compressive film and most deposited dielectrics currently in use form typically with compressive surface stress. High temperature silicon dioxide and silicon nitride dielectric deposited films with tensile surface stress levels 100 times less than their fracture strength have been demonstrated as large area free standing membranes consistent with the requirements of the MDI process.

It is not a requirement of the MDI process that if a semiconductor material is used in the fabrication of a circuit membrane, that the semiconductor material be capable of forming a free standing membrane. The dielectric materials that are optionally used to isolate any semiconductor devices in the circuit membrane can provide the primary structural means of the resulting circuit membrane as implied by the general fabrication methods presented below.

The ability to form large durable temperature tolerant low tensile stress films of both semiconductor and dielectric materials as components or layers of a substrate for the fabrication of integrated circuits and interconnect structures is unique to the MDI process. The large free standing semiconductor and dielectric membrane substrates of the MDI process provide unique structural advantages to lower the cost and complexity of circuit fabrication and enhance the performance of circuit operation.

The MDI process can be broadly described as two methods, depending on which method of forming the semiconductor substrate thin film is selected. The sequence of steps of the two process methods presented below may be utilized in a different order depending on processing efficiencies. Formation of polysilicon or a-Si (amorphous silicon) circuit devices on a dielectric membrane without the starting use of a semiconductor substrate is disclosed below, but is not categorized as a method.

Method #1

1. Implant, diffuse, or epitaxially grow an etch barrier layer in over the silicon substrate.

2. Optionally grow the desired epitaxial device layers.

3. optionally trench isolate the semiconductor device areas.

4. Complete all desired IC processing steps including deposition of a low stress dielectric membrane.

5. Form a dielectric and semiconductor substrate membrane by selectively etching the back side of the substrate to a barrier layer or to a controlled substrate residual.

6. Complete the IC processing steps on the back side of the substrate and remaining top side of the substrate, and optionally trench isolate the semiconductor devices if not done in step 3.

Method #1 fabricates the desired semiconductor devices of an IC on a standard thickness semiconductor substrate 10 prior to the deposition of the low stress dielectric membrane and release of membrane structure 14 by etching the back side of the substrate. (FIG. 1a shows in cross-sections the substrate 10 after back side etching.) These semiconductor devices will typically be trench isolated (see below) through or below the active area layer of each semiconductor device.

The semiconductor devices will typically be fabricated from vapor phase epitaxial depositions. Well known epitaxial fabrication methods such as SEG (Selective Epitaxial Growth), ELO (Epitaxial Lateral Overgrowth), MOCVD (Metal-Organic Chemical Vapor Deposition) or MBE (Molecular Beam Epitaxy) may be employed.

In the embodiment of FIG. 1a an etch stop barrier layer 12 is implanted just beneath the surface of the silicon substrate 10. This is shown in FIG. 1b, which is an expanded view of a portion of substrate 10 prior to the backside etching step. Portion 11 of substrate 10 is to be removed. This barrier etch stop layer 12 may be an oxide layer produced in a manner similar to the well known SIMOX technique or an implanted silicon nitride layer; however, the thickness of the buried oxide or nitride layer required for MDI processing is significantly less than that required to achieve device dielectric isolation for a silicon substrate which is the general application for such implant technology. (The term SIMOX (Separation by IMplanted OXygen) is a general reference for the dielectric isolation process of forming a buried layer of $SiO_2$ in a bulk silicon substrate by oxygen implant.) The purpose of layer 12 is to induce minimum damage to the crystalline surface of the substrate 10 which would degrade subsequent semiconductor device processing, while providing a uniform substrate (silicon) preferential back side etch stop just beneath the surface of the substrate. The barrier etch stop layer 12 can be made at a well controlled thickness and acts as an end point when the silicon substrate 10 is selectively etched from the back side 14 (see FIG. 1a) as part of the processing in forming the low stress dielectric and (optionally) semiconductor circuit membrane. The barrier etch stop 12 as shown in FIG. 1b does not extend to the edge of the substrate. It is not restricted from extending to the edge of the substrate (wafer), but it must extend beyond that portion 11 of the substrate 10 that will be removed during the formation of the membrane structure.

The original substrate upon which the MDI circuit membrane is formed serves as retaining frame (or ring) 18 for the MDI circuit membrane after the backside of the substrate is etched. The backside etch of the substrate leaves the frame 18 of the substrate to hold the resulting circuit membrane. The width of frame 18 is sufficient to prevent the surface forces of the circuit membrane from causing the frame to crack. A width typically of less than 400 mils (1 cm) is sufficient. This is done by growing thermal oxide and or depositing a film typically of silicon nitride (about 5,000 Å to 7,500 Å thick) on the backside 14 of the substrate and then etching a window or opening in dielectric layer the size and shape of the desired circuit membrane. The substrate is then etched through dielectric window or dielectric mask. The shape of the backside window opening (or dielectric mask) is typically rectangular, although it can vary in shape.

The barrier etch stop layer 12 is then selectively etched to leave only the original surface 10 layer of the silicon substrate. A barrier etch stop layer could also be formed on the surface of the silicon substrate if the layer preserves sufficient crystalline structure required for subsequent epitaxial processing, surface stress (typically less than $10^8$ dynes/cm² tensile) and there is a selective etch procedure for the silicon substrate versus the barrier etch stop layer, and if need be, the applied barrier etch stop layer can subsequently be removed. The backside 14 is etched away by TMAH (tetra-methyl ammonia hydroxide) or other appropriate selective silicon etchant (see below). FIG. 1c shows formation of the semiconductor devices 24, 26, 28 in the semiconductor substrate after backside substrate etch to a buried etch stop layer, dielectric deposition, and selective removal of the barrier etch stop. Trenches 25, 27, 29 are cut into the substrate 10 prior to deposition of the low stress dielectric membrane 20, which also serves as an isolation dielectric between adjacent semiconductor devices 24, 26, 28.

An alternative technique to trench isolation as suggested by either steps 3 or 6 of Method #1 in order to laterally isolate transistor devices of the circuit membrane is to use the well known LOCOS (LOCal Oxidation of Silicon) isolation method. LOCOS could be applied as part of the processing of step 6 (process steps 4 or 5 in Method #2 below) as shown in FIGS. 1d and 1e. FIG. 1d shows in cross-section several transistors 11a, 11b, 11c of a circuit membrane 20 with semiconductor layer 20b, interconnect metallization 20c, low stress dielectric membrane 20d, and with completed topside device processing and a backside deposited low stress silicon nitride mask 13 patterned with openings 15a, 15b between transistors. Subsequent thermal oxidation 17a, 17b of the thin silicon device substrate layer underneath the openings in the nitride mask 13, as shown in FIG. 1e, laterally isolates the transistors 11a, 11b, 11c and results in complete dielectric isolation of the circuit membrane transistors 11a, 11b, 11c.

The thermal oxide isolation created by the LOCOS method may change the net tensile surface stress of the semiconductor (substrate) membrane layer. The deposition of low stress dielectric films on either side of the semiconductor layer prior to LOCOS processing will offset most compressive effects of the oxide formation. Device isolation by the LOCOS process when applied to a MDI circuit membrane is more effective than current bulk processing because of the shallow depth of the semiconductor substrate layer. This also allows near optimum density of the circuit devices with respect to minimum device isolation separation. The easy incorporation of LOCOS into the MDI processing methods also is an indication of the general compatibility of the MDI process with existing IC fabrication techniques.

The remaining substrate 10 (see FIG. 1f) is then (optionally) bonded at its edges to a bonding frame or ring 19 (which is typically of glass, quartz or metal and about 25 to 100 mills thick) by conventional anodic, fusion (thermal) or epoxy bonding techniques. In this case the substrate frame 18 may be removed (see FIG. 1g). The bonding frame or ring 19 is not required for processing MDI; the original substrate 10 (which is backside etched) performs this function initially.

An alternative to forming a barrier etch stop layer is to polish the silicon wafer 10 on both sides to a thickness uniformity specification such that when the substrate is selectively time etched from the back side, the etch can be stopped prior to reaching the dielectric membrane 20 and will leave an acceptably uniform thickness for the active device substrate. This method is mechanically difficult in that it requires the wafer to be exactingly polished on both sides to achieve the uniform thickness.

The dielectric membrane 20, 36 is formed as part of the interconnect metallization dielectric and as a layer over the two-sided interconnect metallization 35 as shown in FIGS. 3a and 3b. (FIG. 3b is an enlarged view of the portion of FIG. 3a referenced as "3b".) The thickness of the dielectric membrane 20, 36 may vary from less than 2 μm to over 15 μm per layer of interconnect metallization layer 35. All blanket dielectric material covering the substrate has a low stress surface tension and is preferably in tensile stress.

Two sided interconnect metallization 35, with low stress dielectric material 36 (see FIG. 3b) used as the interconnect dielectric can be applied, or the back side of the circuit membrane can be passivated with low stress dielectric for a conventional one-side interconnect structure. The circuit membrane can withstand processing temperatures in excess of 400° C. which is required for further deposition of various low stress dielectric layers such as $SiO_2$ and $Si_xN_x$ and to achieve reliable low resistance junctions between semiconductor device electrode contacts and interconnect metallization. Depending on the specified composition and thickness of the dielectric and substrate membrane material, higher temperature processing steps can be performed such as may be required by implant activation annealing or epitaxial processing.

The alignment of lithography tools on the back side of the substrate is performed through the transparent dielectric material as shown in FIG. 4. The semiconductor substrate material 10a near the alignment mark 40 (which is nearly transparent in the visible portion of the spectrum at thicknesses less than 2 μm) can be etched away from the dielectric membrane 20 so that the lithography alignment marks 40 are more readily visible. Infrared alignment mechanisms are also available for back side alignment; silicon is transparent at infrared wavelengths. Lithography marks 40 for infrared alignment cannot be as small as those used in the visible spectrum due to the longer wavelengths of the infrared, typically greater than 6,000 Å.

Method #2

1. Form a free standing low stress semiconductor substrate membrane.
2. Optionally grow the desired epitaxial device layers.
3. Complete all desired top side IC processing steps including deposition of a low stress dielectric membrane.
4. Optionally trench isolate the semiconductor device areas from the back side.
5. Complete IC processing steps on the back side of substrate and remaining top side of substrate.

IC processing steps used on the top side and backside of the semiconductor membrane substrate are well known and not unique in application to the semiconductor substrate membrane; nearly any semiconductor process technique can be applied.

Method #2 fabricates a thin low stress semiconductor substrate membrane 20, such as the one shown in FIG. 2, prior to deposition of the low stress dielectric membrane and fabrication of semiconductor devices. This substrate membrane as shown in FIG. 2 can be formed through established selective electro-chemical etching techniques or by combination of wafer bonding, grinding and selective substrate etching techniques. The membrane preferably has a tensile stress of approximately $10^8$ dynes/cm$^2$. (This can be achieved in one manner by forming a layer with n-type dopant concentrations of $10^{16}$ to $10^{19}$ atoms/cm$^2$ and applying electrochemical etch techniques.) After the semiconductor substrate membrane 20 is fabricated (see FIG. 3a), semiconductor devices 24, 26, 28, . . . , 30 are fabricated and interconnected on the substrate 20 with the use of low stress dielectric material. The low stress dielectric membrane formed on the semiconductor substrate (along with interconnect metallization) becomes the only structural circuit membrane component after the semiconductor substrate portion of the membrane is etched or trenched into independent semiconductor devices. An additional layer (not shown) of low stress dielectric over the interconnect metallization may be applied for passivation and to increase the thickness of the resulting membrane 20 to achieve a specific desired level of durability.

The back side etch of the semiconductor substrate 14 (see FIG. 2) permits the under side of the semiconductor devices 24, . . . , 30 to be accessed and additional processing of the semiconductor devices performed. The processing options on the under side of the semiconductor devices 24, . . . , 30 are the same as those for Method #1; however, trench isolation (see FIG. 1c) of the semiconductor devices has not as yet been performed. Trench isolation is the etching of a separation space 25, 27, 29 (typically less than 2 μm wide) between semiconductor devices 24, 26, 28 on all sides of the semiconductor devices and is an established IC process technique. The space or trench 25, 27, 29 is then filled with dielectric. Trench isolation is novel as applied here, because the technique is being applied to a semiconductor membrane supported by a dielectric membrane. If trench isolation is desired, established masking and etching techniques can be applied to form trenches.

The uniformity of the semiconductor substrate thickness is important to the uniformity of the operating characteristics of the semiconductor devices of an IC, and to lithography processing steps. The above-described embodiments use etch stop techniques when selectively etching the semiconductor substrate material to form the desired substrate membrane thickness.

The interconnect circuit membrane can also be formed on a glass or quartz substrate 23 (typically less than 50 mils thick). In this case a tensile film 25 of polysilicon (as taught by L. E. Trimble and G. E. Celler in "Evaluation of polycrystalline silicon membranes on fused silica" J. Vac. Sci. Technology B7(6), Nov/Dec 1989) is deposited on both sides of the substrate 23, as shown in FIG. 1h. A MDI interconnect circuit membrane 27 is then formed on the polysilicon membrane 25, as shown in FIG. 1i. An opening 29 in the polysilicon 25 on the backside of the substrate 23 is made and the back of the substrate 23 is selectively etched leaving a free standing tensile polysilicon membrane 27 held in the frame 23b of the remaining substrate, as shown in FIG. 1j. The polysilicon 25 directly beneath the circuit membrane 27 can optionally be removed as also shown in FIG. 1j. A metal film (not shown) or other protective layer is deposited over the circuit membrane prior to etching the backside of the substrate to protect the circuit membrane from the substrate etchant. Considerations for using a non-semiconductor substrate in the fabrication of MDI interconnect circuit membrane are substrate material cost or application requirements. Examples of applications for this approach to membrane fabrication are masks for high resolution conformal contact lithographic printing and MCM (Multi-Chip Module) interconnect circuits.

Low Stress Silicon Dioxide and Silicon Nitride Deposition Recipes

Low stress dielectric membranes have been manufactured consistent with MDI requirements for low stress high temperature dielectric films. These membranes were produced on Novellus Systems, Inc. (San Jose, Calif.) Concept One dielectric deposition equipment, but are not limited to such equipment. Low stress is defined relative to the silicon dioxide and silicon nitride deposition made with the Novellus equipment as being less than $8\times10^8$ dynes/cm$^2$ (preferably $1\times10^7$ dynes/cm$^2$) in tension. Acceptable surface stress levels of different dielectrics made on various equipment may vary widely.

The following are two typical recipes used to produce the dielectric membranes of silicon dioxide or silicon nitride required by the MDI process. Variations of these recipes can be used to emphasize specific characteristics of the deposited dielectric membrane; these recipes are not the only recipes to achieve the requirements of the MDI process on the Novellus equipment and are not limitations on the MDI process. Small variations in the parameters of the recipes can produce changes in the material structure, etch rate, refractive index, surface stress, or other characteristics of the deposited dielectric material.

|  | Recipe #1<br>Silicon Dioxide | Recipe #2<br>Silicon Nitride |
| --- | --- | --- |
| Temperature | 400° C. | 400° C. |
| Pressure | 1.8 Torr | 2.3 Torr |
| HF RF Power | 640 watts | 220 watts |
| LF RF Power,<br>100 ohms | 160 watts | 180 watts |
| SiH$_4$ | 260 sccm | 0.23 slm |
| NH$_3$ | — | 2.00 slm |
| N$_2$ | 1150 sccm | 0.60 slm |
| N$_2$O | 6000 sccm | — |

Structurally Enhanced Low Stress Dielectric Circuit Membranes

FIG. 5 shows a structurally enhanced MDI circuit membrane structure. Structural enhancement of the MDI circuit membrane may prove necessary for various applications where stress is applied to the membrane as part of normal operation, such as in pressure sensing or in making contact test measurements as in IC wafer sort testing. A portion 44 of the dielectric membrane is deposited over the SD layer 24a with a thickness greater than 1 μm, and typically 10 to 25 μm. This thicker deposited layer 44 of the dielectric membrane is patterned with a mask and dry etched to achieve a honeycomb-like pattern of recesses 46a, 46b, 46c. The depth of these recesses 46a, 46b, 46c is approximately 75% of the thickness of the low stress dielectric 44 in which they are etched. Optional electrical contact 47 is provided and shown as an example of a circuit electrode. The dimensions of the opening of the recesses 46a, 46b, 46c are typically two or three times the depth dimension. A deposition of 1,000 Å of low stress CVD silicon nitride may optionally be applied to form a passivating seal.

MDI Air Tunnel Interconnect Structure

The impedance of metal conductors (traces) that make up the interconnect metallization between semiconductor devices and passive circuit elements such as capacitors or resistors must be given careful design consideration at operational frequencies in excess of 100 MHz. The dielectric constant of a dielectric (insulating) material is a primary determining factor when consideration is given to the use of the material. Polyimide materials conventionally used in the construction of interconnect structures have dielectric constants typically ranging between 2 and 3.5. The dielectric constants of CVD silicon dioxide and silicon nitride typically range upward from 3.5. The ideal dielectric is vacuum, gaseous or air with a dielectric constant of approximately unity. The fabrication of an interconnect structure that isolates the majority of a conductor's surface area with vacuum or gaseous dielectric results in a near optimum condition for high speed operation of that structure. Trace or conductor structures called "Air Bridges" are fabricated on the surface of an IC contacting the surface of the IC only periodically. This periodic contact provides mechanical support and or electrical contact with a low net dielectric constant of isolation. Air Bridges are conventionally used in the fabrication of microwave circuits; such circuits have operational frequencies in the GHz range.

FIGS. 6a, 6b and 6c show cross-sectional views of a conductor structure 50 internal to dielectric layer 52, 52a, but which has a gaseous primary surface dielectric contact with only periodic mechanical contact 50-a, 50-b, 50-c, like the conventional Air Bridge. The conductor 50 is held suspended in the gaseous dielectric without contacting the surrounding or enclosing solid material structures. FIG. 6d is a top view of a portion of a conductor or trace showing column supports (and/or via contacts) 50-a, 50-b, 50-c and dielectric support columns 52-a, 52-b. This interconnect structure is herein called an "Air Tunnel", and its method of fabrication is a direct extension of the methods used in the above-described fabrication of the MDI circuit membranes (dielectric and semiconductor membranes). Also shown in FIGS. 6a, 6b and 6c are dielectric membrane 56, semiconductor membrane 58, dielectric support column 52a, ground plane metallization 60, cavity 54 formed by etch removal of a-Si (amorphous silicon), and opening 62 for etch removal of all the a-Si. FIG. 6b is an end-on view of an alternate structure to FIG. 6a. FIG. 6b shows dielectric plug contact 68 to support (suspend) conductor 50. FIG. 6c shows an extension of the structure of FIG. 6a with a second layer of dielectric 70 and traces 72.

The Air Tunnel structure can be fabricated on any semiconductor substrate in addition to an MDI circuit membrane. The structural dielectric materials used are selected from the same group of low stress dielectrics used in the fabrication of the MDI circuit membranes discussed above. The fabrication method for the Air Tunnel provided here can also be extended to the gaseous dielectric isolation of semiconductor devices and passive circuit elements in a circuit membrane.

The Air Tunnel structure in one embodiment is fabricated with CVD processing techniques; alternatively, ECR (Electron-Cyclotron-Resonance) plasma CVD processing may soon provide an alternative deposition method. The gaseous dielectric separation of a conductor or a semiconductor device is accomplished by forming a sacrificial CVD film of a-Si, polysilicon or alternate material (typically dielectric material) that can be deposited by CVD means and selectively etched versus the other MDI circuit membrane material layers. Anticipating the use of Air Tunnel interconnect structures in the fabrication of a circuit membrane, semiconductor devices are isolated (passivated) by trench isolation of each device, and depositing a thin layer of oxide or nitride (typically less than 2,000 Å thick) over exposed device surfaces, and then depositing a film of a-Si. The thickness of the a-Si film and the width of the isolation trench are chosen such that the trench is plugged or filled evenly leaving the surface over the plug relatively planar. This plug technique is facilitated by CVD process technology which deposits films conformally on all interacting surfaces. Subsequent Air Tunnel interconnect structures are completed and the a-Si layers are removed by a silicon selective etchant; the etchant accesses the a-Si through the etch-vias as explained below.

The fabrication method of Air Tunnel interconnection is independent of the underlying substrate. The underlying substrate could be a MDI circuit membrane as shown in FIG. 6d (fabrication of which is disclosed above), a conventional IC substrate of semiconductor devices, a MCM circuit substrate, MDI tester surface membrane, etc.

The Air Tunnel fabrication process begins (see FIG. 6f) with the deposition of an a-Si film 76 onto a substrate 56 with electrodes to be interconnected. The a-Si film 76 is patterned with trenches and contact vias. A CVD processed metal film 50, typically tungsten (W), is deposited over the a-Si. The dimensions of the a-Si trenches and vias in the a-Si layer are consistent with forming planar plugs. The trenches in the a-Si 76, once plugged with the metal film 50, become the support columns 50-a, 50-b, 50-c of the conductor, see FIGS. 6a and 6d. The conductors deposited in the vias provide mechanical (column) support and electrical contact. The metal film 50 is patterned and a second CVD processed a-Si film 78 deposited over the metal film 50; a thin layer (not shown in FIG. 6a) of highly conductive metal like Au or Cu may be sputter deposited over the CVD metal (prior to the patterning of the metal film 50) to enhance conductivity of the conductor. The a-Si film 78 is patterned as shown in FIG. 6f, removing the a-Si film 78 from over the metal conductor 50 and forming a trench 80 along the edge of the conductor 50. This trench is plugged by a 3rd CVD layer 82 of a-Si, as shown in FIG. 6g. The patterning of the second a-Si layer 78 over the metal conductor 50 does not require a critical alignment; an alignment tolerance of +50% of the thickness of the second a-Si layer 78 is sufficient.

The resulting three films 76, 78, 82 of a-Si are relatively planar with minor surface features along the edges where conductors 50 are directly beneath. These surface features can be reduced by shallow thermal oxidation of the a-Si surface and subsequent stripping of the oxide (not shown).

An alternative method that can be used to planarize the a-Si and metal films is to spin coat a thick polymer over substrate 75, low stress dielectric 77, first a-Si layer 79, and second a-Si layer 81 after the application of the second a-Si film 81. (This a-Si film 81 is deposited in thickness equal to the combination of the former second and third a-Si films.) The polymer 85 used is selected to have a RIE rate nearly identical to the that of the a-Si film. The polymer 85 is completely removed and the etch of the a-Si is continued as desired, see FIGS. 6h and 6i.

The a-Si film stack is then patterned to form trenches that will become the supporting columns 50-a, 50-b, 50-c of an over layer of low stress dielectric. These support columns are typically placed in a non-continuous manner along conductors 50 (as shown in FIG. 6d), and periodically placed across open areas 51 where there are not conductors. The periodic and overlapping placement of the support columns (etch-vias) increase the ability of a-Si selective etchant to remove all deposited a-Si material. The thin metal film 60 (see FIG. 6a) of typically less than 5,000 Å thickness may optionally be deposited over the patterned a-Si prior to the deposition of the low stress dielectric film to act as a ground plane and EM (Electro-Magnetic) shield for the conductor 50. (This metal film remains in contact with the overlying low stress dielectric film after the a-Si has been removed.) A low stress dielectric film 52, 52a is deposited of typically 1–2 μm thickness over the patterned a-Si films. This low stress dielectric layer 52, 52a is patterned with trench openings 62 to the a-Si films. These trench openings are called etch-vias and provide access for a a-Si selective etchant like TMAH or ethylene diamine to remove all of the internal layers of a-Si films from each layer of interconnect without regard to the number of layers.

The etch-vias 62 in the dielectric are placed near dielectric support columns as shown in FIGS. 6c and 6d. The etch-vias 62 are placed on every interconnect layer and with sufficient frequency per layer to allow etchant to reach all lower layers of the Air Tunnel interconnect structure. After the etch-vias 62 are formed an additional interconnect layer 72, 80 (see FIG. 6c) can be formed by repeating the sequence of process steps as outlined below. When the Air Tunnel interconnect structure is used on a semiconductor membrane to form a circuit membrane (MDI process), it should be clear that the application of the Air Tunnel to both sides of the semiconductor membrane is a natural extension and not a special case application requiring a different processing sequence.

The etch-vias 62 serve as access ports for gaseous material (such as $N_2$ or air) which allow the effective circuit dielectrics to enter the circuit membrane. The etch-vias 62 also serve to maintain equalized pressure between the internal interconnect structure and the external environment of the surface of the circuit.

The following sequence of processing steps for fabricating an Air Tunnel assumes that the substrate being processed has an existing layer of low stress dielectric film on which to start:

1. Pattern dielectric for metal contact plug vias and etch-vias.
2. Deposit a film of a-Si; the thickness of this film will determine the lower separation distance of the tunnel conductor from the underlying low stress dielectric.
3. Pattern a-Si film for conductor support columns (vias to underlying dielectric).
4. Deposit metal conductor film.
5a. Pattern metal conductor film.
5b. Optionally deposit high conductivity metal film before patterning conductive film.
6a. Deposit a-Si film approximately the thickness of the metal film.
7a. Pattern a-Si film to expose conductor surfaces and trench etch along sides conductors.
8a. Deposit a-Si film to planarize the surface and separate the conductor from the overlying dielectric film.
9. Pattern a-Si film for dielectric support columns (vias to dielectric).
10. Optionally deposit ground/shield metal film.
11. Deposit low stress dielectric film.
12. Pattern dielectric with etch-vias or repeat from first step above.

Steps 6 through 8 from above can be replaced with the following alternative steps for forming a planarized conductor layer:

6b. Deposit a-Si film with a thickness equal to the thickness of the conductor and the desired separation over the conductor.
7b. Deposit planarizing polymer with a etch rate that is very similar to that of the a-Si film, as shown by FIG. 6h.
8b. RIE until all polymer material has been removed, as shown by FIG. 6i.

The principle attributes of the Air Tunnel are:
1. Low average dielectric constant (approaching unity).
2. Self planarization fabrication method.
3. Integral ground or EM shielding plane.
4. Application to one or both sides of a circuit membrane.
5. Application to MDI circuit membranes or standard wafer substrates.

A MOSFET device connected by Air Tunnels is shown in cross-section as an example in FIG. 6e. The transistor of FIG. 6e is formed from a semiconductor membrane and held suspended by the metal contacts to its electrodes with a gaseous dielectric separation on all remaining device surfaces. Shown in FIG. 6e are the active portion 84 (MOSFET) and the unused portion 86 of the semiconductor membrane, a thin nitride isolation film 88, mechanical conductor support 94, conductor trace 92, and additional air tunnel interconnect structures 92, 94, 96.

MDI Circuit Membrane Advantages

The fabrication of circuit membranes provides the capability to fabricate and use integrated circuits in novel ways such as:

1. Back side interconnect metallization, backside SD electrode contact, and through-the-dielectric membrane interconnect metallization signal routing. (See FIG. 3b).

2. The use of optical communication (see FIG. 7) in a vertically arrayed stack of MDI circuit membranes 150a, 150b, 150c with optical transmit and receive semiconductor devices on either side of the circuit membranes. Busing of data through a stack of several MDI circuit membranes 150a, 150b, 150c from any point on the surface of an IC rather than forming connections at the edge of ICs (which is currently the practice) simplifies the structure of the circuit. An external communication optical transceiver 152 is provided. MDI circuit membrane 150b includes a transparent window 154 through which optical transmissions from transmitters (laser diode arrays) 156 pass to optical receiver SDs 158. The stack of MDI circuit membranes is held together by support 160. The ability to use optical means rather than metal conductors to transmit information between ICs shortens the length of the communication path, increases the speed and bandwidth of the communication path, and lowers the power consumed compared to present metal connection methods.

The optical receiver of the MDI circuit membrane is typically less than 5,000 Å in thickness. A receiver of this thickness will absorb only a portion of the optical signal fluence striking it, the remainder of the fluence will pass through and out the opposite side of the receiver. This permits a second or third receiver to be positioned in the path of the optical transmitter to receive the same signal. The limiting conditions that determine the number of receivers that can be associated with one transmitter are the output fluence of the optical transmitter and the thickness of the transceiver substrate. This ability to optically transmit to several receivers simultaneously has the benefits of reducing circuit complexity (versus a transceiver structure at every circuit membrane interface) and performance (no transceiver (repeater) propagation delay).

3. The vertical bonding of two or more circuit membranes to form a three dimensional circuit structure, as shown in FIG. 8. Interconnection between the circuit membranes 160a, 160b, 160c including SDs 162, 164, 166 is by compression bonding of circuit membrane surface electrodes 168a, 168b, 168c, 168d (pads). Bonding 170 between MDI circuit membranes is achieved by aligning bond pads 168c, 168d (typically between 4 μm and 25 μm in diameter) on the surface of two MDI circuit membranes 160b, 160c and using a mechanical or gas pressure source to press the bond pads 168c, 168d together. If the pads 168c, 168d are solder, they can be heated to the melting point of the solder (typically less than 350° C.) causing the pads to weld to each other. If the pads are indium, tins or alloys of such metals, a bond 170 will form between the metal pads 168c, 168d with the application of approximately 100 p.s.i. pressure and an application temperature between 50° C. and 400° C., depending on the metal or alloy selected.

4. MDI Nanometer width gate MOSFET device fabrication methods. The ability to fabricate a MOSFET device with a gate region length of less than 0.5 μm (500 nm) presently requires lithograph tools with greater resolution capability than the current high volume optical stepper tools. Several methods are presented here for the fabrication of MOSFET with gate lengths of less than 500 nm and capable of gate lengths less than 25 nm. These methods take advantage of the MDI process to form transistor gate regions of less than 500 nm (0.5 μm) without lithographic means are described hereinafter.

5. Sensor diaphragms formed with integrated circuits fabricated on conventional rigid substrates.

6. Fabrication of electrically isolated semiconductor devices on both sides of the semiconductor layer of a circuit membrane.

V-Groove transistor Region Gate Formation Method

FIGS. 9a to 9e show a sequence of steps for forming a p-channel or n-channel (npn) transistor with an opposed gate electrode and a gate width of less than 25 nm (250 Å). The process steps (see FIG. 9a) assume a starting substrate of an MDI circuit membrane with approximately 0.5 to 1.5 μm wide isolated metal gate electrode 174 fabricated on the backside (opposed) of the transistor. This MDI circuit membrane consists of a lightly doped <100> crystalline silicon membrane layer 176 of thickness typically less than 2 μm and a 1 to 2 μm layer of low stress dielectric 178.

The sequence of process steps for one embodiment is:

1. Form lightly doped p and n wells. FIG. 9b shows one such well 180. This is done by depositing a nitride layer 182 over the silicon layer 176 of the MDI circuit membrane, patterning the well 180 and implanting the desired dopant.

2. Deposit dielectric 184 (see FIG. 9c) and pattern an opening 0.75 to 1.25 μm wide over the opposed gate area, but a known width.

3. Anisotropically etch along the <111> crystalline planes of the silicon to form a V-groove 186 of known depth and side angle of 54.7 degrees. This is done with a time rated etch.

4. Deposit by CVD equipment a metal layer 190 such as tungsten of 0.5 to 1.5 μm, but of known thickness, just closing the V-groove 186.

5. Etch back the metal layer 190 until a known thickness of metal plug remains in the V-groove 186. The width of the resulting transistor gate length is determined by the dimension of the remaining metal in the V-groove.

6. Strip the dielectric mask 184 in FIG. 9c.

7. Etch the silicon 180 surface to just expose the metal plug 190 opposed to the gate 174.

8. Deposit a dielectric layer and pattern for heavy implant doping 192 of transistor source and drain regions. This is done with n and p doping separately leaving a lightly doped gate channel region 194.

9. Strip the dielectric mask in FIG. 9e and etch the silicon 180 surface until it is below the level of the metal plug 190, causing its removal. (This step is optional, the metal plug can be selectively etch removed.)

10. Form trench 196 to isolate transistors to under the layer of low stress dielectric 178.

11. Anneal the active transistor implants 192.

12. Form source and drain contacts 198.

13. Anneal the source and drain contacts 198.

It should be clear that the opposed gate electrode which is much wider that the actual length of the gate width could have been fabricated on top of the transistor with the source and drain contacts, or after the gate region of the transistor was formed.

The reliable fabrication of the gate region 194 at a known length is dependent on etch rate control. Present etch rate techniques support the capability to form a gate region 194 length of less than 25 nm. A CVD dielectric could also be used as the gate implant mask instead of a metal plug 90. This gate fabrication method can also be done in bulk silicon and is not limited to the MDI process. It is important to note that the sub-micron resolution of the gate region was achieved without lithographic means capable of sub-micron resolution.

FIGS. 9f, g, h, i & j show the process sequence for substrate-imaged nonlithographic MOS transistor gate region or Bipolar emitter region formation. This process takes advantage of the novel ability of the MDI structure to accommodate process steps on either side of the membrane substrate. This process can form a minimum feature size of less than 100 nm and does so by the use of anisotropic etching epitaxial processes.

FIG. 9f shows a MDI substrate of semiconductor 189 and low stress dielectric 191 formed by one of the methods presented above. The dielectric layer 191 on one side has been patterned and the semiconductor layer 189 anisotropically etched through to the dielectric layer 193 on the opposite side. The thickness of the semiconductor layer 189 is selected to be less than 2 $\mu$m, and the dielectric layers 191, 193 are less than 1 $\mu$m thick each, though these dimensions can be scaled to achieve any transistor dimensions. The size of the patterned opening 195 in the dielectric is chosen such that the etched opening 197 onto the underlying surface of the dielectric is a desired width, less than 100 nm. Widths of any dimension can be created, however, widths of less than 100 nm are the primary objective of this process which cannot be achieved by optical means. The patterned dielectric 191 has a 1,000–2,000 Å layer 199 of low stress silicon nitride to provide high selectivity versus the opposed dielectric layer-during a subsequent RIE process step.

FIG. 9g shows an opening 197 formed through the dielectric layer 193 opposite the patterned layer 191. The anisotropically etched semiconductor layer 189 with its opening 197 onto the under side of the opposite side dielectric was used as a substrate-imaging mask, and the dielectric layer 193 was etched by RIE (dry) processing. This substrate-imaged opening 197 can be less than 100 nm in diameter and will become the gate region of a MOS transistor or the emitter region of a bipolar transistor. FIG. 9h shows the substrate-imaged region 197 closed by selective epitaxial growth 201; the epitaxial growth 201 can be formed with a graded dopant structure to lessen short channel effects. FIG. 9i shows the formation of a gate oxide 203 and electrode 205 after a planarization step of the self-imaged opening 197, CVD or thermal formed gate oxide and formation of gate electrode. It is important to note that the dielectric layer 193 in which the gate electrode 205 is formed is self-aligned to the gate region.

FIG. 9j shows the finished MOS transistor. The side opposite the gate electrode 205 is stripped of dielectric, planarized and etched to a thickness of less than 2,500 Å. It was then trenched 207 for source/drain isolation, a layer of low stress dielectric 209 deposited and source/drain electrodes 211, 213 formed.

It should be clear to some skilled in the art that a bipolar transistor can be formed with somewhat similar fabrication steps.

MDI Lateral Epitaxial Grown Transistor Gate Region Fabrication

FIGS. 10a, b, c, & d show a method for forming a MOSFET transistor with transistor gate region lengths of sub-micron dimensions, without the requirement for lithography tools with sub-micron CD resolution capability. This method is an extension of the above-described MDI process technology.

In FIG. 10a, the starting substrate structure is a combination silicon and dielectric 204 film forming a membrane 202. This membrane 202 is formed by one of the methods disclosed above. Subsequently, membrane 202 is patterned for the doping of the n+ and p+ transistor channels. FIG. 10a shows a cross-section of a MOS transistor channel (source 210, gate 208 and drain 206 regions) with a nitride mask 212 through which an anisotropically formed gate 208 trench is etched to the underlying dielectric membrane 204 in the location where the gate region of the transistor will be constructed. The exposed silicon sidewall 214 may be polished by a thin thermal oxidation and etch stripping or chemical techniques. FIG. 10b shows a top view of the structure of FIG. 10a, with the transistor channel 210, 208, 206 isolated from surrounding transistor devices by dielectrically filled trenches 216. These trenches 216 are fabricated prior to etching the gate region trench 208. The gate region trench 208 is then filled (see FIG. 10c) from both silicon sidewalls by lateral selective epitaxial growth of silicon 220 and with the same or similar doping concentration as the adjacent regions 210, 206; source and drain implant doping can also be used as a doping means prior to epitaxially growing the gate region. (In the case of CMOS devices, the n+ and p+ transistor channels are processed in two separate sequences of processing steps.)

The epitaxial growth process in the gate region trench 208 is stopped when the remaining separation distance "d" between the approaching silicon sidewalls 220 is equal to the desired gate region length. The doping concentration is changed for forming the actual gate region 222, and the epitaxial growth is continued until the gate region trench is closed, as shown in FIGS. 10c and 10d.

The width of the initial gate region trench 208 and the epitaxial growth rate can be controlled with an error of less than 5 nm. This allows the length d of the gate region to be determined by the precision with which the gate region trench 208 can be formed, the deposition rate control of the lateral epitaxial growth 220 and the capability to create the desired doping transitions. The result of this approach means that a gate region length d of 25 nm or less can be formed. This is far beyond the current optical lithographic methods which are presently expected to reach production capability of 120 nm by the end of the decade.

FIG. 10d shows the completion of the transistor with source and drain electrodes 226, 224, and an opposed gate electrode 230. The surface of the epitaxially grown gate region 222 is not smooth, but the backside of the gate region 222 is smooth, due to its formation against the underlying low stress dielectric membrane 204. The gate electrode 230 is more easily and reliably formed by patterning the underlying dielectric membrane 204 from its backside, thereby forming the opposed gate electrode 230. The backside of the gate region 222 is etched free of dielectric with an opening significantly larger than the length d of the epitaxially grown gate region 222; portions of the source 210 and drain 206 regions are also exposed with the gate region due to lithographic tool limitations. Gate oxide isolation 232 is thermally grown or deposited to the required thickness, and a metal or silicide electrode is formed 230.

The overlap of the gate electrode 230 over the source 210 and drain 206 regions of the transistor channel results undesirably in performance limiting capacitance. The reduction of the capacitance from the overlapping gate electrode structure can be achieved by either epitaxial graded doping of the source and drain regions at the interface to the gate region growth over the gate region, to form an extended gate region, or by offset of the gate electrode so that the source side edge of the electrode aligns approximately with the source/gate interface of the transistor channel. These methods are disclosed below. The above-described MOSFET transistor structure can be converted to a bipolar transistor structure as shown in FIG. 12g, also described below.

The MDI circuit membrane structure provides the capability to position electrode contacts of semiconductor devices at their backside (or opposed side). This provides significant savings in reduced processing steps to achieve device isolation and new transistor structures.

FIG. 11a shows a MDI circuit membrane (dielectric 240 and semiconductor 242 films) in cross-section on which additional semiconductor layers were formed epitaxially to achieve either an npn or pnp transistor structure 244. The epitaxial layer 244-a that corresponds to the gate region can be formed with a thickness of less than 25 nm. FIG. 11b shows the dielectric 240 and semiconductor 247, 244, 245 membrane after subsequent well known semiconductor processing steps which form a transistor channel 244 isolated on the dielectric membrane 240 with source 246, drain 248 and gate electrodes 250-a, 250-b attached. Also shown are source region 245 and drain region 247. The gate oxide isolation 251 is thermally grown or deposited, and gate contacts 250-a, 250-b can be formed on one or all sides of the transistor channel. Alternatively, a separate contact 250-b can be formed opposite the gate electrode 250-a, and used as a transistor bias contact. The opposed drain contact 248 is formed by etching a via in the dielectric membrane 240 underlying the transistor drain region 247.

FIG. 11c shows a bipolar transistor formed by a well known method but on a low stress dielectric membrane 254, and without the requirement to form a lateral conductive path (typically referred to as a buried layer). Formed in semiconductor film 256 are emitter 258, base 260, and collector 262 regions. The collector contact 264 is instead formed directly under the emitter 258. It should also be apparent that there are non-silicon semiconductor transistor structures that can be restructured with a backside contact as depicted in FIG. 11c, such as a GaAs Heterojunction Bipolar Transistor (HBT) or Ballistic Transistor.

The extension of the gate electrode 250-a beyond the gate region in the fabrication of the MOSFET transistor structure of FIG. 11b increases the parasitic capacitance of the transistor, and therefore, adversely affect its performance. This capacitance can be reduced by the separate or combined use of several methods referred to as Graded Gate Doping (GGD), Epitaxially Extended Gate (EEG) and Gate Electrode Offset (GEO).

The Graded Gate Doping is shown in FIG. 11b. This method varies the doping levels of the source 245 and drain regions 247 at their respective interfaces to the gate region. This directly decreases the effective dielectric constant of the semiconductor under the dielectric isolation 251 separating the gate electrode from the source 245 and drain 247 regions it overlaps.

The Epitaxially Extended Gate 244-b (see FIG. 11d) is formed by selective epitaxial growth of the gate region 244-b over the surface of the transistor upon which the gate oxide 251 and gate electrode 250-a will be fabricated. This method, more directly than the GGD method of FIG. 11b, lowers the capacitance of the semiconductor region directly under the gate electrode 250-a where it overlaps the source 245 and drain 247 regions. The transistor capacitive charging effect contributed by the gate electrode 250-a from source 245 and drain region 247 overlap is decreased by these methods, because of the dopant type and dopant concentration relative to the polarity of the applied potential on the gate electrode 250-a. The thickness of the epitaxial layer of the EEG method is determined based upon the desired operating characteristics of the transistor, but typically is less than the dimension of the gate region length.

The extended gate region 244-b of FIG. 11d formed by the Epitaxial Extended Gate method can also be a graded doping region. If the extended gate region 244-b is graded, the dopant concentration decreases going away form the gate region (or towards the gate electrode 250-a).

The Gate Electrode Offset (GEO) structure is shown in FIG. 11f. Shown are source region 269, gate region 271, drain region 273, semiconductor layer 275, low stress dielectric layer 277, gate oxide 279, and offset gate electrode 281. The drain side edge of the gate electrode 281 is aligned to the drain/gate 273–271 interface of the transistor channel. The alignment could alternately be made to the source/gate 269–271 interface, and would be a preferred structure under certain device design requirements. The accuracy of the placement of the electrode 281 edge is limited by the capability of the lithography tool used. A gap between the drain region 273 and gate electrode 281 may result leaving a portion of the gate region 271 not covered by the gate electrode 281 due to lithography alignment deficiencies. This can be corrected by extending the drain region 273 through implant doping of the exposed gate region. The size of this gap during manufacturing can reliably be expected to be no greater than the magnitude of the alignment registration error of the lithography tool being used.

The transistor structure of FIG. 11e used as a bipolar transistor is of interest in order to achieve well controlled fabrication of thin base regions. The contact 270 to the base region 272 of a bipolar transistor in FIG. 11e is achieved by epitaxially extending 272-a the base region. This method like the EEG method is the selective epitaxial growth of an exposed region of the transistor that includes the base region 272. Other elements of FIG. 11e are collector region 274, collector contact 275, dielectric membrane 276, emitter region 277, and emitter contact 278.

MDI Transistor Fabrication Based on Confined Laterally Doped Epitaxy

Selective growth of high quality epitaxial films in a confined volume was reported in a paper ("Confined Lateral Selective Epitaxial Growth of Silicon for Device Fabrication," Peter J. Schubert, Gerold W. Neudeck, *IEEE Electron Device Letters*, Vol. 11, No. May 5, 1990, page 181–183). This "CLSEG" (Confined Lateral Selective Epitaxial Growth) method was developed to achieve dielectric isolation of crystalline silicon.

FIGS. 12a, b and c show the use of a MDI circuit membrane to produce a confinement cavity for the epitaxial growth of crystalline silicon. The original objective of CLSEG, to fabricate a dielectric isolated semiconductor substrate, is not an objective here because the MDI process is itself a dielectric isolation process. What is taught here is the application of the capability for growing epitaxial films in a confinement cavity within the context of the MDI process, and a processing method for using confined lateral epitaxial growth to fabricate MOSFET transistors with arbitrarily narrow gate region lengths without the use of lithographic means.

MDI confined lateral doped epitaxial closely controls transistor geometry in all three dimensions: height (as deposited semiconductor film thickness), width (placement of isolation trenches) and source, gate, drain regions (epitaxial deposition thickness). This makes the device operational characteristics more predictable with lower manufacturing complexity.

The MDI Confined Lateral Epitaxy method begins with a membrane of two films, one film 280 of semiconductor (silicon) and one film 282 of low stress dielectric. This membrane 280, 282 is made by one of the methods disclosed above. Dielectric filled isolation trenches 284 (see FIG. 12b, a top view of the structure of FIG. 12a) are fabricated to form what will become the sides of the transistor channel in the semiconductor film. Then a low stress dielectric layer 290 typically of 1 μm or less thickness is deposited, and a window 286 is anisotropically etched through the semiconductor film 280 stopping on the dielectric layer 282 and positioned between the isolation trenches 284, as shown in FIGS. 12a and 12b. In the preferred embodiment the orientation of the window 286 is approximately aligned with the crystallographic orientation of the semiconductor film 280 in order to produce a seed crystal walls 292-a, 292-b of FIG. 12c that is at a right angle to the isolation trench walls 284, 290, 282 in the confinement cavity, as explained below. The transistor depth (thickness) is well controlled by the thickness of the semiconductor membrane 280 which in turn can be precisely determined by epitaxial and/or etching means.

The exposed semiconductor film 280 is then anisotropically etched back in two directions under the dielectric over layer 290 and along the isolation trenches 284 as shown in FIG. 12c. This forms a very smooth walled confinement cavity 292 with a smooth seed crystal 292-a, 292-b at the end of the cavity 292. The etch is stopped at a lateral depth consistent with the design requirement for the number of transistors to be formed in the confinement cavity. The depth "c" of the confinement cavity 292 may vary from about 2 μm to over 15 μm.

A smooth contamination free seed crystal wall 292-a, 292-b is required for the subsequent epitaxial growth. The crystal seed wall 292-a, 292-b will form at an angle dependent upon the crystallographic orientation of the semiconductor film. A <100> silicon film will form a seed wall angle of approximately 54.74° as measured from the horizonal, and a <110> silicon film will form a seed wall 292-a, 292-b with an angle 90° (as shown in FIG. 12c). GaAs and InP have similar crystallographic properties and can be used as the semiconductor film instead of silicon.

The selective epitaxial growth of crystalline semiconductor proceeds from the seed crystal wall 292-a, 292-b. The npn or pnp regions of silicon MOSFET transistors are epitaxially grown (see FIG. 12d) with in situ doping to whatever design thicknesses desired. This allows the length of the base or gate region of the transistor to be determined by the epitaxial growth process instead of a lithographic process as presently done. This also allows the length of the base or gate region of the transistor to be arbitrarily narrow, which cannot be done with current lithography methods. FIG. 12d shows the confinement cavity 292 filled with a CMOS transistor pair of npn and pnp structures 294, 296. Each region of the transistor can be uniquely tailored to length and doping concentration level, in addition, because the transistor channel is formed by epitaxial means, doping of the transistor 294, 296 regions, can be extended to graded segments as discussed above. Further, non-symmetric doping of source and drain regions can easily be implemented by time based selection of dopant during epitaxial growth; this is not easily accomplished in bulk wafer processing due lithography limitations in resolving the gate region.

FIG. 12d shows two pairs 294, 296 of CMOS transistors formed as mirror images of each other in two confinement cavities; this was a design choice because a single confinement cavity could have been formed by additional trench dielectric isolation of the initial confinement window opening. Depending on the method of epitaxial growth, gate region lengths "g" of less than 25 nm can be fabricated. In contrast, prior art MOSFET transistor gate regions are predominately formed by optical lithographic means and are presently limited to minimum gate region lengths of approximately 0.5 μm (500 nm).

FIG. 12e shows the CMOS transistor pairs 294,296 with electrode contacts 294-a, 294-b, 294-c, 296-a, 296-b, 296-c. The isolated gate electrodes 300, 302, 304, 306 each span the narrower gate region length of the transistor. The gate electrode is formed by standard lithographic processes, and may be many times of greater length than the gate region length of the transistor. For example, a lithographically defined gate electrode of 0.5 μm and a transistor gate region length of 25 nm are possible. Gate electrode capacitance attributed to the gate electrode overlap of the source or drain regions can be reduced as described above with the GGD, EEG, and GEO methods. FIG. 12f shows embodiments of all of these methods; the electrode 312 opposed to the gate electrode 308 is presented optionally as a substrate bias. Also shown in FIG. 12f are source region 294-1, optionally graded doped gate region 294-2, epitaxially extended gate regions 294-4, offset gate electrode 308, gate isolation 310, and optionally epitaxially extended substrate 312-a.

The MDI Confined Lateral Epitaxy method is not limited to MOSFET transistors or silicon as a semiconductor material. The MDI Confined Lateral Epitaxy method can be used to fabricate silicon bipolar transistors, or applied to other semiconductors such GaAs or InP which can be epitaxially formed. An example of a bipolar transistor is shown in FIG. 12g when emitter region 314, base region 316, epi-extended base and electrode 318, collector 315, and optionally epi-extended base and electrode 319.

The semiconductor layer of a MDI circuit membrane provides various methods to pack circuit devices densely, mix semiconductor types or simplify the fabrication steps. FIGS. 12h, i & j show examples of such methods. FIG. 12h shows a silicon membrane 289 upon which an epitaxial dielectric 291 and a subsequent layer of epitaxial semiconductor 293 has been formed; the total thickness of this membrane structure is typically less than 4 μm. The dielectric layer 291 should closely match the crystal lattice dimension and structure of the silicon 289; an example of such a dielectric with a similar crystal lattice is sapphire or undoped silicon under certain device design parameters. This MDI semiconductor layer structure allows semiconductor devices to be formed on either side of the semiconductor layer 289 and remain electrically isolated. An obvious application for this semiconductor or membrane structure is CMOS integrated circuits with p-type device formed on one side and n-type devices formed on the opposite side. Low stress dielectric would be used to trench isolate individual semiconductor devices and complete the MDI process suggested by Method #2. Further, the second epitaxially grown semiconductor layer 293 can be a material other than silicon such as GaAs or InP.

FIG. 12i shows a MDI circuit membrane composed of a silicon layer 295 and a low stress dielectric layer 297. The dielectric layer 297 has been patterned to form open areas 299 into which semiconductor material was deposited by selective epitaxial growth. The selectively deposited semiconductor 299 can be an semiconductor other than silicon, or silicon. Semiconductor devices can be fabricated in the epitaxial islands 299 on the backside of the MDI semiconductor layer.

FIG. 12*j* shows a MDI circuit membrane composed of a silicon layer 295 and a low stress dielectric layer 297. The dielectric layer 297 has been patterned and silicon islands 299 formed through selective epitaxial growth in the same manner as described for FIG. 12*i*. The silicon layer 295 was subsequently patterned removing portions of the silicon layer opposite each island 299 that was epitaxially grown in the dielectric layer, and then filling with low stress dielectric. Circuit devices formed in the semiconductor islands 299 are dielectrically isolated. This membrane structure has similar applications as those suggested for FIG. 12*h*.

The structures FIGS. 12*h*, *i* & *j* show that a two level device structure can be formed that permits more compact interconnection of the circuit devices by the use of vertical interconnections. These structures also simplify the fabrication of mixed device technologies such as BiCMOS by allowing the Bipolar and MOSFET devices to be fabricated on either side of the semiconductor membrane without an increase of interconnect complexity. The use of these MDI structures typically doubles the total surface area are available for interconnect metallization routing. The obvious potential processing benefits can be a reduction in the number interconnect metallization layers per side and or relaxation of the interconnect metallization pitch used, both of these benefits normally lead to an increase in circuit yield.

Dielectric Membranes as Sensor on Rigid Substrates

The mechanical (physical) and thermal properties of the nitride and oxide free standing membranes made with the Novellus equipment are similar to silicon membranes presently being used in the making of ICs with integrated sensors. Examples of such silicon membrane or diaphragm based sensors are those made for sensing acceleration, pressure or temperature, but not limited to these areas. The availability of such oxide and nitride dielectrics for general application is novel with this disclosure.

The use of such free standing dielectrics membranes significantly reduces the complexity of producing a membrane with non-conducting properties in a silicon or semiconductor fabrication environment. The low stress dielectric membranes have selective etchants that allow the dielectrics to be processed independently in the presents of silicon. The known passivating capability and inert chemical nature of silicon nitride, and the relatively similar coefficient of thermal expansion of silicon, silicon dioxide and silicon nitride increases the operating environmental range of sensors versus organic dielectrics.

Sensor diaphragms of low stress dielectric membranes produced on rigid substrates (typically semiconductor) can in most cases directly replace silicon membranes or be used in conjunction with a silicon membrane formed on a rigid (conventional) semiconductor substrate. No new fabrication methods are required to integrate the low stress MDI process dielectrics into such sensor ICs.

Applications of MDI Circuit Membranes

The following discloses additional applications of the MDI process, and of forms of MDI circuit membranes and extensions of the MDI IC process. For example, a MDI circuit membrane with few or without active circuit devices is called more specifically an interconnect circuit membrane. When the interconnect circuit membrane is used to interconnect conventional ICs in die form, the interconnect circuit membrane becomes a multiple chip module (MCM) interconnect circuit membrane as discussed immediately below. This does not limit the application of a MDI circuit membrane with active and passive circuit devices from being used in the fabrication of a MCM.

MDI Multi-Chip Module Interconnect Circuit Membrane

A MDI circuit membrane composed primarily of interconnect metallization of one or several internal interconnect levels can be fabricated on a substrate to provide electrical interconnections between the bond (signal) pads of various individual dice (ICs) as in the well established packaging technique called multiple chip module (MCM). A MDI circuit membrane made for this type of application is called multi-chip module Interconnect Circuit Membrane (ICM).

The multi-chip module interconnect circuit membrane is formed using the MDI process and conventional semiconductor processing techniques. The interconnect circuit membrane may have several thousands of die metal bond pad contacts or bonding points. The position of these metal contact or bonding points on the surface of the interconnect circuit membrane can be arbitrarily placed.

The multi-chip module interconnect circuit membrane can be formed on any substrate material that can meet the requirements for flatness specification, withstand the processing temperatures of the applied low stress dielectric(s), and can be selectively etched with respect to the low stress dielectric(s) to form the circuit membrane. FIG. 13*a* shows an embodiment of an multi-chip module interconnect circuit membrane made as described above by the MDI methods. FIG. 13*a* includes the interconnect circuit membrane 320 with several internal metallization trace layers (not shown), ICs (dice) 322*a*, 322*b*, 322*c*, interconnect circuit membrane substrate frame 324, and IC bonding contacts 326. FIG. 13*b* shows a related structure which is a cross-section of a functional tester for testing ICs with probe points 330 formed on attached ICs 336*a*, 336*b*.

The interconnect circuit membrane can also be formed (see FIG. 14) using the MDI method on a quartz substrate 340 that has been coated with a release agent 342 such as KBr; this assumes that a single-crystal type membrane or substrate 340 is not required for the fabrication of various types of active circuit devices (SDS) in the interconnect circuit membrane 320. Thus this structure is made as described above, but without mono-crystalline SDs, as in a MCM that as a minimum requires only an interconnect circuit membrane or passive circuit devices and transistors made from polycrystalline or amorphous semiconductor. FIG. 15 shows the multiple chip module interconnect circuit membrane 320 of FIG. 13*a* made with the release agent method of FIG. 14 and held by a separately formed frame 350 that was bonded to the interconnect circuit membrane 320 just prior to activating the release agent by scribing at the shoulder of the quartz substrate, thereby cutting through the interconnect circuit membrane 320 and applying the appropriate solvent for the release agent. The array of die (ICs) 322*a*, 322*b*, 322*c* can then be directly bonded (as described below) to the interconnect circuit membrane 320, or the interconnect circuit membrane 320 can be aligned and mechanically held against the pads of the surfaces of the array of die (ICs) 322*a*, 322*b*, 322*c* to achieve electrical contact. Alternately, the circuit membrane made with the method utilizing polysilicon as disclosed above and shown in FIG. 1*j* can also be used as an interconnect circuit membrane to achieve a similar result as that shown in FIGS. 13*a*, 13*b* and 15.

The interconnect metallization traces in the circuit membrane form electrical connections from one or more of the contact pads of an IC to one or more contact pads of the other ICs. The diameter of these pads can vary from less than 0.5 mil (0.001" or 25 μm) to several mils. The limiting factors of the size of the IC contact pads is the lithography method used in fabrication and the assembly method; the cost of such methods increase as pad diameters less than 3 mils are employed.

A die can be bonded to a circuit membrane with any of several techniques. Techniques such as compressive metal to metal bonding with such metals as Indium or gold (or their respective alloys), infrared thermal bonding, laser bonding, and vertically conductive adhesive films such as ZAF from 3M Corporation are examples. FIG. 16a shows the packaging for a version of the structure shown in FIG. 13a, including IC carrier lid 352, compressible material (such as silicone) 354 attached thereto, carrier substrate 355 of the MCM package, contacts 356 to the carrier signal pins 357. An alternative package is shown in FIG. 16b, with gastight gasket 358 enclosing pressurized volume 359.

If the interconnect circuit membrane 360 (see FIG. 17a) is made from optically transparent dielectrics such as low stress silicon dioxide and or silicon nitride, this permits the conventional die (IC) 362 to be visually aligned on the interconnect circuit membrane 360 from the backside or from the side of the interconnect circuit membrane 360 opposite that of the die 362. A locally directed infrared or other heat source (not shown) can then be applied from the backside of the interconnect circuit membrane 360. On the opposite side (top side) is formed MDI pad 365 which is surrounded by solder wells 364, and solder weld bonds can be formed between the interconnect circuit membrane pads 365 and the die bond pads 366 on which is formed solder bump 367 which typically is about 5 to 25 $\mu$m thick. The die 362 is attached face down against the interconnect circuit membrane 360.

Solder weld bonds are formed by using a heat source (not shown) such as a high intensity lamp, laser or metal instrument that can heat the solder to its melting point. The heat source melts the solder 367 (see FIG. 17b) directly under the die pad 360 by heating through the interconnect circuit membrane 360 while the die is in contact with the interconnect circuit membrane. The high temperature tolerance of the dielectric material, its innate elasticity and thin structure allow heat from the heating source to quickly reach and melt the solder 367 to form a bond of 3 to 10 $\mu$m thickness. The melted solder 367 wets both the die pad 366 and the interconnect circuit membrane pad 365, and when it cools the solder 367 contracts holding the die pad 366 firmly against the interconnect circuit membrane pad 365. The solder bond is formed with no more pressure than what would be exerted when the die 362 is brought in contact with the interconnect circuit membrane 360, pressing into the interconnect circuit membrane and deflecting it by less than 25 $\mu$m. When the solder 367 is melted, the interconnect circuit membrane 360 assumes a uniform planar contact against the surface of the die 362. This also removes the requirement that the solder on each pad be formed to an exacting equivalent height.

The solder 367 (see FIG. 17c) alternatively is originally electroplated onto the interconnect circuit membrane bond pad 365. The solder 367 is electroplated to a height between 5 and 25 $\mu$m. The original height of the solder bump 367 is greater than the depth of the solder well 364 of the interconnect circuit membrane 360 in which the pad 365 of the interconnect circuit membrane 360 is positioned. FIG. 17b shows the structure of FIG. 17c after soldering or bond formation. If a die is removed some excess solder 367 will remain on the pad 365 of the interconnect circuit membrane 360. When a replacement die is bonded to the same interconnect circuit membrane pad, any excess solder will flow or be pressed into the solder well 364 and not prevent the surface of the die 362 and interconnect circuit membrane 360 surface from achieving uniform firm contact with each other. A hermetic seal can be formed between the surface of the die 362 and the interconnect circuit membrane 360. This is done by forming a metal bond along all edges of the die (not shown). This bond can be soldered, and is formed as described below.

An advantage of the high temperature tolerance of the interconnect circuit membrane which allows die solder bonding to be done without the application of any significant contact pressure between the interconnect circuit membrane and die, is the ability (see FIG. 18 showing a top view of bond pads on a die) to place die bond pads 370-1, 370-2, ..., 370-k, ..., 370-n directly over the circuit structures of the die (not shown). This allows the placement of semiconductor devices directly under a bond pad 370-k without concern that the semiconductor devices will be damaged, which is the case when mechanical wire bonding equipment is used to wire bond a die to its carrier. Damage-free bonding is not presently possible with current die wire bonding techniques, because such bonds are compressively formed with a mechanical arm which presses, rubbing through the die bond pad into the substrate of the die to be placed anywhere on the surface of the die. The MDI method makes the design of the IC easier, removes the need for reserved pad area on the die (which saves 5 to 10% of the surface area of the die) does not restrict the placement location of the pad, and allows the pads to be larger since area under the pads is no longer reserved exclusively for them.

A hermetic seal bond pad 372 extends continuously along the perimeter of the surface of the die. A hermetic seal of the surface of the die with the surface of the circuit membrane can be accomplished by the formation of an enclosing solder bond (comprising a solder well as described above for forming pad bonds) along the edge of the die. The hermetic seal is typically also a ground contact for the die.

The infrared solder bonding of die to the multiple chip module interconnect circuit membrane is a simple process which also allows the dies to be easily removed and replaced without damage to the interconnect circuit membrane. As shown in FIG. 19a, the IC 372 is held by a vacuum tool 373 and aligned in close proximity to the MCM interconnect circuit membrane 374. Once aligned, the interconnect circuit membrane 374 is gently urged forward by a fluid pressure 376 a distance of several mils and the die 372 is urged toward the interconnect circuit membrane 374 until contact is established. The infrared heat source 377 is applied to achieve localized heating of the solder pads (not shown) on the IC die 372 until they melt and wet to the interconnect circuit membrane 374.

The die 372 can be removed (see FIG. 19b) by using the same vacuum tool 373 to gently pull on the IC 372 while localized heating from heat source 377 of the IC is applied until the solder bonds melt and the IC 372 can be pulled from the interconnect circuit membrane 374; no fluid pressure is applied to the interconnect circuit membrane 374.

The multi-chip module interconnect circuit membrane can be enhanced to include passive devices such as resistors, capacitors, and polysilicon or a-Si (amorphous-Silicon) TFTs (Thin Film Transistors). Such circuit elements can be fabricated into or onto the membranes due to the ability of the dielectric membranes to tolerate processing temperatures in excess of 400° C. These circuit elements can be fabricated internally to the interconnect circuit membrane structure as part of various specific layers or collectively on either external side of the interconnect circuit membrane. After the interconnect circuit membrane is freed from the substrate on which it is initially formed, it is strong enough to withstand continued semiconductor processing steps.

The multi-chip module interconnect circuit membrane can further be enhanced to include any degree of active single crystal semiconductor devices. This is consistent with the earlier discussion of the capability of bonding two or more MDI membranes to form a three dimensional IC, except in this case conventional dice (ICs) are bonded at the bond pads of the circuitry internal to a MDI circuit membrane which is also serving the purpose of interconnect circuit membrane.

The multi-chip module interconnect circuit membrane provides novel circuit cooling advantages due to its low mass structure. The thermal energy generation of an IC is from the face side of the IC. ICs attached face down against the circuit membrane allows the thermal energy of an IC to be radiated and conducted through the circuit membrane to a liquid or solid heat sink means on the opposite side of the circuit membrane. The circuit membrane provides a very short thermal path from the IC to the heat sinking means. The ability directly to cool ICs in this manner is a unique feature of the MDI interconnect circuit membrane structure. The cooling efficiency that can be achieved by an IC that is fabricated with the MDI process as a circuit membrane is significantly improved versus standard thickness substrates by the obvious reduction in the thermal mass resistance of the semiconductor substrate.

FIG. 13d shows in cross-section a portion of a MCM MDI interconnect circuit membrane 329 including low stress dielectric and interconnect layer 329a and semiconductor layer 329b where two die 331, 333 are bonded face down at their signal pads 335a, 335b, 335c, 335d. The MDI circuit membrane 329 incorporates the pad drivers 337a, 337b, 337c, 337d that normally would be incorporated onto the die (IC). The primary advantages of integrating the IC pad drivers into the MCM are circuit performance, simplified use of mixed device technologies (Bipolar & CMOS), cooling and die size (IC real estate).

IC pad drivers are typically designed to meet a broad range of circuit design conditions which often results in a trade-off of performance. The designer of the MCM pad driver has a better understanding of the operational requirements of the pad driver, and therefore, can typically optimize the pad driver design for higher performance. Pad drivers in the MCM can be formed from Bipolar transistors while the IC can be CMOS. This achieves many of the benefits of BiCMOS without the fabrication complexity. The pad drivers of an IC typically generate more than half of the thermal energy of the IC especially at high operating speeds. Placing the pad drivers in the MCM provides a means to bring the primary thermal components of an IC into direct contact with heat sinking means. IC pad drivers are typically the largest transistor structures making up the IC. Moving the pad drivers of the IC into the MCM can result in a potential 5–10% reduction in the size of the overall IC.

The incorporation of low complexity ICs into a MCM MDI circuit membrane can reduce overall MCM assembly and parts costs. Such often used circuits as bus drivers or combinatorial logic can be incorporated into a MCM reducing parts and assembly costs without a corresponding increase in the cost to fabricate the MCM. (Once the decision has been made to include such circuits in a MCM MDI circuit membrane, there is no significant cost difference between the inclusion of 1,000 transistors or 10,000.) Yield of circuits in a MCM circuit membrane can be addressed through redundant fabrication of the desired circuit devices; the circuit devices of the MCM circuit membrane comprise only a small amount of the total surface area, typically less than 10%. The circuit devices of the MCM circuit membrane can be tested for defects. A MDI functional tester membrane disclosed herein, can be used to perform this testing and, in the same step if so desired, to blow anti-fuses to enable the defect free circuits or fuses to disable the defective circuits.

The multi-chip module interconnect circuit membrane, like prior art PCBs (printed circuit boards), can provide access to the contact pads of the IC from the opposite side on which the IC is attached. This access permits in-circuit testing of the bonded IC to be performed by a separate interconnect circuit membrane fabricated to do such a functional test, and also permits electrical continuity testing of the traces fabricated in the multi-chip module interconnect circuit membrane, again performed by an interconnect circuit membrane test surface fabricated for that purpose. FIG. 20 is a top side view of an interconnect module showing an interconnect circuit membrane surface bond pad 380 and interconnect circuit membrane feed-through contacts 382 from the bond pads of the dice 386-1, 386-2, 386-3 mounted by compression or solder bonding (see FIG. 21) on the backside of the interconnect module of FIG. 20. Also shown in FIG. 21 are the backside 388 of the etched silicon substrate and the interconnect circuit membrane surface 190 with the traces 392-1, 392-2, 392-3 interconnecting the dice 386-1, 386-2, 386-3.

The multi-chip module interconnect circuit membrane method could also be used to construct a functional IC tester surface with a high number of probe points (in excess of several thousand) for testing ICs while in wafer or die form (i.e., wafer or die sort testing), and also to wafer sort subsections of ICs such as an ALU (Arithmetic Logic Unit), FPU (Floating Point Unit), cache segment, etc.

A functional circuit membrane tester surface made with the MDI process offers advantages not presently available from present on-wafer IC membranes testers constructed from polymers such as continuous high temperature operation (greater than 100° C.) without deleterious effects due excessive material expansion or at-speed IC testing without EM interconnect trace coupling.

High numbers (in excess of 1000) of pads or traces of an IC or IC subsection can be contacted. The contact sites of the IC (die) can be arbitrary in position and all sites can be contacted at one time. The contact sites (pads or traces) can be less than 50 μm (2 mils) or even less than 2 82 m in diameter. The probe points of the functional tester surface can be less than 50 μm or even less than 1 μm in diameter, and can be placed on center to center distances of less than twice the diameter of the probe points. (Functional probe points can be formed to be 12 μm in diameter and spaced on center to center distances of less than 24 μm.) The ability to form and contact high numbers of pads or traces with dimensions smaller than presently available in the industry is due to the ability of the MDI IC process to form multiple layers of interconnect with established semiconductor fabrication means resulting in a flexible and elastic membrane structure. The multiple layers of interconnect provide for denser contact test sites, the thin membrane structure provides for contact conformation with little required force (typically less than 10 psi), and the compatibility of the dielectric material with standard IC fabrication techniques allows contact of contact site dimensions less than 2 μm.

A MDI circuit membrane 332 used as an IC functional tester surface extends under fluid pressure "P" to make contact with the surface of a wafer or single die 339 to be tested as shown in FIG. 13c. The MDI circuit membrane 332 can be formed with diameters of approximately the size of the substrate on which it is formed and to be extended more than 40 mils (0.1 cm) depending on the diameter of the membrane. Probe points 330 on the tester surface are not restricted in size, and can range in size from greater than 4 mils (0.01 cm) to less than 2 μm in diameter. The number of probe points 330 can vary from less than 100 to several thousand without restriction and the placement of the probe points can be arbitrary. These capabilities of the functional tester surface are primarily due to the structural formulation of the materials used and the fabrication methods of the MDI process. The MDI functional tester surface can rub through the native aluminum oxide layer of the bonding pads of the die 339 being tested by laterally moving the wafer or die 339 holding mechanism several microns (typically less than 10 μm) in a back and forth motion. This is uniquely facilitated by the durability of the circuit membrane, the surface flatness of the membrane, the uniformity of probe point height and the low pressure required to extend the membrane surface so that all probe points are in contact with the substrate.

In the case of sub-section testing of a die, the detection of a defective sub-section before packaging permits the option of pinning-out the IC as one of several alternative product configurations, and thereby, making useable an otherwise scrapped IC.

In FIG. 13b the multi-chip module interconnect circuit membrane has signal pad probe points 330 formed on the side opposite of the attachment of dice 336a, 336b. The dice 336a, 336b of the multiple chip module provide functional test signals to the probe points 330. The testing performed by the multiple chip module can be functional testing of a whole die or a subsection of the IC. The probe points 330 are aligned over a die (not shown) to be tested on a wafer, and the interconnect circuit membrane 332 is extended several mils (nominally 15–30 mils) by a fluid pressure as shown in FIG. 13c. The wafer is raised to make contact with the probe points 330, the functional test performed, the wafer is lowered, positioned to the next IC (die location on the wafer) and the functional test repeated until all the ICs on the wafer have been tested. Testing die in this manner can also be done on die that has already been cut from a wafer. This is done by aligning and holding the individual die in contact with the probe points and the functional test performed. Piezoelectric horizontal vibration applied to the interconnect circuit membrane 332 or the wafer or individual die while the functional testing is being performed can be used to rub through native metal oxide on the die pads.

Alternately the native metal oxide (approximately 30 Å thick) on the pads of a die can be rubbed through by the probe points of the functional tester surface by repeatedly moving the wafer or die several microns in a lateral manner when the tester surface is first brought into contact with the IC to be tested. The mechanical control presently available with most wafer or die handling equipment is sufficient to effect this rubbing action.

The interconnect circuit membrane can range in thickness from less than 2 μm to over 25 μm. A typical thickness per layer of interconnect (dielectric and metal traces) is 1 to 4 μm. Dielectric layer of several microns thickness may be used as a planarizing technique to lessen metal trace step height differentials that can develop when more than two interconnect layers are used. Planarization of metal traces can also be achieved by depositing the dielectric to a thickness inclusive of the metal trace. A channel that is at least as deep as the desired thickness of the metal trace is patterned in the dielectric. Then established lift-off techniques are used to fill the channel with metal.

FIGS. 22a to 22c show this process. In FIG. 22a, a portion of the interconnect circuit membrane dielectric 400 is shown with patterned resist layer 402 overlying. Recess 406 is then formed in dielectric 400 by isotropic etching to form undercut portions 404 equal nearly to the depth of etched recess 406. In FIG. 22b metal layer 408 is deposited. In FIG. 22c lift off stripping of resist 202 is performed leaving only metal trace 408, and the next dielectric layer 410 is deposited.

Planarization of the interconnect structure can be achieved by applying a thick layer of a planarizing polymer over the MDI dielectric film. The polymer must have an etch rate similar to that of the MDI dielectric film. The polymer is then removed completely by dry etch means and in the same process removing any dielectric surface features that extended into the polymer layer. This planarization process is identical to the optional planarization process disclosed in the process steps for the Air Tunnel. The only differences being the material being planarized is a MDI dielectric and not a-Si.

The ability of the interconnect circuit membrane to achieve reliable contact on the bond pads of a die (see FIG. 13b) is strongly influenced by the thickness of the interconnect circuit membrane 332 which contains the probe points 330 for contacting the die to be tested. An interconnect circuit membrane 332 may be 25 μm thick or more as required for example by transmission line design considerations of interconnect traces. Interconnect circuit membrane thickness at the probe points is preferably less than 8 μm. The structure of FIG. 13b can be fabricated as shown in FIGS. 23a and 23b.

In FIG. 23a an etch stop layer 412 (typically metal) is deposited at a certain thickness of the interconnect circuit membrane 332 as the interconnect circuit membrane 332 is fabricated from repeated applications of dielectric and metallization layers to a thickness of 8 to over 25 μm. After the fabrications of the interconnect layers of the interconnect circuit membrane 332 is completed, an area over the probe points 330 is masked and etched to the etch stop layer 412 (see FIG. 23b). The etch stop layer 412 is then etch removed. Alternatively, the area 414 over the probe points 330 can be etched free of overlying interconnect layers as each layer is itself patterned as part of the fabrication of the interconnect metallization. Then dice 336a, 336b are attached to the interconnect circuit membrane 332.

MDI Source-Integrated Light Valve (SLV) Direct Write Lithography Tool

The MDI process technology can be used to fabricate a circuit membrane with an n×m cell array of active radiation sources of X-ray, DUV (Deep Ultra Violet) or E-Beam sources that can be used to form lithographic patterns in a film of appropriately sensitive resist. The preferred embodiment in this disclosure uses a X-ray source. Variations of the electrodes, gas contents and structure of the radiation source cell can be made within the overall structure of this source integrated light valve embodiment. The preference for the X-ray source embodiment is its capability to pattern a smaller feature size.

The radiation source cells in the membrane are under computer control, so that this type of MDI membrane combines the functions of reticle or mask and a light or radiation source for fabricating ICs. The radiation source cells of this MDI circuit membrane are positioned (aligned) over an area of the substrate to be patterned and at a uniform distance from or in contact with the substrate. Each cell then illuminates (exposes) various portions of the substrate directly beneath it as required. The MDI circuit membrane functioning in this manner is called herein a source-Integrated Light Valve (SLV) and can generally be categorized as a Direct Write (maskless) Lithography Tool.

The array of Radiation Source Cells (RSC) that make up the patterning structure of the SLV, emit a collimated source of radiation. The exposure feature size of this collimated radiation source is dimensionally much smaller than the area the RSC occupies on the surface of the SLV. The emitted collimated radiation source is referred to as the Radiation Exposure Aperture (REA). The SLV is moved in a scanning X-Y manner over the substrate to be patterned. The dimensions of the scanning motions cause each REA of an RSC to pass over a portion of the substrate that typically is equal in area to the size of the RSC. The RSCs are operated in parallel, and the patterned areas on the substrate beneath each RSC adjoin each other and collectively form a much larger overall pattern on the substrate. This pattern can be as large as the underlying substrate. The scanning motion of the RSCs is generated by well known computer controlled mechanical motor driven stages or piezoelectric driven stages. The SLV or the substrate can be attached to the motion stage. Due to the short X-Y motions in the use of the SLV, and the desire to scan the RSCs with REAs of dimensions much less than 1 $\mu$m and in some cases with dimensions of less than 50 nm, piezoelectric motion stage drive is the preferred embodiment. As the REAs of the SLV circuit membrane are scanned over the substrate, they are turned on or off by computer controlled logic associated with each RSC to effect the desired exposure pattern to be made on the surface of the substrate. An example would be a RSC with an area of 25 $\mu$m by 25 $\mu$m and a REA of 0.1 $\mu$m in diameter. In order for the REA to expose an area the size of the RSC, a scanning motion of 25 $\mu$m by 0.1 $\mu$m would be made 250 times in the X-axis direction while translating 0.1 $\mu$m in the Y-axis direction after each scan.

FIG. 24 shows a overhead (plan) view of a prototypical SLV 420 with an array size of 4,096 by 4,096 RSCs, and an overall size of approximately 5 inches by 5 inches. The SLV array 420 of RSCs has associated control logic 424 for loading the pattern data to each RSC. The SLV 420 (including the control logic 424) is a MDI circuit membrane of nominally 8 $\mu$m to 50 $\mu$m in thickness made by established semiconductor processes and held in a rigid frame 426 made from the original substrate on which the SLV 420 was fabricated or a frame bonded to the SLV prior to the selective etch removal of the substrate on which the SLV (MDI circuit membrane) was fabricated. Electromagnetic coupling alignment structures 430 (described below) are shown also.

FIG. 25 shows a cross-section of two RSCs 434-1, 434-2 in a SLV 440. A SLV 440 in the preferred embodiment has rows and columns of RSCs 434-1, 434-2 where each row and each column can include more than 1,000 RSCs resulting in a total count of RSCs in a SLV in excess of several million. FIG. 25 shows a MDI circuit membrane 440 which is 8 to 50 $\mu$m thick, data bus interconnect metallization 442-1, 442-2, control logic 424-1, 424-2, X-ray sources 446-1, 446-2, and REAs 434-1a, 434-2a.

FIGS. 26 and 27 are cross-sections of two different potential implementations of X-ray RSCs 434. FIG. 26 uses a metal cathode 450 with a highly textured surface 452 in the shape of adjacent cubes; each corner of the extended portion of each cube is a cold electron point emitter which emits electrons into the electric field 456 created by the high voltage x-ray emitting target 458 beneath it. The size of the RSC 434 is approximately 25 $\mu$m×25 $\mu$m. The thickness (height) of the RSC 434 is approximately 8 to 50 $\mu$m. The materials used to fabricate the SLV (and RSCs) are those employed to fabricate a MDI circuit membrane as described above—metal 459, low stress dielectric 460 and a single crystalline semiconductor membrane substrate 472. The processing steps can vary widely, but are those used in conventional semiconductor and micro-machinery fabrication.

The textured cathode 450 will typically be in the shape of a square array of rows and columns of metal cubes, with each cube having dimensions much smaller than the overall dimensions of the square cathode layer. As an example, if the cathode 450 is 4 $\mu m^2$ in area, the dimension of each cube would be 0.1 to 0.5 $\mu$m on a side. The textured cathode cubes are made by established lithography techniques (E-Beam or DUV optical lithography) and anisotropic RIE processing. This cathode 450 configuration is a novel part of the SLV because of high density of cold electron emitters, and therefore, high electron fluence onto the anode 458. The cathode 450 emits electrons which are accelerated by the electric field 456 created by the voltage potential of the target or anode 458. When electrons reach the target 458, X-rays are emitted from the target 458. X-ray absorber materials 466 such as tungsten or gold are deposited as layers as part of the fabricated structure of the SLV membrane to provide a means to form the REA 470 and in back scatter layer 461 to prevent back scattered X-rays from reaching control logic devices 472 with interconnect 473 to other RSCs in the SLV. This RSC is related to the well known X-ray vacuum tube design. The space 474 separating the cathode and target is in partial vacuum. This separation distance can vary from less than 1 $\mu$m to 40 $\mu$m.

FIG. 27 shows an alternative RSC 434 that uses a laser diode 480 to irradiate onto a target 458 which in turn emits X-rays. The laser diode 480 and the target 458 are separated by a distance "d" of 1 or more microns in a cavity 482 that is optionally a partial vacuum. Except for the technique of inducing the emission of X-rays from the target 458 material, the RSCs 434 shown in FIGS. 26 and 27 are functionally the same. RSCs that employ gases such as Cd—Hg or Xe—Hg as in the case of DUV radiation sources, the structure of the electrodes in the cavity of the RSC would change and X-ray absorber layers would not be necessary. RSCs that emit free electrons for resist patterning would require that the REA 470 be an opening or that it be closed by a material thin enough to allow the accelerated beam of electrons to pass through it. If the REA 470 is an opening from the electrode cavity 482 of the RSC, then the SLV would have to be operated in vacuum, just as is the case with E-Beam lithography tools. The Hampshire Corporation (Marlborough, Mass.) presently manufactures an X-ray lithography tool which uses a laser diode stimulated X-ray radiation source.

Although laser diodes that emit radiation with a wavelength less than approximately 6,000 Å do not presently exist, development of shorter wavelength laser diodes is on-going and contemplated as a radiation generator for the SLV. There is significant demand for diodes with shorter wavelengths for use in consumer and computer peripheral products like compact discs. Such devices in the not too distant future may come into existence and such laser diodes could possibly be integrated into the SLV as a radiation source generator of a RSC. The use of laser diodes is therefore contemplated. An additional application of the SLV (with a RSC of appropriate radiation capability) is radiation-induced CVD (chemical vapor deposition). The use of an SLV in this manner eliminates the need for mask and etch processing steps. The material of interest to be deposited, be it metal or dielectric, is deposited in a patterned form. This provides for a maskless, resistless, etchless process and it has significant cost and particulate contamination advantages. The SLV operating in this manner supplies radiation at the surface of a substrate where a mixture of gaseous compounds are present. This process step is mechanically the same as exposing a resist layer on the substrate as discussed above. The radiation from a RSC causes the compounds to react at the surface of the substrate leaving a deposition of material selectively on the irradiated portions of the surface of the substrate. This method of radiation-induced selective CVD has been demonstrated with the use of excimer lasers. Laser diodes that can emit radiation in the excimer frequency band of 75 to 250 nm do not presently exist.

MDI Source-External Particle Valve (SPV) Direct Write Lithography Tool

The MDI process technology can be used to fabricate a circuit membrane with an n×m cell array of individually controlled electro-static or electromagnetic valves or shutters. These valves can be used to control the passage of charged particles through the circuit membrane to create an exposure pattern in a film of appropriately sensitive resist. The array of valves on the MDI circuit membrane is for practical purposes the same structure as the SLV structure shown in FIG. 24. The primary difference is the use of particle valve cells for patterning an external particle source which illuminates one side of the SPV circuit membrane, instead of a cell with an integrated patterning source as in the case of the SLV lithography mask.

The array of valve cells of this MDI circuit membrane is placed between a collimated ion particle source and at a uniform distance from or in contact with a substrate coated with a thin film of resist. The array is positioned (aligned) over an area of the substrate to be patterned and the array of valves, under individual computer control, allow ion (charged) particles to expose or not expose an area of resist coated substrate directly under beneath it. The MDI circuit membrane functioning in this manner is called herein a Source-External Particle Valve (SPV).

The collimated particle beam passed by a particle valve has a fixed exposure feature size called the Particle Exposure Aperture (PEA). The SPV is moved in a scanning X-Y manner over the substrate to be patterned. The dimensions of the scanning motions cause each PEA of a particle valve to pass over a portion of the substrate that typically is equal in area to the size of the valve. The valves are operated in parallel (simultaneously), the patterned areas on the substrate beneath each valve adjoin each other and collectively form a much larger overall pattern on the substrate. The scanning motion of the valves is generated by well known computer controlled mechanical motor driven stages or piezoelectric driven stages. The SPV or the substrate can be attached to the motion stage. Due to the short X-Y motions in the use of the SPV, and the desire to scan the valves with PEAs of dimensions much less than 1 µm in diameter and in some cases less than 50 nm, piezoelectric motion stage drive is the preferred embodiment. As the valves of the circuit membrane are scanned over the substrate, they are turned on or off by computer controlled logic associate with each valve to effect the desired exposure pattern to be made on the surface of the substrate. An example would be a valve with an area of 25 µm by 25 µm and a PEA of 0.1 µm in diameter. In order for the valve to expose an area the size of the valve, a scanning motion of 25 µm by 0.1 µm would be made 250 times in the X-axis while translating 0.1 µm in the Y-axis after each scan.

FIG. 24 (also a plan view for the SLV) shows an overhead (plan) view of a prototypical SPV 420 with an array of 4,096 by 4,096 ion or charged particle valves, and an overall size of approximately 5 inches by 5 inches. The SPV array 420 of valves has associated control logic 424 for loading the pattern data to each valve. The SPV 420 (including control logic 424) is a MDI circuit membrane of nominally 4 µm to 8 µm in thickness made by established semiconductor processes and held in a rigid frame 426 made of the original substrate on which the SPV 420 was fabricated. Electromagnetic coupling alignment structures 430 (described below) are shown also.

FIG. 29a shows a cross-section of two valves 502, 504 in a SPV 506. A SPV in the preferred embodiment has rows and columns of valves 502, 504 where each row and each column can include more than 1,000 valves resulting in a total count of valves in a SPV in excess of several million. FIG. 29a shows a MDI circuit membrane 508 which is 4 µm to 8 µm thick, data bus 510a, 510b, control logic 512a, 512b and PEA (aperture) 514a, 514b for passage of ion particles. FIG. 29b shows a plan view of the valves 502, 504 of FIG. 29a.

The valves of the SPV prevent the passage of ions or charged particles by using an electric or magnetic field of the same polarity to deflect approaching particles from the PEA. The PEA 514a, 514b is typically a square opening in the SPV circuit membrane 508. The PEA 514a, 514b is circumscribed by a metal film 520a, 520b which creates a local electro-static field over the PEA by applying a voltage potential, or by a metal wire 540 (coil) (shown in FIG. 29e) which creates a local electromagnetic donut shaped field. When the SPV is flooded with a collimated source of charged particles, the particles that fall upon the PEA 514a, 514b will pass through the SPV 506 and continue onto the resist layer (not shown) to be patterned directly beneath the SPV 506. If a electro-static field or electromagnetic field of sufficient strength and of the same polarity as the ionic particle is present, the ionic particle will deflect away from the PEA and strike some other portion of the SPV surface. The PEA is small in area relative to the total generated electric field volume, therefore, only a small deflection of the approaching charged particle is required for it to miss the PEA and strike the surface of the SPV.

The SPV 506 is typically operated in an enclosure (not shown) under vacuum. The charged ions or particles can be of any material that can be appropriately accelerated or caused to uniformly flood the surface of the SPV. Some examples of charged particles that have been used as sources for patterning resist films are electrons (negative), protons (positive) and gallium+ (positive). The SPV can be in close proximity or contact with the substrate to be patterned, or it can be positioned before imaging lens elements of the lithography equipment that could be used to enhance the focus of the particles beams formed by passing through the SPV circuit membrane or demagnify (reduce) the image generated by the SPV.

FIGS. 29c and 29d are cross-sections that show different methods for implementing an electro-static shutter or valve of the SPV. FIG. 29c shows a PEA 514a formed by an anisotropic etch of the monocrystalline semiconductor membrane 524; <100> monocrystalline semiconductor wet etches with a wall angle of approximately 54° or dry etching (RIE) methods can also be used to etch a round or square hole to form the PEA 514a in either the low stress dielectric 526a, 526b or semiconductor layer 524 of the SPV circuit membrane. The via in the low stress dielectric membrane 526b on the backside of the semiconductor membrane was formed after the wet etch of the PEA 514a. A thin metal film 528 of typically less than 2,000 Å is deposited by sputtering or CVD means. The metal film 528 circumscribes the PEA 514a and has a diameter typically of less than 4 μm, and the PEA typically has a diameter d of less than 500 nm. FIG. 29d shows a PEA 530 formed by etching a via in a flat metal film 532 that was deposited on the semiconductor membrane 534. The metal film 532 forming the PEA in this example is typically less than 2,000 Å thick and has a diameter of approximately 4 μm. Also shown are low stress dielectric layers 536a, 536b.

FIGS. 29e and 29f show a method for implementing an electromagnetic shutter or valve of the SPV. FIG. 29e is a plan view of the structure of FIG. 29f. Shown are semiconductor membrane layer 542 and layer 544 low stress dielectric. A metal coil 540 is formed on MDI circuit membrane 508 so a current loop can be created around the PEA 514a. The PEA 514a is formed by wet or dry anisotropic etching in either the dielectric or semiconductor portions of the MDI circuit membrane 508. The metal line 540 is typically less than 2 μm wide, less than 1 μm thick and circumscribes a area "a" typically less than 4 μm in diameter. The PEA 514a is smaller than the inner diameter "a" of the loop of the metal line 540 and typically less than 500 nm.

Control logic is associated with each valve of a SPV, supplying voltage or current as necessary to the metal structure circumscribing the PEAs. In FIGS. 29c and 29d the valve control logic applies a voltage potential to the metal film 528, 532 respectively circumscribing the PEA. If the applied voltage potential is of the same polarity as the charge particles striking the surface of the SPV, the particles will be deflected from passing through the PEA. This is the valve closed condition. If the applied voltage potential is of the opposite polarity or zero, particles will pass through the PEA. In FIG. 29e and 29f the valve control logic applies a current through the metal wire 540 circumscribing the PEA 514a. Depending on the direction of the current in the wire 540 (clockwise or counter-clockwise about the PEA) a magnetic field with a polarity is generated. If the field polarity is the same as the approaching charged particle it will be deflected, and if the field polarity is the opposite or zero particles will pass through the PEA.

The resign of electro-static or electromagnetic valves for achieving the desired functions of the SPV can vary widely. The examples presented here are not intended to limit the scope of the design structure of such valves for use in a SPV.

MDI Mechanical Light Valve (MLV) Direct Write Lithography Tool

FIGS. 29g through 29k show portions of a direct write lithography tool which uses repeated micro-machined mechanical electro-static shutter cell 550-k for the patterning of photonic or particle exposure source. The overall structure and function of this lithography tool is similar to the above described SLV and SPV tools. It is composed of rows and columns of pattern forming elements called shutter cells 550-k that are each approximately 25 μm by 25 μm. FIG. 29g is a plan view of several such cells 550-1, 550-2, . . . , 550-k, ..., 550-n. FIG. 24 represents a general plan view of the whole lithographic tool, which looks the same in plan as the SLV and SPV tools.

An array of shutter cells 550-k made on a MDI circuit membrane is placed between a collimated photonic or ion particle source and a substrate to be patterned, and can be used in projection or contact lithography methods to pattern such a substrate coated with a thin film of resist. The array is positioned (aligned) over an area of the substrate to be patterned and the array of shutter cells, each under individual computer control regulating the shutter opening or REA (Radiation Exposure Aperture) through the circuit membrane, exposes an area of the substrate directly beneath or corresponding to it. The MDI circuit membrane functioning in this manner is called herein a Mechanical Light Valve (MLV).

The size of the REA collimated exposure image passed by a shutter cell 550-k is variable. Further, the REA does not need to be a physical opening through the MDI circuit membrane for photonic sources, but only transparent to the incident photonic radiation. The MLV is moved in a scanning X-Y manner (shown by X-Y axis 554) over the substrate to be patterned. The dimensions of the scanning motions cause each REA of a shutter cell to pass over a portion of the substrate that typically is equal in area to the size of the shutter cell 550-k. The shutter cells 550-k are operated in parallel (simultaneous) manner; the patterned areas on the substrate beneath each shutter cell adjoin each other and collectively form a much larger overall pattern on the substrate. The scanning motion of the shutter cell is generated by well known computer controlled mechanical motor driven stages or piezoelectric driven stages. The MLV or the substrate can be attached to the motion stage. Due to the short X-Y motions in the use of the MLV, and the desire to scan the shutter cells with REAs of dimensions much less than 1 μm in diameter and in some cases less than 50 nm, piezoelectric motion stage drive is the preferred embodiment.

As the shutter cells of the circuit membrane are scanned over the substrate, they are opened or closed by computer controlled logic 556-k associated with each shutter cell 550-h to effect the desired exposure pattern to be made on the surface of the substrate. An example would be a shutter cell with an area of 25 μm by 25 μm and a REA setting of 0.1 μm in diameter. In order for the REA to expose an area the size of the shutter cell, a scanning motion of 25 μm by 0.1 μm would be made 250 times in the X-axis while translating 0.1 μm in the Y-axis after each scan. The size setting of the REA is typically fixed for a given scan of the substrate, and vector motion of the REA can be used to improve exposure performance when there are areas of the substrate common to all shutter cells that do not require exposure such as is the case with via pattern layers.

The operation of the shutter cells regulates the opened/closed status of an opening that allows a fluence of the exposure source (photons or particles) to pass, and in the same operation dynamically determines the exposure CD for the lithography tool. The ability to change the minimum exposure CD or REA of the MLV is unique to this tool, versus the SLV and the SPV which have fixed exposure apertures. The ability to dynamically change the size of the REA allows the pattern or geometry fracture database of the IC to be partitioned into CD specific geometry sets per pattern layer of an IC. This provides the capability to optimize the performance of the lithography tool by patterning those portions of an exposure image with the smallest CD (processing rate is due to the size of the REA, therefore, the smaller the REA the greater the number of REA exposures), separately from other portions of the exposure image composed of larger CDs.

FIGS. 29h and 29i show plan views of two different shutter arm structures of a shutter cell 550-k. FIG. 29i shows a spring suspension structure of the shutter arm 560, 566. The shutter arm 560, 566 is formed of metal or a combination of metal and low stress dielectric and is suspended over the surface of the substrate from two electrical contacts 562, 564 on either side of the shutter 566. The shutter arm 560, 566 can move (in the direction 570-Y indicated) by the switched application of electro-static potentials. The REA 572 of the shutter cell is formed by the intersection of a square opening 574 through the non-transmissive material of the shutter arm and a similar opening through a metal electrode film directly below the central area of the shutter 566 and fixed to the surface of the substrate. This opening 574 is typically less than 2 μm in diameter, and is positioned with a 90° rotation relative to the long axis of the shutter arm 560. FIG. 29h shows in dotted outline 578 as an alternate position of the shutter arm 560, 566 produced by the application of electro-static potentials. The size of the REA is determined by the projected intersection of the opening in the central area 566 of the shutter and the opening in the fixed metal film beneath it. The REA of the shutter 572 is closed by moving the central area of the shutter arm 566 a distance greater than the diagonal length of the square opening 574.

The shutter arm 560, 566 is positioned or moved by electro-static potentials. The shutter arm 560, 566 is provided with a voltage potential. Electrodes 580a, 580b positioned at either end of the maximum travel displacement of the central area of the shutter arm 566 are selectively set at opposite potentials sufficient to attract or repel the shutter arm a desired displacement. The shutter arm is held in physical contact with the electrode film beneath it by applying an opposite potential to the lower substrate electrode (not shown).

FIG. 29j is a cross section of part of the shutter cell through line j—j of FIG. 29h. FIG. 29k is a cross section along line k—k of FIG. 29j.

As shown in FIG. 29j, the shutter cell is fabricated with established semiconductor processing methods. The array and shutter cell control logic are fabricated on a MDI circuit membrane 590. A trench 592 is formed down to a lower dielectric layer 590 of the circuit membrane sufficient in size to accommodate the motion of the central area 566 of the shutter arm. The electrode 594 under the central area 566 of the shutter arm is formed, and a conformal sacrificial layer (not shown) of a-Si (amorphous Silicon) is deposited over the area of the shutter array. The thickness of the a-Si layer determines the separation distance that the shutter arm is suspended above the circuit membrane. Into the a-Si layer via openings 562, 564 (FIGS. h and i) are patterned to the electrode contacts of the shutter arm 560 and to the electrode contacts of the shutter arm positioning electrodes 580a, 580b. A metal layer 600 optionally combined with a dielectric layer 602 is deposited and patterned to form the shutter arm 560, 566 and the positioning electrodes 580a, 580b. The opening 574 that is used to form the REA is also patterned and etched via RIE processes. This opening 574 as a minimum passes through the shutter arm and the electrode 594 below the central area of the shutter arm that is used in forming the cross-sectioned area that is the REA 572. The opening 574 may be completely through the MDI circuit membrane 590, or stop on the dielectric layer depending on the transmission requirements of the exposure source. The a-Si is then selectively removed which leaves the shutter arm 560 free standing and connected to the circuit membrane at only two electrode contact sites 562, 564 (FIGS. h and i). The shutter arm 560, 566 is free to move in two directions 570-Y, 570-Z based on the voltage potentials applied to the shutter arm 560, 566 positioning electrodes 580a, 580b, and the substrate electrode 594 beneath the central portion of the shutter arm.

Fixed Free Standing Membrane Lithography Masks

The MDI process can be used to form free standing membranes used as lithographic masks with fixed patterns. The MDI process can be used to form optical, X-ray and stencil masks (ion or charged particle masks). The mask substrate is made from a low stress dielectric and optionally semiconductor material. In the preferred embodiment masks are made from oxide and nitride low stress dielectric made on the Novellus equipment and consistent with the formulation presented above or as variations of such low stress membranes formed on other oxide and nitride fabrication equipment. The patterning material is a semiconductor such as silicon, another dielectric material or a metal which is non-transmissive to a photonic exposure source. If the exposure source is an ion or charged particle beam, then the patterning is accomplished with voids (openings through the membrane) or a lack of material, or stencil.

FIGS. 29l and 29m show in cross-section the formation of a fixed photonic mask. A membrane substrate 620 initially formed of dielectric layers 622, 624 and silicon 626 (patterning material shown with pattern) is formed as described above. The thickness of the dielectric layers 622, 624 of the membrane is typically 2 to 3 μm thick, and the silicon 626 may vary in thickness depending upon the desired sidewall angle of the silicon or the CD aspect ratio (ratio of layer thickness to the CD opening of the pattern). The silicon layer 626 can be patterned directly with established resist spin-on films, pattern generation lithography tools such as E-beam and selective silicon etch processing.

FIG. 29l shows in cross-section a patterned silicon layer 626 formed by first patterning an overlay of metal 630 such as tungsten, and then selectively etching the silicon layer 626 done to the dielectric layer 622. A metal pattern could also be formed by removing the silicon layer altogether and depositing a metal film, then subsequently patterning it, or by selectively undercutting the patterned silicon layer of FIG. 29l to employ a lift-off process with a noble metal such as gold.

FIG. 29m shows in cross-section the structure of FIG. 29l after the deposition of a low stress dielectric membrane layer 632 over the pattern and the removal of the dielectric layers 622, 624 below the pattern. The deposition of low stress dielectric membrane layer 632 over the pattern forms a structural membrane layer so that the original lower dielectric structural layers 622, 624 could be removed.

In the case of X-ray masks gold is often used as the patterning film because it is a good X-ray absorber. Gold and the noble metals in general can be patterned only with wet processing techniques and or in combination with electroplating techniques. The silicon pattern 626 of FIG. 29l can be dry etched (RIE) to achieve significant aspect ratios. If the silicon layer 626 is heavily gold doped prior to RIE processing, this method of mask formation can be used as an X-ray mask without CD feature size or aspect ratio limitations of wet etch processing.

FIG. 29n and 29p show a stencil mask formed by patterning the dielectric layer 640 of a MDI silicon 642 and dielectric 640 membrane with a RIE process. The silicon layer 640 is then selectively wet etch removed to leave a stencil pattern as shown by the openings in the dielectric membrane 644l, 644b, 644c in FIG. 29p. This sequence of processing is novel because it allows the sidewall passivation on the dielectric 640 which forms as a by-product of the RIE processing to be removed before the fragile stencil pattern is formed. The sidewall passivation cleaning requires vigorous agitation that would destroy a free standing stencil pattern. The remaining silicon layer 642 can be removed by gentle silicon selective wet etch.

Stepper Contact Printer (SCP)

Pattern generation tools made from MDI circuit membranes can be used to pattern an appropriately sensitive resist film deposited on a substrate. MDI pattern generation tools refer to MDI circuit membrane applications such as the SLV, SPV and MLV lithographic tools, and the more conventional fixed pattern masks made on a low stress dielectric membrane with appropriate optical transmission characteristics (see above). A MDI fixed pattern mask is a single layer metallization pattern formed on a MDI dielectric membrane with one of the MDI fabrication methods presented above. A method of alignment to an existing image on a substrate through electrical inductive coupling is presented below; it is also incorporated into the MDI circuit membrane fixed pattern generation tool.

Contact printing methods are inexpensive and can provide nearly unlimited lithographic feature size imaging capability. However, the use of thick mask plates for image transfer to the resist on the substrate must come in contact with the resist to achieve the best image results. This contact is brought about by the application of strong vacuum forces that bend the rigid mask plate into conformal contact with the substrate. The result of applying such strong vacuum forces often causes small particles of the resist to adhere to the rigid mask which in turn requires the mask to be cleaned or, if undetected, prevents correct image transfer by non-conformal contact to the substrate or an imaging defect during subsequent exposures. Proximity printing is similar to contact printing except the mask is not brought into contact but is held several micrometers over the substrate called the proximity gap. The effectiveness of proximity printing to produce small feature size images is directly proportional to the size of the proximity gap. Further, contact printing has been limited to printing a complete substrate in one exposure instead of smaller portions of the substrate as is the case with conventional stepper projection lithography equipment. The time to pull vacuum during the contact printing process is lengthy, and therefore, making several contact print exposures on a single substrate would be prohibitive in time without consideration to the compounded mask cleanliness challenge and the mechanical complexity of vacuum application to uneven or overlapping ridge mask and substrate plate during contact.

FIG. 30 shows a cross-section of a stepping contact lithographic exposure equipment that combines the well known contact or proximity lithography methods with a stepper mechanical motion and the pattern generation tools and alignment means of MDI circuit membranes presented herein. The substrate (workpiece) 662 is held by a conventional vacuum chuck (not shown) and is positioned by conventional mechanical and piezoelectric motion control mechanisms (not shown). The MDI pattern generation tool 660 is held over the substrate 662 a distance "d" of less than 25 $\mu$m and rough alignment over a portion of the substrate 662 is made by conventional optical means. The center of the MDI pattern generation tool 660 is then extended by applying a small fluid pressure P of less than 100 g per square cm to lower the circuit membrane into a desired proximity distance position shown by dotted line 668 or conformal contact with the substrate 662. Final precision alignment of the pattern generation tool 660 to the substrate is accomplished by the inductive coupling (electromagnetic) means disclosed below. The low mass and elastic nature of the MDI circuit membrane allows the pattern generation tool to be rapidly brought in and out of contact with the substrate. Once an exposure is complete, the pattern generation tool is brought out of contact with the substrate and stepped (moved) under computer control to the next area on the substrate to be exposed. Also shown are circuit membrane frame 672 and a lithography equipment fixture 676 for holding the pattern generation tool 660, 672.

Electro-Magnetic Lithographic Alignment Method

The lithographic pattern generation tools disclosed herein as the SLV, SPV, MLV, and fixed masks are capable of pattern generation with Critical Dimensions (CDs) or minimum pattern feature sizes of less than 50 nm. A fixed pattern generation tool, commonly referred to as a mask, can be made with the MDI circuit membrane process (as disclosed above) with the capability of pattern generation CDs directly proportional to the wavelength of the exposure source. Potential exposure sources are UV, DUW, E-Beam and particle beam. (Fixed masks made with the MDI process are circuit membranes of typically less than 4 $\mu$m thickness and with a single layer of patterned material to be used as in conventional lithographic masks. Alternately, the MDI circuit membrane can be a stencil pattern, where the pattern to be generated is represented in the circuit membrane as trenches that go completely through the membrane. Fixed pattern stencil membranes are required for E-Beam or particle beam lithographic process, where the exposure source must physically pass through the mask to be imaged (patterned). Prototype particle beam stencil masks have been developed by Ion Microfabrication Systems.)

The utility of the CD generation capability of a pattern generation tool for the manufacture of ICs, however, is dependent on the ability to align or register multiple overlaying patterns. Accepted pattern alignment tolerances used presently in the semiconductor industry are typically ±25% of the CD value for a set of overlaying patterns.

Alignment for pattern generation with CDs of approximately 1 $\mu$m or greater can be done with optical microscopes by overlaying or matching alignment patterns on the substrate with corresponding patterns on the surface of the pattern generation tool. The microscope can view through the pattern generation tool, since it is typically made from transparent dielectric materials.

The preferred embodiments of the SLV, SPV, and MLV are to provide the capability to generate patterns that have critical dimensions of less than 100 nm. Such patterns require alignment methods capable of achieving pattern registration of less than ±25 nm. Optical alignment methods presently available cannot achieve such critical dimensions. The MDI pattern generation tools achieve alignment for critical dimensions of less than 100 nm through the use of electromagnetic proximity sensing. FIG. 28*a* shows an example of a PGT alignment coil 494. This metal coil 494 is fabricated by patterning a thin metal film (typically less than 1 $\mu$m in thickness) on the surface of the substrate being patterned (i.e, on the wafer). The placement of the coil patterns 494 on the substrate is typically along two adjoining sides of the area to be exposed or patterned. Coil patterns can also be placed within the area of the substrate to be patterned; they are not restricted to the edge or sides of the pattern area. The coil patterns are typically less than 800 $\mu$m by 100 $\mu$m. The electrode contact pads 496, 498 of the coil area 494 are typically 50 $\mu$m by 50 $\mu$m in area. A similar pattern 494 corresponding to structure 430 in FIG. 24 is on the surface of the pattern generation tool membrane (not shown) plus two electrode probe points that extend down from the surface of the circuit membrane of the pattern generation tool. These pattern generation tool probe points make contact with the electrode pads associated with the substrate coil 494, and electrical signals are generated in the substrate coil 494. It should be apparent, though less convenient, that signals can be supplied to the substrate by connections from the edge of the substrate and not directly from the pattern generation tool.

The signals from the substrate coil are sensed by the corresponding alignment coil in the pattern generation tool.

The pattern generation tool or the substrate are then moved in an X-Y and angular manner until predefined electrical parameter settings are achieved via the signals sensed from the substrate coil. This is possible due to the close proximity of the substrate and the pattern generation tool, and the integrated control logic electronics of the pattern generation tool. Alignment sensing accuracies smaller than 10 nm can be achieved in this manner. The electrode pads of the substrate coil typically have dimensions of less than 2 mils on a side, and the probe point electrodes that extend from the pattern generation tool to make contact with the substrate coil pads are typically less than 12 $\mu$m in diameter and height. A fluid pressure applied to the back side of the pattern generation tool may be used to bring the surface of the pattern generation tool in near contact (proximity) or full contact with the surface of the substrate during the alignment process.

Alternately, FIG. 28b shows an alignment coil 495 that can be placed on the substrate for alignment sensing by the pattern generation tool. A signal is induced in one side 495a of the coil by a corresponding coil in the pattern generation tool. This signal is then sensed at the other end 495b of the coil by a second coil in the pattern generation tool. Alignment is achieved in the same manner as discussed above.

Inexpensive piezoelectric motion control devices are commercially available from Burleigh Instruments, Inc. (Fisher, New York) that demonstrate motion control capability of less than one Angstrom; such piezoelectric precision motion has been demonstrated in the AFM (Atomic Force Microscope) equipment where motion control of less than one Angstrom is required.

MDI Circuit Membrane Flat Panel Display

Much of the cost of manufacturing a flat panel display (without consideration for yield loss) is the cost of the substrate on which it is fabricated. The substrate must meet requirements of flatness imposed by lithography tools and high temperatures imposed by various fabrication steps.

An MDI circuit membrane flat panel display is formed on a rigid optically flat reusable substrate such as fused silica or fused quartz. Other substrates can be used to meet the requirements imposed by the fabrication processing steps. A release agent such as KBr or $KBO_2$ is deposited onto the substrate and then a dielectric layer or layers are deposited to seal the release agent deposited film (as described above). The release agent is required to have a working temperature higher than the highest temperature of the various fabrication process steps employed and be readily soluble in a solvent that is not detrimental to the finished display device. As an example, KBr has a melting point of 734° C. and is readily soluble in DI water.

The flat panel display is conventionally composed of rows and columns of pixel elements which generate the gray shades or the RGB (Red, Green, Blue) colors of the display. The operation of the pixels results in the generation of the image on the display. The pixels of the display can be made with conventional active matrix LCD technology. The preferred embodiment of the MDI circuit membrane display uses redundant circuit devices at each pixel and the above referenced fine grain testing technology to correct for circuit fabrication defects. Secondly, the MDI circuit membrane display makes use of electro luminescent phosphors, similar to the phosphors used in conventional TV and industrial monitors. The phosphors are applied after the completion of the fabrication of the circuitry of the display. The display circuitry is then used in the final manufacturing process steps to cause the selective deposition of the RGB phosphors to their respective RGB electrodes. Additionally, the multiple chip module interconnect circuit membrane technology disclosed above also is employed to bond ICs at the edges of the display panel and at any desired location on the back of the panel. The ability to attach ICs is of significant importance in lessening the complexity of the design and manufacturing of the display. ICs bonded to the back of the display do not interfere with or obscure the visual operation of the phosphor based display, because the display is not back lit as is the case with LCD displays, but generates its own luminescence.

FIG. 31a shows the cross-section of a MDI circuit membrane display 700 while still attached to a reusable quartz fabrication substrate 702 with intervening release agent 703. The control logic circuit 704-1, 704-2, 704-3 for each RGB pixel has been fabricated from a-Si or polysilicon thin film transistors (TFTs), and electro-phoretic plating electrodes 708-1, 708-2, 708-3 (pads) have been formed as a final metallization process step over each RGB pixel logic circuit 704. The plating electrodes 708-1, 708-2, 708-3, one for each RGB phosphor of a pixel, can be selectively addressed and a specific plating potential applied. At the end of each row and column of pixels are bonding pads 710 for ICs (die). The ICs provide control and memory logic for turning individual pixels on or off, therefore generating a display image. It should be noted that the control and/or memory logic 712, 713 (see FIG. 31b) could also be fabricated as part of the MDI circuit membrane 700 just as the individual pixel control circuits 704-1, 704-2, 704-3 have been. This is a design/manufacturing option, and would replace most or all of the bonded die. All fabrication processing steps of the MDI circuit membrane are established techniques.

FIG. 31b shows in cross section the MDI circuit membrane display 700 attached to a support frame 718 and released from the reusable fabrication substrate. The support frame 718 is bonded to the MDI circuit membrane 700 by an anodic method as one technique, and then the MDI circuit membrane 700 is scribed along the side of the fabrication substrate 702. This exposes the release agent 703 of FIG. 31a. The display assembly is then placed in a solvent that activates the release agent 703, causing the display to be freed from the reusable fabrication substrate 702. Optionally, control and memory logic die 713 are attached to the display backside. These IC 713 connect to pixels along row or column interconnect metallization.

FIG. 31c shows the display after electro-phoretic plating of the individual RGB phosphors 708-1, 708-2, 708-3. Each RGB phosphor is plated separately by immersion of the display in a plating solution of a specific phosphor, and then using the control and pixel logic 704-1, 704-2, 704-3 of the display to select appropriate pixel elements (either Red or Green or Blue) and apply the desired plating electrical potential.

The substrate used to fabricate the flat screen display could also be a MDI membrane with a semiconductor device layer. Using a semiconductor based MDI membrane as the substrate to fabricate the flat screen display will not require any substantial difference in processing steps, however, due to the limited size of available silicon wafers (presently 8 inches) and the circular shape, the use of a semiconductor wafer as the starting substrate greatly limits the maximum size of the display.

Three Dimensional IC Structures

Three dimensional (3D) IC structures can be formed from MDI circuit membranes. This is a novel capability of the MDI IC membrane. The low stress dielectrics of silicon dioxide or silicon nitride can be formed to withstand working temperatures in excess of 400° C. This high working temperature capability allows the use of anodic or thermal (quartz to quartz or silicon to quartz) bonding procedures that are typically high temperature processes. The dielectric circuit membranes are optically transparent and thin, allowing the circuit membranes to be aligned very accurately prior to bonding. As shown in FIG. 32a, the semiconductor devices 730-1, 730-2, 730-3 that are embedded in a first MDI circuit membrane 732 can have interconnect metallization 736-1, 736-2, 736-3 applied to both sides of the membrane 732 completing all intra-membrane interconnections. Also shown are opposed semiconductor device gate electrodes 742-1, 742-2, 742-3. FIG. 32a shows the two MDI circuit membranes or ICs 732, 746 prior to bonding. This allows the circuit membranes to be coated as necessary for the forming of the anodic or thermal membrane-to-membrane bond 752 of circuit membrane 732 to the second membrane 746 which includes similarly semiconductor devices 748-1, 748-2, 748-3, and interconnect metallization 750-1, 750-2, 750-3. After two membranes 732, 746 are bonded as shown in FIG. 32b, only vertical interconnect metallization 754-1, 754-2 can be employed to route signals from lower membrane layer 746.

MDI circuit membranes 732, 746 are aligned using established optical alignment mark techniques and anodically or thermally bonded 752 to each other. The circuit membranes 732, 746 that are anodically or thermally bonded are complete of all necessary semiconductor device processing steps, and only require the completion of vertical interconnect metallization 754-1, 754-2. The final interconnect metallization 754-1, 754-2 is completed by etching vias 756-1, 756-2 through the last circuit membrane 732 to be bonded to electrical contacts on the circuit membrane 746 onto which it was bonded. Well known metal deposition and patterning process steps are applied. If additional circuit membrane ICs are to be bonded to a 3D IC structure, a dielectric coating is applied to the 3D structure to isolate any metallization as a necessary requirement to a subsequent bonding step.

Anodic bonding 752 is a glass-to-glass process. The MDI circuit membranes 732, 746 are each provided with a 1 μm thick or greater final deposition of silicon dioxide to form the bond 752 prior to the anodic bonding process step. Anodic processing is well known and there are numerous such techniques used in conventional glass plate manufacturing.

Thermal (fusion) bonding of silicon to quartz or glass substrates is an established technique. It can be used instead of anodic bonding methods to bond MDI circuit membranes.

The ability to use optical data transmission as an interconnect means (instead of metallization interconnect) between MDI circuit membrane layers 732, 746 is a direct consequence of the method of fabricating the 3D IC structure. Wave guides (not shown) between optical transceiver components can be formed from vias by bonding vias (openings) corresponding to the various optical transceiver devices on circuit membranes. The normally high transmissive nature of the circuit membranes and the short layer-to-layer distances between the circuit membranes allow integrated optical semiconductor devices to provide the communication function through vias or directly through certain dielectric materials.

Integrated circuits formed on a MDI circuit membrane can be cut from the circuit membrane in much the same manner as ICs or die are presently cut from a rigid wafer substrate in order to be packaged. This is possible due to the net low stress of the circuit membrane. FIGS. 32c and d show die cut from a circuit membrane and bonded onto a rigid substrate such as a silicon wafer, quartz, glass, metal, etc. In the case of a metal rigid substrate, dielectric and interconnect layers may be added to provide a better bonding surface for the membrane IC or to provide interconnection from bond pads on the IC to bond out pads at the edge of the metal substrate. The use of a metal substrate to attach the membrane IC provides clear advantages, if not an optimal means, for thermal cooling of the IC.

Once the circuit membrane substrate or wafer is cut into dice in the manner which is present practice, a pick and place bonding tool can pick up the die with slight vacuum pressure, align it over the substrate onto which it is to be bonded and bond it to the substrate. FIGS. 32c and d each show stocked membrane die 764-a, 764-b, 764-c bonded to a rigid substrate. Alternately, the membrane die 764-a, 764-b, 764-c can be bonded with compressive, anodic or fusion (thermal) techniques to a circuit membrane (not shown), such as a MCM interconnect circuit membrane.

FIG. 32c shows a 3D circuit structure of membrane dice (ICs) 764-a, 764-b, 764-c bonded by compression technique to a rigid substrate 770. This is accomplished by aligning metal pads 772-1, 1,772-2, . . . , 772-k, . . . , 772-x on the rigid substrate 770 and metal pads 776-1, 776-2, . . . , 776-w on the membrane die 764-a, . . . , 764-c and then applying temperature and pressure (as explained previously). Also shown are bonding-out pads 778-1, 778-2. The surfaces are bonded together by the metal pads which also serve as circuit interconnect and thermal relief paths.

FIG. 32d shows a 3D circuit structure of membrane dice 764-a, 764-b, 764-c bonded by anodic or fusion (thermal) techniques to a substrate 770. The handling of the individual die 764-a, 764-b, 764-c can be done in a manner similar to that described above, and the bonding and interconnect completion methods are also as described above for bonding the circuit membranes together.

The benefits of such die assembly practice are dramatically increased circuit device densities and low thermal mass for efficient cooling. The handling equipment for making such a circuit assembly is presently available.

This disclosure is illustrative and not limiting; further modifications will be apparent to one skilled in the art in light of this disclosure and the appended claims.

I claim:

1. A method of forming a field effect transistor having a narrow gate and opposed gate contact, comprising the steps of:

forming a silicon layer less than about 10 μm thick;

forming a gate electrode over the principal surface of the silicon layer;

forming a low stress dielectric layer less than about 10 μm thick over the silicon layer and over the gate electrode;

forming doped regions in the silicon layer;

etching a groove in the silicon layer from the surface opposing the principal surface thereof in a portion of the silicon layer underlying the gate electrode;

depositing metal in the groove to a predetermined depth;

etching away the opposing surface of the silicon layer to the predetermined depth;

depositing a mask layer on the etched-away surface;

patterning the mask layer, thereby exposing portions of the etched-away surface;

forming additional doped regions in the silicon layer at the exposed portions of the etched-away surface;

removing the mask layer; and etching away additional portions the etched-away surface to the bottom of the groove, thereby removing all of the deposited metal.

2. The method of claim 1, further comprising the steps of forming a trench in the silicon layer surrounding the active portion of the transistor.

3. A method of forming a transistor, comprising the steps of:

providing a flexible membrane having a thin film of semiconductor material formed on the membrane;

forming a trench in the semiconductor material;

doping portions of the semiconductor material;

laterally growing extensions of the sidewalls of the trench, thereby narrowing the trench to a predetermined width;

filling the remaining width of the trench with semiconductor material doped at a concentration differing from a doping level of the extensions; and forming an electrical contact to the filled portion of the trench through the flexible membrane.

4. The method of claim 3, further comprising the step of isolating the trench by forming additional trenches in the semiconductor material surrounding the first trench.

5. The method of claim 3, further comprising the steps, prior to the step of laterally growing, of:

forming a mask layer over a principal surface of the thin film of semiconductor material;

etching away sidewalls of the trench, thereby forming a cavity under the mask layer; and laterally growing a plurality of differently doped layers of semiconductor material on the sidewalls of the cavity.

6. A field effect transistor comprising:

a flexible dielectric membrane having a principal surface;

a semiconductor film formed on the principal surface of the membrane, the semiconductor film including at least three doped layers;

a contact to a first of the three doped layers formed through the membrane;

a contact to a second of the doped layers formed on a principal surface of the semiconductor film;

an insulating layer formed over an edge of the semiconductor film; and a gate electrode formed overlying the insulating layer.

7. The device of claim 6, wherein a portion of the third layer extends over edges of the first and second layers.

8. The device of claim 6 wherein the third layer is located intermediate of the first and second layers, and a portion of the third layer extends over edges of the first and second layers, and wherein the contact to the third layer overlies the extended portion of the third layer.

9. A method of forming a field effect transistor comprising the steps of:

providing a membrane comprising a semiconductor layer overlying a low stress dielectric layer;

forming a drain region and a source region laterally spaced apart from the drain region in the semiconductor layer, a portion of the semiconductor layer between the source and drain regions being a gate region;

forming an insulating layer overlying the semiconductor layer; and forming a gate electrode on the insulating layer, one edge of the gate electrode being in a plane defined by an interface of one of the source region or the drain region and the gate region, and a second edge of the gate electrode extending over the other of the drain region or source region.

10. A method of forming a transistor comprising the steps of:

providing a flexible membrane including a low stress dielectric layer and a semiconductor layer;

forming a first and a second doped regions in the semiconductor layer, the first and second doped regions being vertically spaced apart and separated by a control region;

epitaxially growing an extension of the control region extending over an edge of the semiconductor layer and contacting edges of the first and second doped regions; and forming electrical contacts to the first and second doped regions and to extension of the control region.

* * * * *